US012769805B2

(12) United States Patent
Liu et al.

(10) Patent No.: US 12,769,805 B2
(45) Date of Patent: Oct. 20, 2026

(54) MATRIX MULTIPLY ACCELERATOR FOR VARIABLE BITWIDTH OPERANDS

(71) Applicant: Arm Limited, Cambridge (GB)

(72) Inventors: Zhi-Gang Liu, Westford, MA (US); Paul Nicholas Whatmough, Cambridge, MA (US); Matthew Mattina, Boylston, MA (US); John Fremont Brown, III, Marion, MA (US)

(73) Assignee: Arm Limited, Cambridge (GB)

( * ) Notice: Subject to any disclaimer, the term of this patent is extended or adjusted under 35 U.S.C. 154(b) by 1191 days.

(21) Appl. No.: 17/493,420

(22) Filed: Oct. 4, 2021

(65) Prior Publication Data

US 2023/0108629 A1 Apr. 6, 2023

(51) Int. Cl.

| | |
|---|---|
| ***G06F 17/16*** | (2006.01) |
| ***G06F 5/01*** | (2006.01) |
| ***G06F 7/501*** | (2006.01) |
| ***G06F 7/523*** | (2006.01) |
| ***G06F 7/544*** | (2006.01) |
| ***G06F 9/50*** | (2006.01) |
| ***H03K 19/20*** | (2006.01) |

(52) U.S. Cl.

CPC ................ *G06F 17/16* (2013.01); *G06F 5/01* (2013.01); *G06F 7/501* (2013.01); *G06F 7/523* (2013.01); *G06F 7/5443* (2013.01); *G06F 9/5027* (2013.01); *H03K 19/20* (2013.01)

(58) Field of Classification Search

CPC ........ G06F 17/16; G06F 7/5443; G06F 7/523; G06F 7/501; G06F 5/01; G06F 9/5027; H03K 19/20

See application file for complete search history.

(56) References Cited

PUBLICATIONS

Cowan et al., "Automatic Generation of High-Performance Quantized Machine Learning Kernels". In Proceedings of the 18th ACM/IEEE International Symposium on Code Generation and Optimization (CGO '20), Feb. 22-26, 2020 (Year: 2020).*

Umuroglu et al., "BISMO: A Scalable Bit-Serial Matrix Multiplication Overlay for Reconfigurable Computing", 2018, https://arxiv.org/abs/1806.08862 (Year: 2018).*

Digilent, "PYNQ-Z1 Board Reference Manual", Apr. 13, 2017, https://digilent.com/reference/_media/reference/programmable-logic/pynq-z1/pynq-rm.pdf?srsltid=AfmBOorln39gFn0AdoUP4N1rMxeZ880_ebwbgIOQYHzGTAIDUjpHrnat (Year: 2017).*

Pothos et al., "Deep Learning Inference with Dynamic Graphs on Heterogeneous Platforms", Int J Parallel Prog 49, 158-176. https://doi.org/10.1007/s10766-020-00654-2 (Year: 2020).*

(Continued)

*Primary Examiner* — Andrew Caldwell
*Assistant Examiner* — Kenny K. Bui
(74) *Attorney, Agent, or Firm* — Leveque Intellectual Property Law, P.C.

(57) ABSTRACT

A system and method for multiplying first and second matrices are provided. For the first matrix, a number of bit slice vectors for each row are generated based on the bit resolution, and a first bit slice tensor is generated based on the bit slice vectors for each row. For the second matrix, a number of bit slice vectors for each column are generated based on the bit resolution, and a second bit slice tensor is generated based on the bit slice vectors for each row. The first and second bit slice tensors are multiplied by a matrix multiply accelerator (MMA) to generate an output matrix.

17 Claims, 27 Drawing Sheets

(56) References Cited

PUBLICATIONS

Hilewitz et al., "Bit Matrix Multiplication in Commodity Processors", 19th IEEE International Conference on Application-Specific Systems, Architectures and Processors, ASAP 2008, Jul. 2-4, 2008, Leuven, Belgium, http://palms.princeton.edu/system/files/hilewitz_asap_08.pdf.

Jouppi et al., "In-Datacenter Performance Analysis of a Tensor Processing Unit", 44th International Symposium on Computer Architecture (ISCA), Toronto, Canada, Jun. 26, 2017, https://research.google/pubs/pub46078/.

* cited by examiner

310, $410^0$, $410^1$, $410^2$

| Ai | decimal | binary | BA[ 0 ] | BA[ 1 ] | BA[ 2 ] |
|---|---|---|---|---|---|
| A1 | 0 | 000 | 0 | 0 | 0 |
| A2 | 1 | 001 | 1 | 0 | 0 |
| A3 | 1 | 001 | 1 | 0 | 0 |
| A4 | 0 | 000 | 0 | 0 | 0 |
| A5 | 3 | 011 | 1 | 1 | 0 |
| A6 | 7 | 111 | 1 | 1 | 1 |
| A7 | 7 | 111 | 1 | 1 | 1 |
| A8 | 3 | 011 | 1 | 1 | 0 |
| A9 | 3 | 011 | 1 | 1 | 0 |
| A10 | 7 | 111 | 1 | 1 | 1 |
| A11 | 7 | 111 | 1 | 1 | 1 |
| A12 | 3 | 011 | 1 | 1 | 0 |
| A13 | 0 | 000 | 0 | 0 | 0 |
| A14 | 1 | 001 | 1 | 0 | 0 |
| A15 | 1 | 001 | 1 | 0 | 0 |
| A16 | 0 | 000 | 0 | 0 | 0 |

| cycle | j | k | n | pop c | t << n | S |
|---|---|---|---|---|---|---|
| 1 | 0 | 0 | 0 | 6 | 6 | 6 |
| 2 | 0 | 1 | 1 | 10 | 20 | 26 |
| 3 | 0 | 2 | 2 | 2 | 8 | 34 |
| 4 | 0 | 3 | 3 | 2 | 16 | 50 |
| 5 | 0 | 4 | 4 | 0 | 0 | 50 |
| 6 | 1 | 0 | 1 | 6 | 12 | 62 |
| 7 | 1 | 1 | 2 | 6 | 24 | 86 |
| 8 | 1 | 2 | 3 | 2 | 16 | 102 |
| 9 | 1 | 3 | 4 | 2 | 32 | 134 |
| 10 | 1 | 4 | 5 | 0 | 0 | 134 |
| 11 | 2 | 0 | 2 | 2 | 8 | 142 |
| 12 | 2 | 1 | 3 | 2 | 16 | 158 |
| 13 | 2 | 2 | 4 | 2 | 32 | 190 |
| 14 | 2 | 3 | 5 | 2 | 64 | 254 |
| 15 | 2 | 4 | 6 | 0 | 0 | 254 |

Scalar C 254 — 330

320, $420^0$, $420^1$, $420^2$, $420^3$, $420^4$

| Bi | decimal | binary | BB[ 0 ] | BB[ 1 ] | BB[ 2 ] | BB[ 3 ] | BB[ 4 ] | Ai * Bi |
|---|---|---|---|---|---|---|---|---|
| B1 | 1 | 00001 | 1 | 0 | 0 | 0 | 0 | 0 |
| B2 | 2 | 00010 | 0 | 1 | 0 | 0 | 0 | 2 |
| B3 | 2 | 00010 | 0 | 1 | 0 | 0 | 0 | 2 |
| B4 | 1 | 00001 | 1 | 0 | 0 | 0 | 0 | 0 |
| B5 | 3 | 00011 | 1 | 1 | 0 | 0 | 0 | 9 |
| B6 | 6 | 00110 | 0 | 1 | 1 | 0 | 0 | 42 |
| B7 | 6 | 00110 | 0 | 1 | 1 | 0 | 0 | 42 |
| B8 | 3 | 00011 | 1 | 1 | 0 | 0 | 0 | 9 |
| B9 | 3 | 00011 | 1 | 1 | 0 | 0 | 0 | 9 |
| B10 | 9 | 01001 | 1 | 0 | 0 | 1 | 0 | 63 |
| B11 | 9 | 01001 | 1 | 0 | 0 | 1 | 0 | 63 |
| B12 | 3 | 00011 | 1 | 1 | 0 | 0 | 0 | 9 |
| B13 | 1 | 00001 | 1 | 0 | 0 | 0 | 0 | 0 |
| B14 | 2 | 00010 | 0 | 1 | 0 | 0 | 0 | 2 |
| B15 | 2 | 00010 | 0 | 1 | 0 | 0 | 0 | 2 |
| B16 | 1 | 00001 | 1 | 0 | 0 | 0 | 0 | 0 |

254 ∑ Ai * Bi — 332

FIG. 6F

384

| $z^1_1$ | cycle | j | k | n | popc | t<<n | S |
|---|---|---|---|---|---|---|---|
| 4 | 1 | 0 | 0 | 0 | 4 | 4 | 4 |
| | 2 | 0 | 1 | 1 | 0 | 0 | 4 |
| | 3 | 0 | 2 | 2 | 0 | 0 | 4 |
| | 4 | 0 | 3 | 3 | 0 | 0 | 4 |
| | 5 | 0 | 4 | 4 | 0 | 0 | 4 |
| | 6 | 1 | 0 | 1 | 0 | 0 | 4 |
| | 7 | 1 | 1 | 2 | 0 | 0 | 4 |
| | 8 | 1 | 2 | 3 | 0 | 0 | 4 |
| | 9 | 1 | 3 | 4 | 0 | 0 | 4 |
| | 10 | 1 | 4 | 5 | 0 | 0 | 4 |
| | 11 | 2 | 0 | 2 | 0 | 0 | 4 |
| | 12 | 2 | 1 | 3 | 0 | 0 | 4 |
| | 13 | 2 | 2 | 4 | 0 | 0 | 4 |
| | 14 | 2 | 3 | 5 | 0 | 0 | 4 |
| | 15 | 2 | 4 | 6 | 0 | 0 | 4 |

| $z^1_2$ | cycle | j | k | n | popc | t<<n | S |
|---|---|---|---|---|---|---|---|
| 4 | 1 | 0 | 0 | 0 | 4 | 4 | 4 |
| | 2 | 0 | 1 | 1 | 0 | 0 | 4 |
| | 3 | 0 | 2 | 2 | 0 | 0 | 4 |
| | 4 | 0 | 3 | 3 | 0 | 0 | 4 |
| | 5 | 0 | 4 | 4 | 0 | 0 | 4 |
| | 6 | 1 | 0 | 1 | 0 | 0 | 4 |
| | 7 | 1 | 1 | 2 | 0 | 0 | 4 |
| | 8 | 1 | 2 | 3 | 0 | 0 | 4 |
| | 9 | 1 | 3 | 4 | 0 | 0 | 4 |
| | 10 | 1 | 4 | 5 | 0 | 0 | 4 |
| | 11 | 2 | 0 | 2 | 0 | 0 | 4 |
| | 12 | 2 | 1 | 3 | 0 | 0 | 4 |
| | 13 | 2 | 2 | 4 | 0 | 0 | 4 |
| | 14 | 2 | 3 | 5 | 0 | 0 | 4 |
| | 15 | 2 | 4 | 6 | 0 | 0 | 4 |

| $z^1_3$ | cycle | j | k | n | popc | t<<n | S |
|---|---|---|---|---|---|---|---|
| 4 | 1 | 0 | 0 | 0 | 4 | 4 | 4 |
| | 2 | 0 | 1 | 1 | 0 | 0 | 4 |
| | 3 | 0 | 2 | 2 | 0 | 0 | 4 |
| | 4 | 0 | 3 | 3 | 0 | 0 | 4 |
| | 5 | 0 | 4 | 4 | 0 | 0 | 4 |
| | 6 | 1 | 0 | 1 | 0 | 0 | 4 |
| | 7 | 1 | 1 | 2 | 0 | 0 | 4 |
| | 8 | 1 | 2 | 3 | 0 | 0 | 4 |
| | 9 | 1 | 3 | 4 | 0 | 0 | 4 |
| | 10 | 1 | 4 | 5 | 0 | 0 | 4 |
| | 11 | 2 | 0 | 2 | 0 | 0 | 4 |
| | 12 | 2 | 1 | 3 | 0 | 0 | 4 |
| | 13 | 2 | 2 | 4 | 0 | 0 | 4 |
| | 14 | 2 | 3 | 5 | 0 | 0 | 4 |
| | 15 | 2 | 4 | 6 | 0 | 0 | 4 |

| $z^1_4$ | cycle | j | k | n | popc | t<<n | S |
|---|---|---|---|---|---|---|---|
| 4 | 1 | 0 | 0 | 0 | 4 | 4 | 4 |
| | 2 | 0 | 1 | 1 | 0 | 0 | 4 |
| | 3 | 0 | 2 | 2 | 0 | 0 | 4 |
| | 4 | 0 | 3 | 3 | 0 | 0 | 4 |
| | 5 | 0 | 4 | 4 | 0 | 0 | 4 |
| | 6 | 1 | 0 | 1 | 0 | 0 | 4 |
| | 7 | 1 | 1 | 2 | 0 | 0 | 4 |
| | 8 | 1 | 2 | 3 | 0 | 0 | 4 |
| | 9 | 1 | 3 | 4 | 0 | 0 | 4 |
| | 10 | 1 | 4 | 5 | 0 | 0 | 4 |
| | 11 | 2 | 0 | 2 | 0 | 0 | 4 |
| | 12 | 2 | 1 | 3 | 0 | 0 | 4 |
| | 13 | 2 | 2 | 4 | 0 | 0 | 4 |
| | 14 | 2 | 3 | 5 | 0 | 0 | 4 |
| | 15 | 2 | 4 | 6 | 0 | 0 | 4 |

| $z^2_1$ | cycle | j | k | n | popc | t<<n | S |
|---|---|---|---|---|---|---|---|
| 4 | 1 | 0 | 0 | 0 | 4 | 4 | 4 |
| | 2 | 0 | 1 | 1 | 0 | 0 | 4 |
| | 3 | 0 | 2 | 2 | 0 | 0 | 4 |
| | 4 | 0 | 3 | 3 | 0 | 0 | 4 |
| | 5 | 0 | 4 | 4 | 0 | 0 | 4 |
| | 6 | 1 | 0 | 1 | 0 | 0 | 4 |
| | 7 | 1 | 1 | 2 | 0 | 0 | 4 |
| | 8 | 1 | 2 | 3 | 0 | 0 | 4 |
| | 9 | 1 | 3 | 4 | 0 | 0 | 4 |
| | 10 | 1 | 4 | 5 | 0 | 0 | 4 |
| | 11 | 2 | 0 | 2 | 0 | 0 | 4 |
| | 12 | 2 | 1 | 3 | 0 | 0 | 4 |
| | 13 | 2 | 2 | 4 | 0 | 0 | 4 |
| | 14 | 2 | 3 | 5 | 0 | 0 | 4 |
| | 15 | 2 | 4 | 6 | 0 | 0 | 4 |

| $z^2_2$ | cycle | j | k | n | popc | t<<n | S |
|---|---|---|---|---|---|---|---|
| 4 | 1 | 0 | 0 | 0 | 4 | 4 | 4 |
| | 2 | 0 | 1 | 1 | 0 | 0 | 4 |
| | 3 | 0 | 2 | 2 | 0 | 0 | 4 |
| | 4 | 0 | 3 | 3 | 0 | 0 | 4 |
| | 5 | 0 | 4 | 4 | 0 | 0 | 4 |
| | 6 | 1 | 0 | 1 | 0 | 0 | 4 |
| | 7 | 1 | 1 | 2 | 0 | 0 | 4 |
| | 8 | 1 | 2 | 3 | 0 | 0 | 4 |
| | 9 | 1 | 3 | 4 | 0 | 0 | 4 |
| | 10 | 1 | 4 | 5 | 0 | 0 | 4 |
| | 11 | 2 | 0 | 2 | 0 | 0 | 4 |
| | 12 | 2 | 1 | 3 | 0 | 0 | 4 |
| | 13 | 2 | 2 | 4 | 0 | 0 | 4 |
| | 14 | 2 | 3 | 5 | 0 | 0 | 4 |
| | 15 | 2 | 4 | 6 | 0 | 0 | 4 |

| $z^2_3$ | cycle | j | k | n | popc | t<<n | S |
|---|---|---|---|---|---|---|---|
| 4 | 1 | 0 | 0 | 0 | 4 | 4 | 4 |
| | 2 | 0 | 1 | 1 | 0 | 0 | 4 |
| | 3 | 0 | 2 | 2 | 0 | 0 | 4 |
| | 4 | 0 | 3 | 3 | 0 | 0 | 4 |
| | 5 | 0 | 4 | 4 | 0 | 0 | 4 |
| | 6 | 1 | 0 | 1 | 0 | 0 | 4 |
| | 7 | 1 | 1 | 2 | 0 | 0 | 4 |
| | 8 | 1 | 2 | 3 | 0 | 0 | 4 |
| | 9 | 1 | 3 | 4 | 0 | 0 | 4 |
| | 10 | 1 | 4 | 5 | 0 | 0 | 4 |
| | 11 | 2 | 0 | 2 | 0 | 0 | 4 |
| | 12 | 2 | 1 | 3 | 0 | 0 | 4 |
| | 13 | 2 | 2 | 4 | 0 | 0 | 4 |
| | 14 | 2 | 3 | 5 | 0 | 0 | 4 |
| | 15 | 2 | 4 | 6 | 0 | 0 | 4 |

| $z^2_4$ | cycle | j | k | n | popc | t<<n | S |
|---|---|---|---|---|---|---|---|
| 4 | 1 | 0 | 0 | 0 | 4 | 4 | 4 |
| | 2 | 0 | 1 | 1 | 0 | 0 | 4 |
| | 3 | 0 | 2 | 2 | 0 | 0 | 4 |
| | 4 | 0 | 3 | 3 | 0 | 0 | 4 |
| | 5 | 0 | 4 | 4 | 0 | 0 | 4 |
| | 6 | 1 | 0 | 1 | 0 | 0 | 4 |
| | 7 | 1 | 1 | 2 | 0 | 0 | 4 |
| | 8 | 1 | 2 | 3 | 0 | 0 | 4 |
| | 9 | 1 | 3 | 4 | 0 | 0 | 4 |
| | 10 | 1 | 4 | 5 | 0 | 0 | 4 |
| | 11 | 2 | 0 | 2 | 0 | 0 | 4 |
| | 12 | 2 | 1 | 3 | 0 | 0 | 4 |
| | 13 | 2 | 2 | 4 | 0 | 0 | 4 |
| | 14 | 2 | 3 | 5 | 0 | 0 | 4 |
| | 15 | 2 | 4 | 6 | 0 | 0 | 4 |

| $z^3_1$ | cycle | j | k | n | popc | t<<n | S |
|---|---|---|---|---|---|---|---|
| 4 | 1 | 0 | 0 | 0 | 4 | 4 | 4 |
| | 2 | 0 | 1 | 1 | 0 | 0 | 4 |
| | 3 | 0 | 2 | 2 | 0 | 0 | 4 |
| | 4 | 0 | 3 | 3 | 0 | 0 | 4 |
| | 5 | 0 | 4 | 4 | 0 | 0 | 4 |
| | 6 | 1 | 0 | 1 | 0 | 0 | 4 |
| | 7 | 1 | 1 | 2 | 0 | 0 | 4 |
| | 8 | 1 | 2 | 3 | 0 | 0 | 4 |
| | 9 | 1 | 3 | 4 | 0 | 0 | 4 |
| | 10 | 1 | 4 | 5 | 0 | 0 | 4 |
| | 11 | 2 | 0 | 2 | 0 | 0 | 4 |
| | 12 | 2 | 1 | 3 | 0 | 0 | 4 |
| | 13 | 2 | 2 | 4 | 0 | 0 | 4 |
| | 14 | 2 | 3 | 5 | 0 | 0 | 4 |
| | 15 | 2 | 4 | 6 | 0 | 0 | 4 |

| $z^3_2$ | cycle | j | k | n | popc | t<<n | S |
|---|---|---|---|---|---|---|---|
| 4 | 1 | 0 | 0 | 0 | 4 | 4 | 4 |
| | 2 | 0 | 1 | 1 | 0 | 0 | 4 |
| | 3 | 0 | 2 | 2 | 0 | 0 | 4 |
| | 4 | 0 | 3 | 3 | 0 | 0 | 4 |
| | 5 | 0 | 4 | 4 | 0 | 0 | 4 |
| | 6 | 1 | 0 | 1 | 0 | 0 | 4 |
| | 7 | 1 | 1 | 2 | 0 | 0 | 4 |
| | 8 | 1 | 2 | 3 | 0 | 0 | 4 |
| | 9 | 1 | 3 | 4 | 0 | 0 | 4 |
| | 10 | 1 | 4 | 5 | 0 | 0 | 4 |
| | 11 | 2 | 0 | 2 | 0 | 0 | 4 |
| | 12 | 2 | 1 | 3 | 0 | 0 | 4 |
| | 13 | 2 | 2 | 4 | 0 | 0 | 4 |
| | 14 | 2 | 3 | 5 | 0 | 0 | 4 |
| | 15 | 2 | 4 | 6 | 0 | 0 | 4 |

| $z^3_3$ | cycle | j | k | n | popc | t<<n | S |
|---|---|---|---|---|---|---|---|
| 4 | 1 | 0 | 0 | 0 | 4 | 4 | 4 |
| | 2 | 0 | 1 | 1 | 0 | 0 | 4 |
| | 3 | 0 | 2 | 2 | 0 | 0 | 4 |
| | 4 | 0 | 3 | 3 | 0 | 0 | 4 |
| | 5 | 0 | 4 | 4 | 0 | 0 | 4 |
| | 6 | 1 | 0 | 1 | 0 | 0 | 4 |
| | 7 | 1 | 1 | 2 | 0 | 0 | 4 |
| | 8 | 1 | 2 | 3 | 0 | 0 | 4 |
| | 9 | 1 | 3 | 4 | 0 | 0 | 4 |
| | 10 | 1 | 4 | 5 | 0 | 0 | 4 |
| | 11 | 2 | 0 | 2 | 0 | 0 | 4 |
| | 12 | 2 | 1 | 3 | 0 | 0 | 4 |
| | 13 | 2 | 2 | 4 | 0 | 0 | 4 |
| | 14 | 2 | 3 | 5 | 0 | 0 | 4 |
| | 15 | 2 | 4 | 6 | 0 | 0 | 4 |

| $z^3_4$ | cycle | j | k | n | popc | t<<n | S |
|---|---|---|---|---|---|---|---|
| 4 | 1 | 0 | 0 | 0 | 4 | 4 | 4 |
| | 2 | 0 | 1 | 1 | 0 | 0 | 4 |
| | 3 | 0 | 2 | 2 | 0 | 0 | 4 |
| | 4 | 0 | 3 | 3 | 0 | 0 | 4 |
| | 5 | 0 | 4 | 4 | 0 | 0 | 4 |
| | 6 | 1 | 0 | 1 | 0 | 0 | 4 |
| | 7 | 1 | 1 | 2 | 0 | 0 | 4 |
| | 8 | 1 | 2 | 3 | 0 | 0 | 4 |
| | 9 | 1 | 3 | 4 | 0 | 0 | 4 |
| | 10 | 1 | 4 | 5 | 0 | 0 | 4 |
| | 11 | 2 | 0 | 2 | 0 | 0 | 4 |
| | 12 | 2 | 1 | 3 | 0 | 0 | 4 |
| | 13 | 2 | 2 | 4 | 0 | 0 | 4 |
| | 14 | 2 | 3 | 5 | 0 | 0 | 4 |
| | 15 | 2 | 4 | 6 | 0 | 0 | 4 |

| $z^4_1$ | cycle | j | k | n | popc | t<<n | S |
|---|---|---|---|---|---|---|---|
| 4 | 1 | 0 | 0 | 0 | 4 | 4 | 4 |
| | 2 | 0 | 1 | 1 | 0 | 0 | 4 |
| | 3 | 0 | 2 | 2 | 0 | 0 | 4 |
| | 4 | 0 | 3 | 3 | 0 | 0 | 4 |
| | 5 | 0 | 4 | 4 | 0 | 0 | 4 |
| | 6 | 1 | 0 | 1 | 0 | 0 | 4 |
| | 7 | 1 | 1 | 2 | 0 | 0 | 4 |
| | 8 | 1 | 2 | 3 | 0 | 0 | 4 |
| | 9 | 1 | 3 | 4 | 0 | 0 | 4 |
| | 10 | 1 | 4 | 5 | 0 | 0 | 4 |
| | 11 | 2 | 0 | 2 | 0 | 0 | 4 |
| | 12 | 2 | 1 | 3 | 0 | 0 | 4 |
| | 13 | 2 | 2 | 4 | 0 | 0 | 4 |
| | 14 | 2 | 3 | 5 | 0 | 0 | 4 |
| | 15 | 2 | 4 | 6 | 0 | 0 | 4 |

| $z^4_2$ | cycle | j | k | n | popc | t<<n | S |
|---|---|---|---|---|---|---|---|
| 4 | 1 | 0 | 0 | 0 | 4 | 4 | 4 |
| | 2 | 0 | 1 | 1 | 0 | 0 | 4 |
| | 3 | 0 | 2 | 2 | 0 | 0 | 4 |
| | 4 | 0 | 3 | 3 | 0 | 0 | 4 |
| | 5 | 0 | 4 | 4 | 0 | 0 | 4 |
| | 6 | 1 | 0 | 1 | 0 | 0 | 4 |
| | 7 | 1 | 1 | 2 | 0 | 0 | 4 |
| | 8 | 1 | 2 | 3 | 0 | 0 | 4 |
| | 9 | 1 | 3 | 4 | 0 | 0 | 4 |
| | 10 | 1 | 4 | 5 | 0 | 0 | 4 |
| | 11 | 2 | 0 | 2 | 0 | 0 | 4 |
| | 12 | 2 | 1 | 3 | 0 | 0 | 4 |
| | 13 | 2 | 2 | 4 | 0 | 0 | 4 |
| | 14 | 2 | 3 | 5 | 0 | 0 | 4 |
| | 15 | 2 | 4 | 6 | 0 | 0 | 4 |

| $z^4_3$ | cycle | j | k | n | popc | t<<n | S |
|---|---|---|---|---|---|---|---|
| 4 | 1 | 0 | 0 | 0 | 4 | 4 | 4 |
| | 2 | 0 | 1 | 1 | 0 | 0 | 4 |
| | 3 | 0 | 2 | 2 | 0 | 0 | 4 |
| | 4 | 0 | 3 | 3 | 0 | 0 | 4 |
| | 5 | 0 | 4 | 4 | 0 | 0 | 4 |
| | 6 | 1 | 0 | 1 | 0 | 0 | 4 |
| | 7 | 1 | 1 | 2 | 0 | 0 | 4 |
| | 8 | 1 | 2 | 3 | 0 | 0 | 4 |
| | 9 | 1 | 3 | 4 | 0 | 0 | 4 |
| | 10 | 1 | 4 | 5 | 0 | 0 | 4 |
| | 11 | 2 | 0 | 2 | 0 | 0 | 4 |
| | 12 | 2 | 1 | 3 | 0 | 0 | 4 |
| | 13 | 2 | 2 | 4 | 0 | 0 | 4 |
| | 14 | 2 | 3 | 5 | 0 | 0 | 4 |
| | 15 | 2 | 4 | 6 | 0 | 0 | 4 |

| $z^4_4$ | cycle | j | k | n | popc | t<<n | S |
|---|---|---|---|---|---|---|---|
| 4 | 1 | 0 | 0 | 0 | 4 | 4 | 4 |
| | 2 | 0 | 1 | 1 | 0 | 0 | 4 |
| | 3 | 0 | 2 | 2 | 0 | 0 | 4 |
| | 4 | 0 | 3 | 3 | 0 | 0 | 4 |
| | 5 | 0 | 4 | 4 | 0 | 0 | 4 |
| | 6 | 1 | 0 | 1 | 0 | 0 | 4 |
| | 7 | 1 | 1 | 2 | 0 | 0 | 4 |
| | 8 | 1 | 2 | 3 | 0 | 0 | 4 |
| | 9 | 1 | 3 | 4 | 0 | 0 | 4 |
| | 10 | 1 | 4 | 5 | 0 | 0 | 4 |
| | 11 | 2 | 0 | 2 | 0 | 0 | 4 |
| | 12 | 2 | 1 | 3 | 0 | 0 | 4 |
| | 13 | 2 | 2 | 4 | 0 | 0 | 4 |
| | 14 | 2 | 3 | 5 | 0 | 0 | 4 |
| | 15 | 2 | 4 | 6 | 0 | 0 | 4 |

FIG. 8D

384

| $z^1_1$ | cycle | j | k | n | popc | t<<n | S |
|---|---|---|---|---|---|---|---|
| 868 | 1 | 0 | 0 | 0 | 4 | 4 | 4 |
| | 2 | 0 | 1 | 1 | 4 | 8 | 12 |
| | 3 | 0 | 2 | 2 | 4 | 16 | 28 |
| | 4 | 0 | 3 | 3 | 4 | 32 | 60 |
| | 5 | 0 | 4 | 4 | 4 | 64 | 124 |
| | 6 | 1 | 0 | 1 | 4 | 8 | 132 |
| | 7 | 1 | 1 | 2 | 4 | 16 | 148 |
| | 8 | 1 | 2 | 3 | 4 | 32 | 180 |
| | 9 | 1 | 3 | 4 | 4 | 64 | 244 |
| | 10 | 1 | 4 | 5 | 4 | 128 | 372 |
| | 11 | 2 | 0 | 2 | 4 | 16 | 388 |
| | 12 | 2 | 1 | 3 | 4 | 32 | 420 |
| | 13 | 2 | 2 | 4 | 4 | 64 | 484 |
| | 14 | 2 | 3 | 5 | 4 | 128 | 612 |
| | 15 | 2 | 4 | 6 | 4 | 256 | 868 |

| $z^1_2$ | cycle | j | k | n | popc | t<<n | S |
|---|---|---|---|---|---|---|---|
| 868 | 1 | 0 | 0 | 0 | 4 | 4 | 4 |
| | 2 | 0 | 1 | 1 | 4 | 8 | 12 |
| | 3 | 0 | 2 | 2 | 4 | 16 | 28 |
| | 4 | 0 | 3 | 3 | 4 | 32 | 60 |
| | 5 | 0 | 4 | 4 | 4 | 64 | 124 |
| | 6 | 1 | 0 | 1 | 4 | 8 | 132 |
| | 7 | 1 | 1 | 2 | 4 | 16 | 148 |
| | 8 | 1 | 2 | 3 | 4 | 32 | 180 |
| | 9 | 1 | 3 | 4 | 4 | 64 | 244 |
| | 10 | 1 | 4 | 5 | 4 | 128 | 372 |
| | 11 | 2 | 0 | 2 | 4 | 16 | 388 |
| | 12 | 2 | 1 | 3 | 4 | 32 | 420 |
| | 13 | 2 | 2 | 4 | 4 | 64 | 484 |
| | 14 | 2 | 3 | 5 | 4 | 128 | 612 |
| | 15 | 2 | 4 | 6 | 4 | 256 | 868 |

| $z^1_3$ | cycle | j | k | n | popc | t<<n | S |
|---|---|---|---|---|---|---|---|
| 868 | 1 | 0 | 0 | 0 | 4 | 4 | 4 |
| | 2 | 0 | 1 | 1 | 4 | 8 | 12 |
| | 3 | 0 | 2 | 2 | 4 | 16 | 28 |
| | 4 | 0 | 3 | 3 | 4 | 32 | 60 |
| | 5 | 0 | 4 | 4 | 4 | 64 | 124 |
| | 6 | 1 | 0 | 1 | 4 | 8 | 132 |
| | 7 | 1 | 1 | 2 | 4 | 16 | 148 |
| | 8 | 1 | 2 | 3 | 4 | 32 | 180 |
| | 9 | 1 | 3 | 4 | 4 | 64 | 244 |
| | 10 | 1 | 4 | 5 | 4 | 128 | 372 |
| | 11 | 2 | 0 | 2 | 4 | 16 | 388 |
| | 12 | 2 | 1 | 3 | 4 | 32 | 420 |
| | 13 | 2 | 2 | 4 | 4 | 64 | 484 |
| | 14 | 2 | 3 | 5 | 4 | 128 | 612 |
| | 15 | 2 | 4 | 6 | 4 | 256 | 868 |

| $z^1_4$ | cycle | j | k | n | popc | t<<n | S |
|---|---|---|---|---|---|---|---|
| 868 | 1 | 0 | 0 | 0 | 4 | 4 | 4 |
| | 2 | 0 | 1 | 1 | 4 | 8 | 12 |
| | 3 | 0 | 2 | 2 | 4 | 16 | 28 |
| | 4 | 0 | 3 | 3 | 4 | 32 | 60 |
| | 5 | 0 | 4 | 4 | 4 | 64 | 124 |
| | 6 | 1 | 0 | 1 | 4 | 8 | 132 |
| | 7 | 1 | 1 | 2 | 4 | 16 | 148 |
| | 8 | 1 | 2 | 3 | 4 | 32 | 180 |
| | 9 | 1 | 3 | 4 | 4 | 64 | 244 |
| | 10 | 1 | 4 | 5 | 4 | 128 | 372 |
| | 11 | 2 | 0 | 2 | 4 | 16 | 388 |
| | 12 | 2 | 1 | 3 | 4 | 32 | 420 |
| | 13 | 2 | 2 | 4 | 4 | 64 | 484 |
| | 14 | 2 | 3 | 5 | 4 | 128 | 612 |
| | 15 | 2 | 4 | 6 | 4 | 256 | 868 |

| $z^2_1$ | cycle | j | k | n | popc | t<<n | S |
|---|---|---|---|---|---|---|---|
| 868 | 1 | 0 | 0 | 0 | 4 | 4 | 4 |
| | 2 | 0 | 1 | 1 | 4 | 8 | 12 |
| | 3 | 0 | 2 | 2 | 4 | 16 | 28 |
| | 4 | 0 | 3 | 3 | 4 | 32 | 60 |
| | 5 | 0 | 4 | 4 | 4 | 64 | 124 |
| | 6 | 1 | 0 | 1 | 4 | 8 | 132 |
| | 7 | 1 | 1 | 2 | 4 | 16 | 148 |
| | 8 | 1 | 2 | 3 | 4 | 32 | 180 |
| | 9 | 1 | 3 | 4 | 4 | 64 | 244 |
| | 10 | 1 | 4 | 5 | 4 | 128 | 372 |
| | 11 | 2 | 0 | 2 | 4 | 16 | 388 |
| | 12 | 2 | 1 | 3 | 4 | 32 | 420 |
| | 13 | 2 | 2 | 4 | 4 | 64 | 484 |
| | 14 | 2 | 3 | 5 | 4 | 128 | 612 |
| | 15 | 2 | 4 | 6 | 4 | 256 | 868 |

| $z^2_2$ | cycle | j | k | n | popc | t<<n | S |
|---|---|---|---|---|---|---|---|
| 868 | 1 | 0 | 0 | 0 | 4 | 4 | 4 |
| | 2 | 0 | 1 | 1 | 4 | 8 | 12 |
| | 3 | 0 | 2 | 2 | 4 | 16 | 28 |
| | 4 | 0 | 3 | 3 | 4 | 32 | 60 |
| | 5 | 0 | 4 | 4 | 4 | 64 | 124 |
| | 6 | 1 | 0 | 1 | 4 | 8 | 132 |
| | 7 | 1 | 1 | 2 | 4 | 16 | 148 |
| | 8 | 1 | 2 | 3 | 4 | 32 | 180 |
| | 9 | 1 | 3 | 4 | 4 | 64 | 244 |
| | 10 | 1 | 4 | 5 | 4 | 128 | 372 |
| | 11 | 2 | 0 | 2 | 4 | 16 | 388 |
| | 12 | 2 | 1 | 3 | 4 | 32 | 420 |
| | 13 | 2 | 2 | 4 | 4 | 64 | 484 |
| | 14 | 2 | 3 | 5 | 4 | 128 | 612 |
| | 15 | 2 | 4 | 6 | 4 | 256 | 868 |

| $z^2_3$ | cycle | j | k | n | popc | t<<n | S |
|---|---|---|---|---|---|---|---|
| 868 | 1 | 0 | 0 | 0 | 4 | 4 | 4 |
| | 2 | 0 | 1 | 1 | 4 | 8 | 12 |
| | 3 | 0 | 2 | 2 | 4 | 16 | 28 |
| | 4 | 0 | 3 | 3 | 4 | 32 | 60 |
| | 5 | 0 | 4 | 4 | 4 | 64 | 124 |
| | 6 | 1 | 0 | 1 | 4 | 8 | 132 |
| | 7 | 1 | 1 | 2 | 4 | 16 | 148 |
| | 8 | 1 | 2 | 3 | 4 | 32 | 180 |
| | 9 | 1 | 3 | 4 | 4 | 64 | 244 |
| | 10 | 1 | 4 | 5 | 4 | 128 | 372 |
| | 11 | 2 | 0 | 2 | 4 | 16 | 388 |
| | 12 | 2 | 1 | 3 | 4 | 32 | 420 |
| | 13 | 2 | 2 | 4 | 4 | 64 | 484 |
| | 14 | 2 | 3 | 5 | 4 | 128 | 612 |
| | 15 | 2 | 4 | 6 | 4 | 256 | 868 |

| $z^2_4$ | cycle | j | k | n | popc | t<<n | S |
|---|---|---|---|---|---|---|---|
| 868 | 1 | 0 | 0 | 0 | 4 | 4 | 4 |
| | 2 | 0 | 1 | 1 | 4 | 8 | 12 |
| | 3 | 0 | 2 | 2 | 4 | 16 | 28 |
| | 4 | 0 | 3 | 3 | 4 | 32 | 60 |
| | 5 | 0 | 4 | 4 | 4 | 64 | 124 |
| | 6 | 1 | 0 | 1 | 4 | 8 | 132 |
| | 7 | 1 | 1 | 2 | 4 | 16 | 148 |
| | 8 | 1 | 2 | 3 | 4 | 32 | 180 |
| | 9 | 1 | 3 | 4 | 4 | 64 | 244 |
| | 10 | 1 | 4 | 5 | 4 | 128 | 372 |
| | 11 | 2 | 0 | 2 | 4 | 16 | 388 |
| | 12 | 2 | 1 | 3 | 4 | 32 | 420 |
| | 13 | 2 | 2 | 4 | 4 | 64 | 484 |
| | 14 | 2 | 3 | 5 | 4 | 128 | 612 |
| | 15 | 2 | 4 | 6 | 4 | 256 | 868 |

| $z^3_1$ | cycle | j | k | n | popc | t<<n | S |
|---|---|---|---|---|---|---|---|
| 868 | 1 | 0 | 0 | 0 | 4 | 4 | 4 |
| | 2 | 0 | 1 | 1 | 4 | 8 | 12 |
| | 3 | 0 | 2 | 2 | 4 | 16 | 28 |
| | 4 | 0 | 3 | 3 | 4 | 32 | 60 |
| | 5 | 0 | 4 | 4 | 4 | 64 | 124 |
| | 6 | 1 | 0 | 1 | 4 | 8 | 132 |
| | 7 | 1 | 1 | 2 | 4 | 16 | 148 |
| | 8 | 1 | 2 | 3 | 4 | 32 | 180 |
| | 9 | 1 | 3 | 4 | 4 | 64 | 244 |
| | 10 | 1 | 4 | 5 | 4 | 128 | 372 |
| | 11 | 2 | 0 | 2 | 4 | 16 | 388 |
| | 12 | 2 | 1 | 3 | 4 | 32 | 420 |
| | 13 | 2 | 2 | 4 | 4 | 64 | 484 |
| | 14 | 2 | 3 | 5 | 4 | 128 | 612 |
| | 15 | 2 | 4 | 6 | 4 | 256 | 868 |

| $z^3_2$ | cycle | j | k | n | popc | t<<n | S |
|---|---|---|---|---|---|---|---|
| 868 | 1 | 0 | 0 | 0 | 4 | 4 | 4 |
| | 2 | 0 | 1 | 1 | 4 | 8 | 12 |
| | 3 | 0 | 2 | 2 | 4 | 16 | 28 |
| | 4 | 0 | 3 | 3 | 4 | 32 | 60 |
| | 5 | 0 | 4 | 4 | 4 | 64 | 124 |
| | 6 | 1 | 0 | 1 | 4 | 8 | 132 |
| | 7 | 1 | 1 | 2 | 4 | 16 | 148 |
| | 8 | 1 | 2 | 3 | 4 | 32 | 180 |
| | 9 | 1 | 3 | 4 | 4 | 64 | 244 |
| | 10 | 1 | 4 | 5 | 4 | 128 | 372 |
| | 11 | 2 | 0 | 2 | 4 | 16 | 388 |
| | 12 | 2 | 1 | 3 | 4 | 32 | 420 |
| | 13 | 2 | 2 | 4 | 4 | 64 | 484 |
| | 14 | 2 | 3 | 5 | 4 | 128 | 612 |
| | 15 | 2 | 4 | 6 | 4 | 256 | 868 |

| $z^3_3$ | cycle | j | k | n | popc | t<<n | S |
|---|---|---|---|---|---|---|---|
| 868 | 1 | 0 | 0 | 0 | 4 | 4 | 4 |
| | 2 | 0 | 1 | 1 | 4 | 8 | 12 |
| | 3 | 0 | 2 | 2 | 4 | 16 | 28 |
| | 4 | 0 | 3 | 3 | 4 | 32 | 60 |
| | 5 | 0 | 4 | 4 | 4 | 64 | 124 |
| | 6 | 1 | 0 | 1 | 4 | 8 | 132 |
| | 7 | 1 | 1 | 2 | 4 | 16 | 148 |
| | 8 | 1 | 2 | 3 | 4 | 32 | 180 |
| | 9 | 1 | 3 | 4 | 4 | 64 | 244 |
| | 10 | 1 | 4 | 5 | 4 | 128 | 372 |
| | 11 | 2 | 0 | 2 | 4 | 16 | 388 |
| | 12 | 2 | 1 | 3 | 4 | 32 | 420 |
| | 13 | 2 | 2 | 4 | 4 | 64 | 484 |
| | 14 | 2 | 3 | 5 | 4 | 128 | 612 |
| | 15 | 2 | 4 | 6 | 4 | 256 | 868 |

| $z^3_4$ | cycle | j | k | n | popc | t<<n | S |
|---|---|---|---|---|---|---|---|
| 868 | 1 | 0 | 0 | 0 | 4 | 4 | 4 |
| | 2 | 0 | 1 | 1 | 4 | 8 | 12 |
| | 3 | 0 | 2 | 2 | 4 | 16 | 28 |
| | 4 | 0 | 3 | 3 | 4 | 32 | 60 |
| | 5 | 0 | 4 | 4 | 4 | 64 | 124 |
| | 6 | 1 | 0 | 1 | 4 | 8 | 132 |
| | 7 | 1 | 1 | 2 | 4 | 16 | 148 |
| | 8 | 1 | 2 | 3 | 4 | 32 | 180 |
| | 9 | 1 | 3 | 4 | 4 | 64 | 244 |
| | 10 | 1 | 4 | 5 | 4 | 128 | 372 |
| | 11 | 2 | 0 | 2 | 4 | 16 | 388 |
| | 12 | 2 | 1 | 3 | 4 | 32 | 420 |
| | 13 | 2 | 2 | 4 | 4 | 64 | 484 |
| | 14 | 2 | 3 | 5 | 4 | 128 | 612 |
| | 15 | 2 | 4 | 6 | 4 | 256 | 868 |

| $z^4_1$ | cycle | j | k | n | popc | t<<n | S |
|---|---|---|---|---|---|---|---|
| 868 | 1 | 0 | 0 | 0 | 4 | 4 | 4 |
| | 2 | 0 | 1 | 1 | 4 | 8 | 12 |
| | 3 | 0 | 2 | 2 | 4 | 16 | 28 |
| | 4 | 0 | 3 | 3 | 4 | 32 | 60 |
| | 5 | 0 | 4 | 4 | 4 | 64 | 124 |
| | 6 | 1 | 0 | 1 | 4 | 8 | 132 |
| | 7 | 1 | 1 | 2 | 4 | 16 | 148 |
| | 8 | 1 | 2 | 3 | 4 | 32 | 180 |
| | 9 | 1 | 3 | 4 | 4 | 64 | 244 |
| | 10 | 1 | 4 | 5 | 4 | 128 | 372 |
| | 11 | 2 | 0 | 2 | 4 | 16 | 388 |
| | 12 | 2 | 1 | 3 | 4 | 32 | 420 |
| | 13 | 2 | 2 | 4 | 4 | 64 | 484 |
| | 14 | 2 | 3 | 5 | 4 | 128 | 612 |
| | 15 | 2 | 4 | 6 | 4 | 256 | 868 |

| $z^4_2$ | cycle | j | k | n | popc | t<<n | S |
|---|---|---|---|---|---|---|---|
| 868 | 1 | 0 | 0 | 0 | 4 | 4 | 4 |
| | 2 | 0 | 1 | 1 | 4 | 8 | 12 |
| | 3 | 0 | 2 | 2 | 4 | 16 | 28 |
| | 4 | 0 | 3 | 3 | 4 | 32 | 60 |
| | 5 | 0 | 4 | 4 | 4 | 64 | 124 |
| | 6 | 1 | 0 | 1 | 4 | 8 | 132 |
| | 7 | 1 | 1 | 2 | 4 | 16 | 148 |
| | 8 | 1 | 2 | 3 | 4 | 32 | 180 |
| | 9 | 1 | 3 | 4 | 4 | 64 | 244 |
| | 10 | 1 | 4 | 5 | 4 | 128 | 372 |
| | 11 | 2 | 0 | 2 | 4 | 16 | 388 |
| | 12 | 2 | 1 | 3 | 4 | 32 | 420 |
| | 13 | 2 | 2 | 4 | 4 | 64 | 484 |
| | 14 | 2 | 3 | 5 | 4 | 128 | 612 |
| | 15 | 2 | 4 | 6 | 4 | 256 | 868 |

| $z^4_3$ | cycle | j | k | n | popc | t<<n | S |
|---|---|---|---|---|---|---|---|
| 868 | 1 | 0 | 0 | 0 | 4 | 4 | 4 |
| | 2 | 0 | 1 | 1 | 4 | 8 | 12 |
| | 3 | 0 | 2 | 2 | 4 | 16 | 28 |
| | 4 | 0 | 3 | 3 | 4 | 32 | 60 |
| | 5 | 0 | 4 | 4 | 4 | 64 | 124 |
| | 6 | 1 | 0 | 1 | 4 | 8 | 132 |
| | 7 | 1 | 1 | 2 | 4 | 16 | 148 |
| | 8 | 1 | 2 | 3 | 4 | 32 | 180 |
| | 9 | 1 | 3 | 4 | 4 | 64 | 244 |
| | 10 | 1 | 4 | 5 | 4 | 128 | 372 |
| | 11 | 2 | 0 | 2 | 4 | 16 | 388 |
| | 12 | 2 | 1 | 3 | 4 | 32 | 420 |
| | 13 | 2 | 2 | 4 | 4 | 64 | 484 |
| | 14 | 2 | 3 | 5 | 4 | 128 | 612 |
| | 15 | 2 | 4 | 6 | 4 | 256 | 868 |

| $z^4_4$ | cycle | j | k | n | popc | t<<n | S |
|---|---|---|---|---|---|---|---|
| 868 | 1 | 0 | 0 | 0 | 4 | 4 | 4 |
| | 2 | 0 | 1 | 1 | 4 | 8 | 12 |
| | 3 | 0 | 2 | 2 | 4 | 16 | 28 |
| | 4 | 0 | 3 | 3 | 4 | 32 | 60 |
| | 5 | 0 | 4 | 4 | 4 | 64 | 124 |
| | 6 | 1 | 0 | 1 | 4 | 8 | 132 |
| | 7 | 1 | 1 | 2 | 4 | 16 | 148 |
| | 8 | 1 | 2 | 3 | 4 | 32 | 180 |
| | 9 | 1 | 3 | 4 | 4 | 64 | 244 |
| | 10 | 1 | 4 | 5 | 4 | 128 | 372 |
| | 11 | 2 | 0 | 2 | 4 | 16 | 388 |
| | 12 | 2 | 1 | 3 | 4 | 32 | 420 |
| | 13 | 2 | 2 | 4 | 4 | 64 | 484 |
| | 14 | 2 | 3 | 5 | 4 | 128 | 612 |
| | 15 | 2 | 4 | 6 | 4 | 256 | 868 |

FIG. 8F

384

| $z^1_1$ | cycle | j | k | n | popc | t<<n | S |
|---|---|---|---|---|---|---|---|
| 4 | 1 | 0 | 0 | 0 | 0 | 0 | 0 |
| | 2 | 0 | 1 | 1 | 2 | 4 | 4 |
| | 3 | 0 | 2 | 2 | 0 | 0 | 4 |
| | 4 | 0 | 3 | 3 | 0 | 0 | 4 |
| | 5 | 0 | 4 | 4 | 0 | 0 | 4 |
| | 6 | 1 | 0 | 1 | 0 | 0 | 4 |
| | 7 | 1 | 1 | 2 | 0 | 0 | 4 |
| | 8 | 1 | 2 | 3 | 0 | 0 | 4 |
| | 9 | 1 | 3 | 4 | 0 | 0 | 4 |
| | 10 | 1 | 4 | 5 | 0 | 0 | 4 |
| | 11 | 2 | 0 | 2 | 0 | 0 | 4 |
| | 12 | 2 | 1 | 3 | 0 | 0 | 4 |
| | 13 | 2 | 2 | 4 | 0 | 0 | 4 |
| | 14 | 2 | 3 | 5 | 0 | 0 | 4 |
| | 15 | 2 | 4 | 6 | 0 | 0 | 4 |

| $z^1_2$ | cycle | j | k | n | popc | t<<n | S |
|---|---|---|---|---|---|---|---|
| 12 | 1 | 0 | 0 | 0 | 0 | 0 | 0 |
| | 2 | 0 | 1 | 1 | 2 | 4 | 4 |
| | 3 | 0 | 2 | 2 | 2 | 8 | 12 |
| | 4 | 0 | 3 | 3 | 0 | 0 | 12 |
| | 5 | 0 | 4 | 4 | 0 | 0 | 12 |
| | 6 | 1 | 0 | 1 | 0 | 0 | 12 |
| | 7 | 1 | 1 | 2 | 0 | 0 | 12 |
| | 8 | 1 | 2 | 3 | 0 | 0 | 12 |
| | 9 | 1 | 3 | 4 | 0 | 0 | 12 |
| | 10 | 1 | 4 | 5 | 0 | 0 | 12 |
| | 11 | 2 | 0 | 2 | 0 | 0 | 12 |
| | 12 | 2 | 1 | 3 | 0 | 0 | 12 |
| | 13 | 2 | 2 | 4 | 0 | 0 | 12 |
| | 14 | 2 | 3 | 5 | 0 | 0 | 12 |
| | 15 | 2 | 4 | 6 | 0 | 0 | 12 |

| $z^1_3$ | cycle | j | k | n | popc | t<<n | S |
|---|---|---|---|---|---|---|---|
| 18 | 1 | 0 | 0 | 0 | 2 | 2 | 2 |
| | 2 | 0 | 1 | 1 | 0 | 0 | 2 |
| | 3 | 0 | 2 | 2 | 0 | 0 | 2 |
| | 4 | 0 | 3 | 3 | 2 | 16 | 18 |
| | 5 | 0 | 4 | 4 | 0 | 0 | 18 |
| | 6 | 1 | 0 | 1 | 0 | 0 | 18 |
| | 7 | 1 | 1 | 2 | 0 | 0 | 18 |
| | 8 | 1 | 2 | 3 | 0 | 0 | 18 |
| | 9 | 1 | 3 | 4 | 0 | 0 | 18 |
| | 10 | 1 | 4 | 5 | 0 | 0 | 18 |
| | 11 | 2 | 0 | 2 | 0 | 0 | 18 |
| | 12 | 2 | 1 | 3 | 0 | 0 | 18 |
| | 13 | 2 | 2 | 4 | 0 | 0 | 18 |
| | 14 | 2 | 3 | 5 | 0 | 0 | 18 |
| | 15 | 2 | 4 | 6 | 0 | 0 | 18 |

| $z^1_4$ | cycle | j | k | n | popc | t<<n | S |
|---|---|---|---|---|---|---|---|
| 4 | 1 | 0 | 0 | 0 | 0 | 0 | 0 |
| | 2 | 0 | 1 | 1 | 2 | 4 | 4 |
| | 3 | 0 | 2 | 2 | 0 | 0 | 4 |
| | 4 | 0 | 3 | 3 | 0 | 0 | 4 |
| | 5 | 0 | 4 | 4 | 0 | 0 | 4 |
| | 6 | 1 | 0 | 1 | 0 | 0 | 4 |
| | 7 | 1 | 1 | 2 | 0 | 0 | 4 |
| | 8 | 1 | 2 | 3 | 0 | 0 | 4 |
| | 9 | 1 | 3 | 4 | 0 | 0 | 4 |
| | 10 | 1 | 4 | 5 | 0 | 0 | 4 |
| | 11 | 2 | 0 | 2 | 0 | 0 | 4 |
| | 12 | 2 | 1 | 3 | 0 | 0 | 4 |
| | 13 | 2 | 2 | 4 | 0 | 0 | 4 |
| | 14 | 2 | 3 | 5 | 0 | 0 | 4 |
| | 15 | 2 | 4 | 6 | 0 | 0 | 4 |

| $z^2_1$ | cycle | j | k | n | popc | t<<n | S |
|---|---|---|---|---|---|---|---|
| 34 | 1 | 0 | 0 | 0 | 2 | 2 | 2 |
| | 2 | 0 | 1 | 1 | 2 | 4 | 6 |
| | 3 | 0 | 2 | 2 | 0 | 0 | 6 |
| | 4 | 0 | 3 | 3 | 0 | 0 | 6 |
| | 5 | 0 | 4 | 4 | 0 | 0 | 6 |
| | 6 | 1 | 0 | 1 | 2 | 4 | 10 |
| | 7 | 1 | 1 | 2 | 2 | 8 | 18 |
| | 8 | 1 | 2 | 3 | 0 | 0 | 18 |
| | 9 | 1 | 3 | 4 | 0 | 0 | 18 |
| | 10 | 1 | 4 | 5 | 0 | 0 | 18 |
| | 11 | 2 | 0 | 2 | 0 | 0 | 18 |
| | 12 | 2 | 1 | 3 | 2 | 16 | 34 |
| | 13 | 2 | 2 | 4 | 0 | 0 | 34 |
| | 14 | 2 | 3 | 5 | 0 | 0 | 34 |
| | 15 | 2 | 4 | 6 | 0 | 0 | 34 |

| $z^2_2$ | cycle | j | k | n | popc | t<<n | S |
|---|---|---|---|---|---|---|---|
| 102 | 1 | 0 | 0 | 0 | 2 | 2 | 2 |
| | 2 | 0 | 1 | 1 | 4 | 8 | 10 |
| | 3 | 0 | 2 | 2 | 2 | 8 | 18 |
| | 4 | 0 | 3 | 3 | 0 | 0 | 18 |
| | 5 | 0 | 4 | 4 | 0 | 0 | 18 |
| | 6 | 1 | 0 | 1 | 2 | 4 | 22 |
| | 7 | 1 | 1 | 2 | 4 | 16 | 38 |
| | 8 | 1 | 2 | 3 | 2 | 16 | 54 |
| | 9 | 1 | 3 | 4 | 0 | 0 | 54 |
| | 10 | 1 | 4 | 5 | 0 | 0 | 54 |
| | 11 | 2 | 0 | 2 | 0 | 0 | 54 |
| | 12 | 2 | 1 | 3 | 2 | 16 | 70 |
| | 13 | 2 | 2 | 4 | 2 | 32 | 102 |
| | 14 | 2 | 3 | 5 | 0 | 0 | 102 |
| | 15 | 2 | 4 | 6 | 0 | 0 | 102 |

| $z^2_3$ | cycle | j | k | n | popc | t<<n | S |
|---|---|---|---|---|---|---|---|
| 144 | 1 | 0 | 0 | 0 | 4 | 4 | 4 |
| | 2 | 0 | 1 | 1 | 2 | 4 | 8 |
| | 3 | 0 | 2 | 2 | 0 | 0 | 8 |
| | 4 | 0 | 3 | 3 | 2 | 16 | 24 |
| | 5 | 0 | 4 | 4 | 0 | 0 | 24 |
| | 6 | 1 | 0 | 1 | 4 | 8 | 32 |
| | 7 | 1 | 1 | 2 | 2 | 8 | 40 |
| | 8 | 1 | 2 | 3 | 0 | 0 | 40 |
| | 9 | 1 | 3 | 4 | 2 | 32 | 72 |
| | 10 | 1 | 4 | 5 | 0 | 0 | 72 |
| | 11 | 2 | 0 | 2 | 2 | 8 | 80 |
| | 12 | 2 | 1 | 3 | 0 | 0 | 80 |
| | 13 | 2 | 2 | 4 | 0 | 0 | 80 |
| | 14 | 2 | 3 | 5 | 2 | 64 | 144 |
| | 15 | 2 | 4 | 6 | 0 | 0 | 144 |

| $z^2_4$ | cycle | j | k | n | popc | t<<n | S |
|---|---|---|---|---|---|---|---|
| 34 | 1 | 0 | 0 | 0 | 2 | 2 | 2 |
| | 2 | 0 | 1 | 1 | 2 | 4 | 6 |
| | 3 | 0 | 2 | 2 | 0 | 0 | 6 |
| | 4 | 0 | 3 | 3 | 0 | 0 | 6 |
| | 5 | 0 | 4 | 4 | 0 | 0 | 6 |
| | 6 | 1 | 0 | 1 | 2 | 4 | 10 |
| | 7 | 1 | 1 | 2 | 2 | 8 | 18 |
| | 8 | 1 | 2 | 3 | 0 | 0 | 18 |
| | 9 | 1 | 3 | 4 | 0 | 0 | 18 |
| | 10 | 1 | 4 | 5 | 0 | 0 | 18 |
| | 11 | 2 | 0 | 2 | 0 | 0 | 18 |
| | 12 | 2 | 1 | 3 | 2 | 16 | 34 |
| | 13 | 2 | 2 | 4 | 0 | 0 | 34 |
| | 14 | 2 | 3 | 5 | 0 | 0 | 34 |
| | 15 | 2 | 4 | 6 | 0 | 0 | 34 |

| $z^3_1$ | cycle | j | k | n | popc | t<<n | S |
|---|---|---|---|---|---|---|---|
| 34 | 1 | 0 | 0 | 0 | 2 | 2 | 2 |
| | 2 | 0 | 1 | 1 | 2 | 4 | 6 |
| | 3 | 0 | 2 | 2 | 0 | 0 | 6 |
| | 4 | 0 | 3 | 3 | 0 | 0 | 6 |
| | 5 | 0 | 4 | 4 | 0 | 0 | 6 |
| | 6 | 1 | 0 | 1 | 2 | 4 | 10 |
| | 7 | 1 | 1 | 2 | 2 | 8 | 18 |
| | 8 | 1 | 2 | 3 | 0 | 0 | 18 |
| | 9 | 1 | 3 | 4 | 0 | 0 | 18 |
| | 10 | 1 | 4 | 5 | 0 | 0 | 18 |
| | 11 | 2 | 0 | 2 | 0 | 0 | 18 |
| | 12 | 2 | 1 | 3 | 2 | 16 | 34 |
| | 13 | 2 | 2 | 4 | 0 | 0 | 34 |
| | 14 | 2 | 3 | 5 | 0 | 0 | 34 |
| | 15 | 2 | 4 | 6 | 0 | 0 | 34 |

| $z^3_2$ | cycle | j | k | n | popc | t<<n | S |
|---|---|---|---|---|---|---|---|
| 102 | 1 | 0 | 0 | 0 | 2 | 2 | 2 |
| | 2 | 0 | 1 | 1 | 4 | 8 | 10 |
| | 3 | 0 | 2 | 2 | 2 | 8 | 18 |
| | 4 | 0 | 3 | 3 | 0 | 0 | 18 |
| | 5 | 0 | 4 | 4 | 0 | 0 | 18 |
| | 6 | 1 | 0 | 1 | 2 | 4 | 22 |
| | 7 | 1 | 1 | 2 | 4 | 16 | 38 |
| | 8 | 1 | 2 | 3 | 2 | 16 | 54 |
| | 9 | 1 | 3 | 4 | 0 | 0 | 54 |
| | 10 | 1 | 4 | 5 | 0 | 0 | 54 |
| | 11 | 2 | 0 | 2 | 0 | 0 | 54 |
| | 12 | 2 | 1 | 3 | 2 | 16 | 70 |
| | 13 | 2 | 2 | 4 | 2 | 32 | 102 |
| | 14 | 2 | 3 | 5 | 0 | 0 | 102 |
| | 15 | 2 | 4 | 6 | 0 | 0 | 102 |

| $z^3_3$ | cycle | j | k | n | popc | t<<n | S |
|---|---|---|---|---|---|---|---|
| 144 | 1 | 0 | 0 | 0 | 4 | 4 | 4 |
| | 2 | 0 | 1 | 1 | 2 | 4 | 8 |
| | 3 | 0 | 2 | 2 | 0 | 0 | 8 |
| | 4 | 0 | 3 | 3 | 2 | 16 | 24 |
| | 5 | 0 | 4 | 4 | 0 | 0 | 24 |
| | 6 | 1 | 0 | 1 | 4 | 8 | 32 |
| | 7 | 1 | 1 | 2 | 2 | 8 | 40 |
| | 8 | 1 | 2 | 3 | 0 | 0 | 40 |
| | 9 | 1 | 3 | 4 | 2 | 32 | 72 |
| | 10 | 1 | 4 | 5 | 0 | 0 | 72 |
| | 11 | 2 | 0 | 2 | 2 | 8 | 80 |
| | 12 | 2 | 1 | 3 | 0 | 0 | 80 |
| | 13 | 2 | 2 | 4 | 0 | 0 | 80 |
| | 14 | 2 | 3 | 5 | 2 | 64 | 144 |
| | 15 | 2 | 4 | 6 | 0 | 0 | 144 |

| $z^3_4$ | cycle | j | k | n | popc | t<<n | S |
|---|---|---|---|---|---|---|---|
| 34 | 1 | 0 | 0 | 0 | 2 | 2 | 2 |
| | 2 | 0 | 1 | 1 | 2 | 4 | 6 |
| | 3 | 0 | 2 | 2 | 0 | 0 | 6 |
| | 4 | 0 | 3 | 3 | 0 | 0 | 6 |
| | 5 | 0 | 4 | 4 | 0 | 0 | 6 |
| | 6 | 1 | 0 | 1 | 2 | 4 | 10 |
| | 7 | 1 | 1 | 2 | 2 | 8 | 18 |
| | 8 | 1 | 2 | 3 | 0 | 0 | 18 |
| | 9 | 1 | 3 | 4 | 0 | 0 | 18 |
| | 10 | 1 | 4 | 5 | 0 | 0 | 18 |
| | 11 | 2 | 0 | 2 | 0 | 0 | 18 |
| | 12 | 2 | 1 | 3 | 2 | 16 | 34 |
| | 13 | 2 | 2 | 4 | 0 | 0 | 34 |
| | 14 | 2 | 3 | 5 | 0 | 0 | 34 |
| | 15 | 2 | 4 | 6 | 0 | 0 | 34 |

| $z^4_1$ | cycle | j | k | n | popc | t<<n | S |
|---|---|---|---|---|---|---|---|
| 4 | 1 | 0 | 0 | 0 | 0 | 0 | 0 |
| | 2 | 0 | 1 | 1 | 2 | 4 | 4 |
| | 3 | 0 | 2 | 2 | 0 | 0 | 4 |
| | 4 | 0 | 3 | 3 | 0 | 0 | 4 |
| | 5 | 0 | 4 | 4 | 0 | 0 | 4 |
| | 6 | 1 | 0 | 1 | 0 | 0 | 4 |
| | 7 | 1 | 1 | 2 | 0 | 0 | 4 |
| | 8 | 1 | 2 | 3 | 0 | 0 | 4 |
| | 9 | 1 | 3 | 4 | 0 | 0 | 4 |
| | 10 | 1 | 4 | 5 | 0 | 0 | 4 |
| | 11 | 2 | 0 | 2 | 0 | 0 | 4 |
| | 12 | 2 | 1 | 3 | 0 | 0 | 4 |
| | 13 | 2 | 2 | 4 | 0 | 0 | 4 |
| | 14 | 2 | 3 | 5 | 0 | 0 | 4 |
| | 15 | 2 | 4 | 6 | 0 | 0 | 4 |

| $z^4_2$ | cycle | j | k | n | popc | t<<n | S |
|---|---|---|---|---|---|---|---|
| 12 | 1 | 0 | 0 | 0 | 0 | 0 | 0 |
| | 2 | 0 | 1 | 1 | 2 | 4 | 4 |
| | 3 | 0 | 2 | 2 | 2 | 8 | 12 |
| | 4 | 0 | 3 | 3 | 0 | 0 | 12 |
| | 5 | 0 | 4 | 4 | 0 | 0 | 12 |
| | 6 | 1 | 0 | 1 | 0 | 0 | 12 |
| | 7 | 1 | 1 | 2 | 0 | 0 | 12 |
| | 8 | 1 | 2 | 3 | 0 | 0 | 12 |
| | 9 | 1 | 3 | 4 | 0 | 0 | 12 |
| | 10 | 1 | 4 | 5 | 0 | 0 | 12 |
| | 11 | 2 | 0 | 2 | 0 | 0 | 12 |
| | 12 | 2 | 1 | 3 | 0 | 0 | 12 |
| | 13 | 2 | 2 | 4 | 0 | 0 | 12 |
| | 14 | 2 | 3 | 5 | 0 | 0 | 12 |
| | 15 | 2 | 4 | 6 | 0 | 0 | 12 |

| $z^4_3$ | cycle | j | k | n | popc | t<<n | S |
|---|---|---|---|---|---|---|---|
| 18 | 1 | 0 | 0 | 0 | 2 | 2 | 2 |
| | 2 | 0 | 1 | 1 | 0 | 0 | 2 |
| | 3 | 0 | 2 | 2 | 0 | 0 | 2 |
| | 4 | 0 | 3 | 3 | 2 | 16 | 18 |
| | 5 | 0 | 4 | 4 | 0 | 0 | 18 |
| | 6 | 1 | 0 | 1 | 0 | 0 | 18 |
| | 7 | 1 | 1 | 2 | 0 | 0 | 18 |
| | 8 | 1 | 2 | 3 | 0 | 0 | 18 |
| | 9 | 1 | 3 | 4 | 0 | 0 | 18 |
| | 10 | 1 | 4 | 5 | 0 | 0 | 18 |
| | 11 | 2 | 0 | 2 | 0 | 0 | 18 |
| | 12 | 2 | 1 | 3 | 0 | 0 | 18 |
| | 13 | 2 | 2 | 4 | 0 | 0 | 18 |
| | 14 | 2 | 3 | 5 | 0 | 0 | 18 |
| | 15 | 2 | 4 | 6 | 0 | 0 | 18 |

| $z^4_4$ | cycle | j | k | n | popc | t<<n | S |
|---|---|---|---|---|---|---|---|
| 4 | 1 | 0 | 0 | 0 | 0 | 0 | 0 |
| | 2 | 0 | 1 | 1 | 2 | 4 | 4 |
| | 3 | 0 | 2 | 2 | 0 | 0 | 4 |
| | 4 | 0 | 3 | 3 | 0 | 0 | 4 |
| | 5 | 0 | 4 | 4 | 0 | 0 | 4 |
| | 6 | 1 | 0 | 1 | 0 | 0 | 4 |
| | 7 | 1 | 1 | 2 | 0 | 0 | 4 |
| | 8 | 1 | 2 | 3 | 0 | 0 | 4 |
| | 9 | 1 | 3 | 4 | 0 | 0 | 4 |
| | 10 | 1 | 4 | 5 | 0 | 0 | 4 |
| | 11 | 2 | 0 | 2 | 0 | 0 | 4 |
| | 12 | 2 | 1 | 3 | 0 | 0 | 4 |
| | 13 | 2 | 2 | 4 | 0 | 0 | 4 |
| | 14 | 2 | 3 | 5 | 0 | 0 | 4 |
| | 15 | 2 | 4 | 6 | 0 | 0 | 4 |

FIG. 8H

MATRIX MULTIPLY ACCELERATOR FOR VARIABLE BITWIDTH OPERANDS

BACKGROUND

The present disclosure relates to computer systems. More particularly, the present disclosure relates to a matrix multiplication system and method.

Artificial neural networks (ANNs), such as deep neural networks (DNNs), convolutional neural networks (CNNs), etc., are a popular solution to a wide array of challenging classification, recognition and regression problems. However, many ANN models require a large number of calculations involving a large number of weights and activations, which presents a significant challenge with respect to access, storage and performance, particularly for mobile and other power or storage-constrained devices. An ANN hardware accelerator accelerates these calculations, such as, for example, convolution operations performed by CNNs.

Typically, native convolution operations are not performed by a CNN due to the complicated dataflow and expensive datapaths that are usually required. Instead, native convolution operations are converted into generic matrix multiplication (GEMM) operations, and then the GEMM operations are executed more efficiently using optimized software libraries for a processor or specialized hardware, such as, for example, a matrix multiply accelerator (MMA), etc. More particularly, an "IM2COL" software function may be used to convert the filter (weight) matrix and the input feature map (IFM) matrix for each convolution operation into an expanded format that is compatible with a GEMM operation. The IM2COL versions of each filter (weight) matrix and each IFM matrix are generated and stored in memory, and then loaded from memory and processed by the GEMM operation by the processor, MMA, etc.

However, different matrices may store data having different bit-widths. Unfortunately, MMAs use fixed-resolution MAC units regardless of the bit-width of the operands in order to maximize power and area efficiency.

BRIEF DESCRIPTION OF THE DRAWINGS

FIGS. 6D, 6E and 6F depict examples of the computation of the dot product between vector A and vector B using a 1-bit dot product unit, in accordance with an embodiment of the present disclosure.

FIG. 8A depicts a data flow diagram for a BSDP array, while

FIGS. 8C, 8D, 8E, 8F, 8G and 8H depict examples of the multiplication of matrix X and matrix Y to generate matrix Z using a BSDP array, in accordance with an embodiment of the present disclosure.

DETAILED DESCRIPTION

Figure 1:
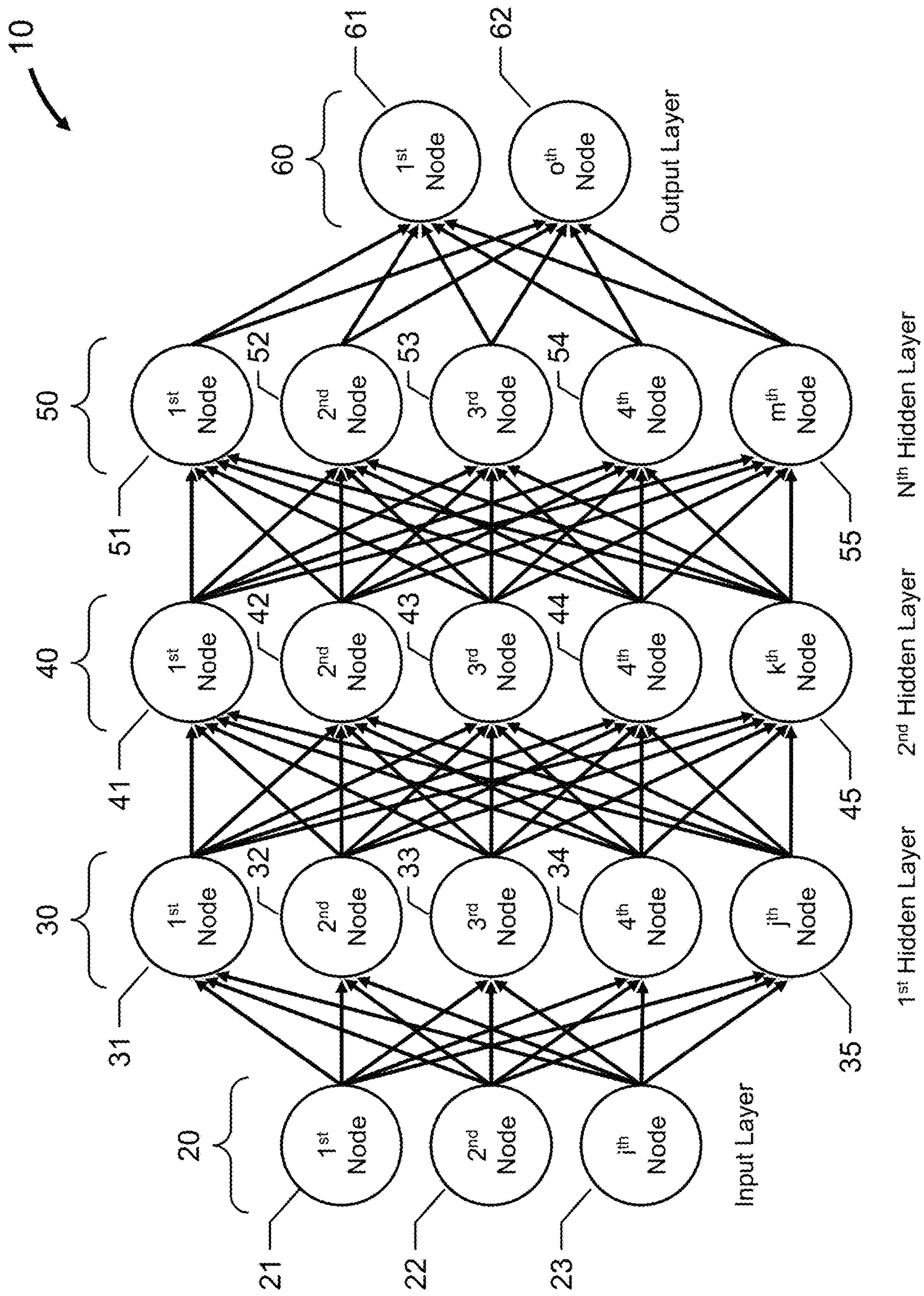
FIG. 1 depicts an ANN, in accordance with embodiments of the present disclosure.

Embodiments of the present disclosure will now be described with reference to the drawing figures, in which like reference numerals refer to like parts throughout.

Embodiments of the present disclosure advantageously provide a system and method for multiplying first and second matrices with variable bit-width operands using an MMA with an array of bitslice dot product (BSDP) units. For the first matrix, a number of bit slice vectors for each row are generated based on the bit resolution, and a first bit slice tensor is generated based on the bit slice vectors for each row. For the second matrix, a number of bit slice vectors for each column are generated based on the bit resolution, and a second bit slice tensor is generated based on the bit slice vectors for each row. The first and second bit slice tensors are multiplied by the MMA to generate an output matrix.

An ANN models the relationships between input data or signals and output data or signals using a network of interconnected nodes that is trained through a learning process. The nodes are arranged into various layers, including, for example, an input layer, one or more hidden layers, and an output layer. The input layer receives input data, such as, for example, image data, and the output layer generates output data, such as, for example, a probability that the image data contains a known object. Each hidden layer provides at least a partial transformation of the input data to the output data. A DNN has multiple hidden layers in order to model complex, nonlinear relationships between input data and output data.

In a fully-connected, feedforward ANN, each node is connected to all of the nodes in the preceding layer, as well as to all of the nodes in the subsequent layer. For example, each input layer node is connected to each hidden layer node, each hidden layer node is connected to each input layer node and each output layer node, and each output layer node is connected to each hidden layer node. Additional hidden layers are similarly interconnected. Each connection has a weight value, and each node has an activation function, such as, for example, a linear function, a step function, a sigmoid function, a tanh function, a rectified linear unit (ReLU) function, etc., that determines the output of the node based on the weighted sum of the inputs to the node. The input data propagates from the input layer nodes, through respective connection weights to the hidden layer nodes, and then through respective connection weights to the output layer nodes.

More particularly, at each input node, input data is provided to the activation function for that node, and the output of the activation function is then provided as an input data value to each hidden layer node. At each hidden layer node, the input data value received from each input layer node is multiplied by a respective connection weight, and the resulting products are summed or accumulated into an activation value that is provided to the activation function for that node. The output of the activation function is then provided as an input data value to each output layer node. At each output layer node, the output data value received from each hidden layer node is multiplied by a respective connection weight, and the resulting products are summed or accumulated into an activation value that is provided to the activation function for that node. The output of the activation function is then provided as output data. Additional hidden layers may be similarly configured to process data.

FIG. 1 depicts ANN 10, in accordance with an embodiment of the present disclosure.

ANN 10 includes input layer 20, one or more hidden layers 30, 40, 50, etc., and output layer 60. Input layer 20 includes one or more input nodes 21, 22, 23, etc. Hidden layer 30 includes one or more hidden nodes 31, 32, 33, 34, 35, etc. Hidden layer 40 includes one or more hidden nodes 41, 42, 43, 44, 45, etc. Hidden layer 50 includes one or more hidden nodes 51, 52, 53, 54, 55, etc. Output layer 60 includes one or more output nodes 61, 62, etc. Generally, ANN 10 includes N hidden layers, input layer 20 includes "i" nodes, hidden layer 30 includes "j" nodes, hidden layer 40 includes "k" nodes, hidden layer 50 includes "m" nodes, and output layer 60 includes "o" nodes.

In one embodiment, N equals 3, i equals 3, j, k and m equal 5 and o equals 2 (depicted in FIG. 1). Input node 21 is coupled to hidden nodes 31 to 35, input node 22 is coupled to hidden nodes 31 to 35, and input node 23 is coupled to hidden nodes 31 to 35. Hidden node 31 is coupled to hidden nodes 41 to 45, hidden node 32 is coupled to hidden nodes 41 to 45, hidden node 33 is coupled to hidden nodes 41 to 45, hidden node 34 is coupled to hidden nodes 41 to 45, and hidden node 35 is coupled to hidden nodes 41 to 45. Hidden node 41 is coupled to hidden nodes 51 to 55, hidden node 42 is coupled to hidden nodes 51 to 55, hidden node 43 is coupled to hidden nodes 51 to 55, hidden node 44 is coupled to hidden nodes 51 to 55, and hidden node 45 is coupled to hidden nodes 51 to 55. Hidden node 51 is coupled to output nodes 61 and 62, hidden node 52 is coupled to output nodes 61 and 62, hidden node 53 is coupled to output nodes 61 and 62, hidden node 54 is coupled to output nodes 61 and 62, and hidden node 55 is coupled to output nodes 61 and 62.

Many other variations of input, hidden and output layers are clearly possible, including hidden layers that are locally-connected, rather than fully-connected, to one another.

Training an ANN includes optimizing the connection weights between nodes by minimizing the prediction error of the output data until the ANN achieves a particular level of accuracy. One method is backpropagation, or backward propagation of errors, which iteratively and recursively determines a gradient descent with respect to the connection weights, and then adjusts the connection weights to improve the performance of the network.

A multi-layer perceptron (MLP) is a fully-connected ANN that has an input layer, an output layer and one or more hidden layers. MLPs may be used for natural language processing applications, such as machine translation, speech recognition, etc. Other ANNs include recurrent neural networks (RNNs), long short-term memories (LSTMs), sequence-to-sequence models that include an encoder RNN and a decoder RNN, shallow neural networks, etc.

A CNN is a variation of an MLP that may be used for classification or recognition applications, such as image recognition, speech recognition, etc. A CNN has an input layer, an output layer and multiple hidden layers including convolutional layers, pooling layers, normalization layers, fully-connected layers, etc. Each convolutional layer applies a sliding dot product or cross-correlation to an input volume, applies an activation function to the results, and then provides the activation or output volume to the next layer. Convolutional layers typically use the ReLU function as the activation function. In certain embodiments, the activation function is provided in a separate activation layer, such as, for example, a ReLU layer. A pooling layer reduces the dimensions of the output volume received from the preceding convolutional layer, and may calculate an average or a maximum over small clusters of data, such as, for example, 2×2 matrices. In certain embodiments, a convolutional layer and a pooling layer may form a single layer of a CNN. The fully-connected layers follow the convolutional and pooling layers, and include a flatten layer and a classification layer, followed by a normalization layer that includes a normalization function, such as the SoftMax function. The output layer follows the last fully-connected layer; in certain embodiments, the output layer may include the normalization function.

Figure 2:
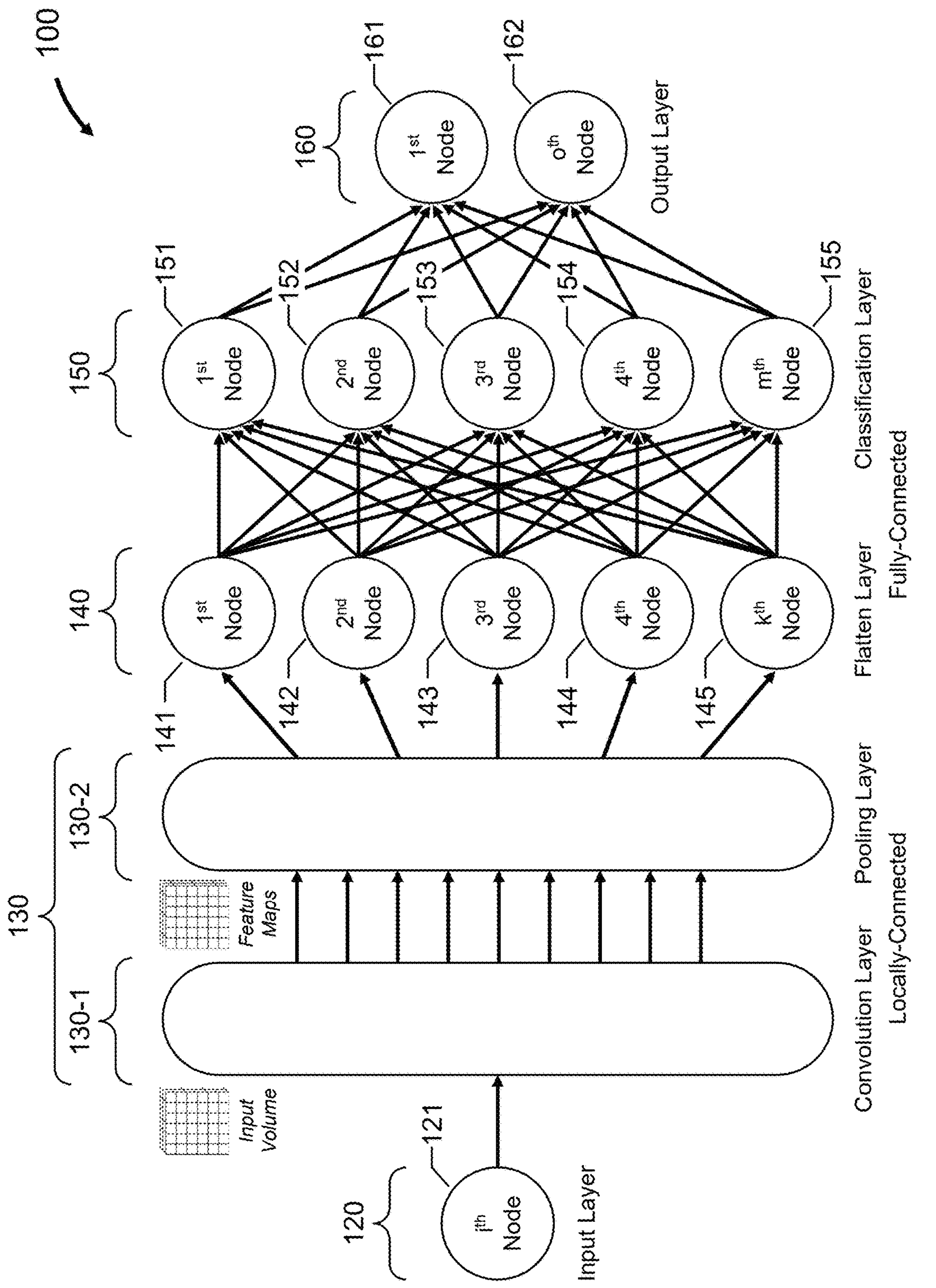
FIG. 2 depicts a CNN, in accordance with embodiments of the present disclosure.

FIG. 2 depicts CNN 100, in accordance with an embodiment of the present disclosure. CNN 100 includes input layer 120, one or more hidden layers, such as convolutional layer 130-1, pooling layer 130-2, hidden (flatten) layer 140, hidden (classification) layer 150, etc., and output layer 160. Many other variations of input, hidden and output layers are contemplated.

Input layer 120 includes one or more input nodes 121, etc., that present the input data, such as a color image, as an input volume to the first convolutional layer, e.g., convolutional layer 130-1. The input volume is a three-dimensional matrix that has a width, a height and a depth. For example, input data that represent a color image are presented as an input volume that is 512 pixels×512 pixels×3 channels (red, green, blue); other input volume dimensions may also be used, such as 32×32×3, 64×64×3, 128×128×3, etc., 32×32×1, 64×64×1, 128×128×1, 512×512×1, etc.

Convolutional layer 130-1 is locally-connected to input layer 120, and includes a plurality of nodes that are connected to local regions in the input volume (not depicted for clarity). For a CNN that uses a standard convolution, each node computes a dot product between the node's weights and the respective local region of the input volume. An activation function is then applied to the results of each convolution calculation to produce an output volume that is provided as an input volume to the subsequent layer. The activation function may be applied by each convolutional layer node or by the nodes of a subsequent locally-connected ReLU layer.

Pooling layer 130-2 is locally-connected to convolutional layer 130-1, and includes a plurality of nodes that are connected to local regions in the input volume (not depicted for clarity). Pooling layer 130-2 also produces an output volume that is provided as the input volume to the subsequent layer, such as, for example, another convolutional layer 130-1, a flatten layer 140, etc. In certain embodiments, convolutional layer 130-1 and pooling layer 130-2 form a single hidden layer 130. Similarly, in certain embodiments, convolutional layer 130-1, a ReLU layer and pooling layer 130-2 form a single hidden layer 130. Generally, the output volumes of the convolutional and pooling layers may be described as feature maps, and one or more single hidden layers 130 form a feature learning portion of CNN 100.

Hidden layer 140 is a "flatten" layer that is locally-connected to pooling layer 130-2, and includes one or more hidden (flatten) nodes 141, 142, 143, 144, 145, etc. Hidden (flatten) layer 140 "flattens" the output volume produced by the preceding pooling layer 130-2 into a column vector, which is provided to the subsequent, fully-connected hidden layer 150.

Hidden layer 150 is a classification layer that is fully-connected to hidden (flatten) layer 140, and includes one or more hidden (classification) nodes 151, 152, 153, 154, 155, etc.

Output layer 160 includes one or more output nodes 161, 162, etc., and is fully-connected to hidden (classification) layer 150. Fully-connected output layer 160 receives the classification results output by hidden (classification) layer 150, and each node outputs a predicted class score. A normalization function, such as a SoftMax function, may be applied to the predicted class scores by output layer 160, or, alternatively, by an additional layer interposed between hidden (classification) layer 150 and output layer 160.

Similar to ANNs, training a CNN includes optimizing the connection weights between nodes by minimizing the prediction error of the output data until the CNN achieves a particular level of accuracy. As noted above, backpropagation may be used to iteratively and recursively determines a gradient descent with respect to the connection weights, and then adjusts the connection weights to improve the performance of the network. Matrix multiplication operations, and, more particularly, multiply-and-accumulate (MAC) operations, are used extensively by CNNs, as well as other ANNs.

Figure 3A:
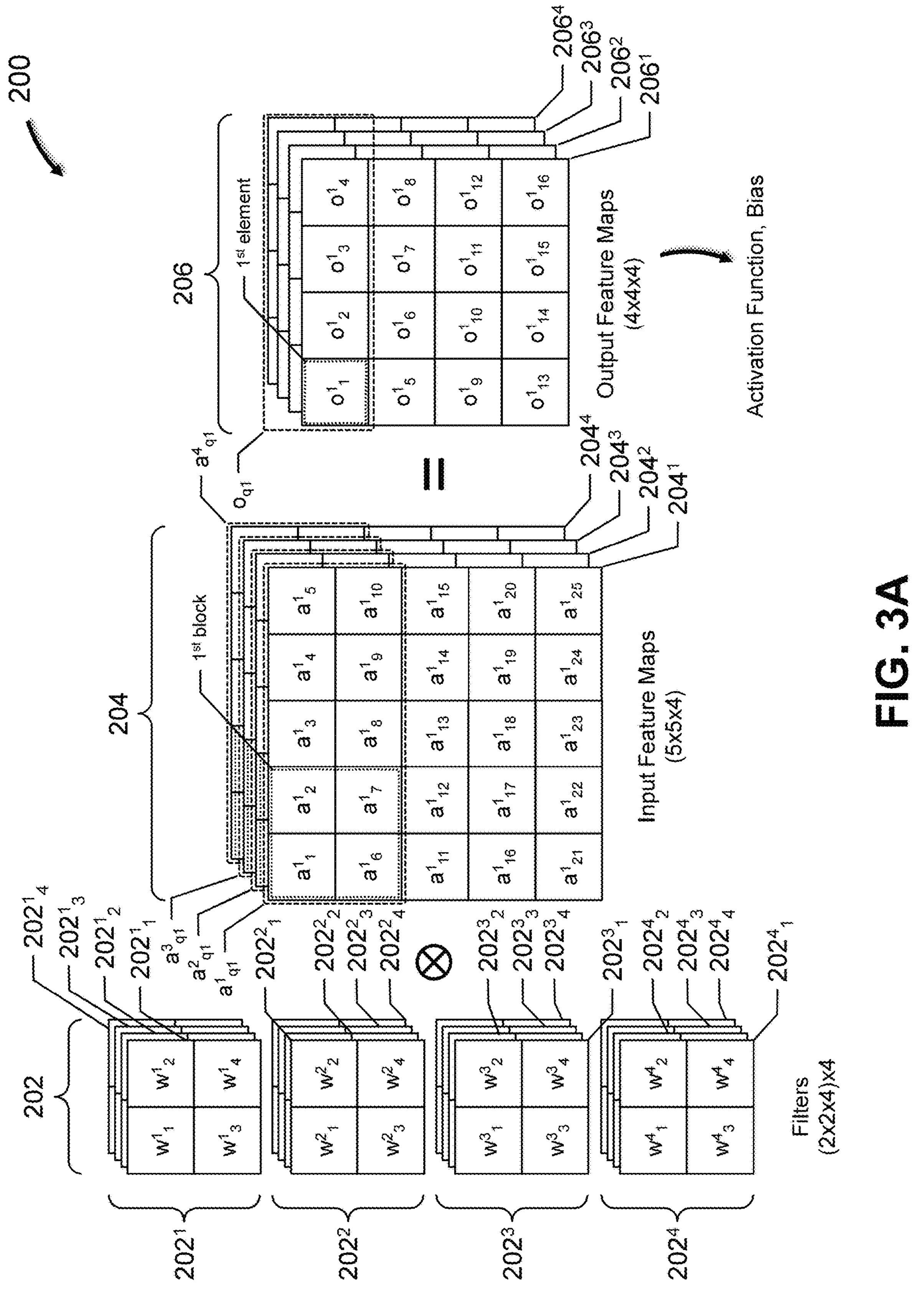
FIG. 3A depicts convolutional layer calculation for a CNN.

FIG. 3A depicts convolutional layer calculation 200 for a CNN, in accordance with an embodiment of the present disclosure.

Input feature maps 204 include four channels and one input data matrix for each channel, i.e., input data matrices 204$^1$, 204$^2$, 204$^3$ and 204$^4$. Filter 202 includes four filter or weight sets 202$^1$, 202$^2$, 202$^3$ and 202$^4$, and each filter or weight set includes four weight matrices, one weight matrix for each channel. Output feature maps 206 include four channels and one output data matrix for each filter or weight set, i.e., output data matrices 206$^1$, 206$^2$, 206$^3$ and 206$^4$. Convolutional layer calculation 200 convolves filter 202 with input feature maps 204 to produce output feature maps 206.

Generally, input data matrices 204$^1$, 204$^2$, 204$^3$ and 204$^4$ form an input tensor, each weight set 202$^1$, 202$^2$, 202$^3$ and 202$^4$ forms a weight tensor, and output data matrices 206$^1$, 206$^2$, 206$^3$ and 206$^4$ form an output tensor. In this embodiment, each tensor has a height, a width and a depth. The depth of the input tensor is equal to the number of channels, the depth of each weight tensor is equal to the number of channels, and the depth of the output tensor is equal to the number of weight tensors (i.e., weight sets). While particular dimensions for the tensors and matrices have been selected for clarity of illustration and explanation, embodiments of the present disclosure are not so limited.

In one embodiment, input data matrix 204$^1$ is a 5×5 matrix associated with the first channel and includes activations $a^1_1$, $a^1_2$, $a^1_3$, $a^1_4$, $a^1_5$, $a^1_6$, $a^1_7$, $a^1_8$, $a^1_9$, $a^1_{10}$, $a^1_{11}$, $a^1_{12}$, $a^1_{13}$, $a^1_{14}$, $a^1_{15}$, $a^1_{16}$, $a^1_{17}$, $a^1_{18}$, $a^1_{19}$, $a^1_{20}$, $a^1_{21}$, $a^1_{22}$, $a^1_{23}$, $a^1_{24}$ and $a^1_{25}$. Input data matrix 204$^2$ is a 5×5 matrix associated with the second channel and includes activations $a^2_1$, $a^2_2$, $a^2_3$, $a^2_4$, $a^2_5$, $a^2_6$, $a^2_7$, $a^2_8$, $a^2_9$, $a^2_{10}$, $a^2_{11}$, $a^2_{12}$, $a^2_{13}$, $a^2_{14}$, $a^2_{15}$, $a^2_{16}$, $a^2_{17}$, $a^2_{18}$, $a^2_{19}$, $a^2_{20}$, $a^2_{21}$, $a^2_{22}$, $a^2_{23}$, $a^2_{24}$ and $a^2_{25}$. Input data matrix 204$^3$ is a 5×5 matrix associated with the third channel and includes activations $a^3_1$, $a^3_2$, $a^3_3$, $a^3_4$, $a^3_5$, $a^3_6$, $a^3_7$, $a^3_8$, $a^3_9$, $a^3_{10}$, $a^3_{11}$, $a^3_{12}$, $a^3_{13}$, $a^3_{14}$, $a^3_{15}$, $a^3_{16}$, $a^3_{17}$, $a^3_{18}$, $a^3_{19}$, $a^3_{20}$, $a^3_{21}$, $a^3_{22}$, $a^3_{23}$, $a^3_{24}$ and $a^3_{25}$. Input data matrix 204$^4$ is a 5×5 matrix associated with the fourth channel and includes activations $a^4_1$, $a^4_2$, $a^4_3$, $a^4_4$, $a^4_5$, $a^4_6$, $a^4_7$, $a^4_8$, $a^4_9$, $a^4_{10}$, $a^4_{11}$, $a^4_{12}$, $a^4_{13}$, $a^4_{14}$, $a^4_{15}$, $a^4_{16}$, $a^4_{17}$, $a^4_{18}$, $a^4_{19}$, $a^4_{20}$, $a^4_{21}$, $a^4_{22}$, $a^4_{23}$, $a^4_{24}$ and $a^4_{25}$.

In this embodiment, weight set 202$^1$ includes four weight matrices 202$^1_1$, 202$^1_2$, 202$^1_3$ and 202$^1_4$. Weight matrix 202$^1_1$ is a 2×2 matrix associated with the first channel, and includes weights $w^1_1$, $w^1_2$, $w^1_3$ and $w^1_4$. Weight matrix 202$^1_2$ is a 2×2 matrix associated with the second channel, and includes weights $w^1_5$, $w^1_6$, $w^1_7$ and $w^1_8$. Weight matrix 202$^1_3$ is a 2×2 matrix associated with the third channel, and includes weights $w^1_9$, $w^1_{10}$, $w^1_{11}$ and $w^1_{12}$. Weight matrix 202$^1_4$ is a 2×2 matrix associated with the fourth channel, and includes weights $w^1_{13}$, $w^1_{14}$, $w^1_{15}$ and $w^1_{16}$.

Weight set 202$^2$ includes four weight matrices 202$^2_1$, 202$^2_2$, 202$^2_3$ and 202$^2_4$. Weight matrix 202$^2_1$ is a 2×2 matrix associated with the first channel, and includes weights $w^2_1$, $w^2_2$, $w^2_3$ and $w^2_4$. Weight matrix 202$^2_2$ is a 2×2 matrix associated with the second channel, and includes weights $w^2_5$, $w^2_6$, $w^2_7$ and $w^2_8$. Weight matrix 202$^2_3$ is a 2×2 matrix associated with the third channel, and includes weights $w^2_9$, $w^2_{10}$, $w^2_{11}$ and $w^2_{12}$. Weight matrix 202$^2_4$ is a 2×2 matrix associated with the fourth channel, and includes weights $w^2_{13}$, $w^2_{14}$, $w^2_{15}$ and $w^2_{16}$.

Weight set 202$^3$ includes four weight matrices 202$^3_1$, 202$^3_2$, 202$^3_3$ and 202$^3_4$. Weight matrix 202$^3_1$ is a 2×2 matrix associated with the first channel, and includes weights $w^3_1$, $w^3_2$, $w^3_3$ and $w^3_4$. Weight matrix 202$^3_2$ is a 2×2 matrix associated with the second channel, and includes weights $w^3_5$, $w^3_6$, $w^3_7$ and $w^3_8$. Weight matrix 202$^3_3$ is a 2×2 matrix associated with the third channel, and includes weights $w^3_9$, $w^3_{10}$, $w^3_{11}$ and $w^3_{12}$. Weight matrix 202$^3_4$ is a 2×2 matrix associated with the fourth channel, and includes weights $w^3_{13}$, $w^3_{14}$, $w^3_{15}$ and $w^3_{16}$.

Weight set 202$^4$ includes four weight matrices 202$^4_1$, 202$^4_2$, 202$^4_3$ and 202$^4_4$. Weight matrix 202$^4_1$ is a 2×2 matrix associated with the first channel, and includes weights $w^4_1$, $w^4_2$, $w^4_3$ and $w^4_4$. Weight matrix 202$^4_2$ is a 2×2 matrix associated with the second channel, and includes weights $w^4_5$, $w^4_6$, $w^4_7$ and $w^4_8$. Weight matrix 202$^4_3$ is a 2×2 matrix associated with the third channel, and includes weights $w^4_9$, $w^4_{10}$, $w^4_{11}$ and $w^4_{12}$. Weight matrix 202$^4_4$ is a 2×2 matrix associated with the fourth channel, and includes weights $w^4_{13}$, $w^4_{14}$, $w^4_{15}$ and $w^4_{16}$.

In this embodiment, output data matrix 206$^1$ is a 4×4 matrix associated with weight set 202$^1$ and includes activations $o^1_1$, $o^1_2$, $o^1_3$, $o^1_4$, $o^1_5$, $o^1_6$, $o^1_7$, $o^1_8$, $o^1_9$, $o^1_{10}$, $o^1_{11}$, $o^1_{12}$, $o^1_{13}$, $o^1_{14}$, $o^1_{15}$ and $o^1_{16}$. Output data matrix 206$^2$ is a 4×4 matrix associated with weight set 202$^2$ and includes activations $o^2_1$, $o^2_2$, $o^2_3$, $o^2_4$, $o^2_5$, $o^2_6$, $o^2_7$, $o^2_8$, $o^2_9$, $o^2_{10}$, $o^2_{11}$, $o^2_{12}$, $o^2_{13}$, $o^2_{14}$, $o^2_{15}$ and $o^2_{16}$. Output data matrix 206$^3$ is a 4×4 matrix associated with weight set 202$^3$ and includes activations $o^3_1$, $o^3_2$, $o^3_3$, $o^3_4$, $o^3_5$, $o^3_6$, $o^3_7$, $o^3_8$, $o^3_9$, $o^3_{10}$, $o^3_{11}$, $o^3_{12}$, $o^3_{13}$, $o^3_{14}$, $o^3_{15}$ and $o^3_{16}$. Output data matrix 206$^4$ is a 4×4 matrix associated with weight set 202$^4$ and includes activations $o^4_1$, $o^4_2$, $o^4_3$, $o^4_4$, $o^4_5$, $o^4_6$, $o^4_7$, $o^4_8$, $o^4_9$, $o^4_{10}$, $o^4_{11}$, $o^4_{12}$, $o^4_{13}$, $o^4_{14}$, $o^4_{15}$ and $o^4_{16}$.

For ease of explanation, each input data matrix 204$^1$, 204$^2$, 204$^3$ and 204$^4$ may be divided into four quadrants. The first quadrant spans the top (first) row and the second row, the second quadrant spans the second row and the third row, the third quadrant spans the third row and the fourth row, and the fourth quadrant spans the fourth row and the fifth (bottom) row. The first quadrant for input data matrix 204$^1$ ($a^1_{q1}$), the first quadrant for input data matrix 204$^2$ ($a^2_{q1}$), the first quadrant for input data matrix 204$^3$ ($a^3_{q1}$), and the first quadrant for input data matrix 204$^4$ ($a^4_{q1}$) are depicted; the remaining three quadrants for each input data matrix are not depicted for clarity.

First quadrant $a^1_{q1}$ includes elements $a^1_1$, $a^1_2$, $a^1_3$, $a^1_4$, $a^1_5$, $a^1_6$, $a^1_7$, $a^1_8$, $a^1_9$ and $a^1_{10}$, from which four blocks of elements are formed, i.e., a first block ($a^1_1$, $a^1_2$, $a^1_6$ and $a^1_7$), a second block ($a^1_2$, $a^1_3$, $a^1_7$ and $a^1_8$), a third block ($a^1_3$, $a^1_4$, $a^1_8$ and $a^1_9$), and a fourth block ($a^1_4$, $a^1_5$, $a^1_9$ and $a^1_{10}$). First quadrant $a^2_{q1}$ includes elements $a^2_1$, $a^2_2$, $a^2_3$, $a^2_4$, $a^2_5$, $a^2_6$, $a^2_7$, $a^2_8$, $a^2_9$ and $a^2_{10}$, from which four blocks of elements are formed, i.e., a first block ($a^2_1$, $a^2_2$, $a^2_6$ and $a^2_7$), a second block ($a^2_2$, $a^2_3$, $a^2_7$ and $a^2_8$), a third block ($a^2_3$, $a^2_4$, $a^2_8$ and $a^2_9$), and a fourth block ($a^2_4$, $a^2_5$, $a^2_9$ and $a^2_{10}$). First quadrant $a^3_{q1}$ includes elements $a^3_1$, $a^3_2$, $a^3_3$, $a^3_4$, $a^3_5$, $a^3_6$, $a^3_7$, $a^3_8$, $a^3_9$ and $a^3_{10}$, from which four blocks of elements are formed, i.e., a first block ($a^3_1$, $a^3_2$, $a^3_6$ and $a^3_7$), a second block ($a^3_2$, $a^3_3$, $a^3_7$ and $a^3_8$), a third block ($a^3_3$, $a^3_4$, $a^3_8$ and $a^3_9$), and a fourth block ($a^3_4$, $a^3_5$, $a^3_9$ and $a^3_{10}$). First quadrant $a^4_{q1}$ includes elements $a^4_1$, $a^4_2$, $a^4_3$, $a^4_4$, $a^4_5$, $a^4_6$, $a^4_7$, $a^4_8$, $a^4_9$ and $a^4_{10}$, from which four blocks of elements are formed, i.e., a first block ($a^4_1$, $a^4_2$, $a^4_6$ and $a^4_7$), a second block ($a^4_2$, $a^4_3$, $a^4_7$ and $a^4_8$), a third block ($a^4_3$, $a^4_4$, $a^4_8$ and $a^4_9$), and a fourth block ($a^4_4$, $a^4_5$, $a^4_9$ and $a^4_{10}$).

Second quadrant $a^1_{q2}$ includes elements $a^1_6$, $a^1_7$, $a^1_8$, $a^1_9$, $a^1_{10}$, $a^1_{11}$, $a^1_{12}$, $a^1_{13}$, $a^1_{14}$ and $a^1_{15}$, from which four blocks of elements are formed, i.e., a first block ($a^1_6$, $a^1_7$, $a^1_{11}$ and $a^1_{12}$), a second block ($a^1_7$, $a^1_8$, $a^1_{12}$ and $a^1_{13}$), a third block ($a^1_8$, $a^1_9$, $a^1_{13}$ and $a^1_{14}$), and a fourth block ($a^1_9$, $a^1_{10}$, $a^1_{14}$ and $a^1_{15}$). Second quadrant $a^2_{92}$ includes elements $a^2_6$, $a^2_7$, $a^2_8$, $a^2_9$, $a^2_{10}$, $a^2_{11}$, $a^2_{12}$, $a^2_{13}$, $a^2_{14}$ and $a^2_{15}$, from which four blocks of elements are formed, i.e., a first block ($a^2_6$, $a^2_7$, $a^2_{11}$ and $a^2_{12}$), a second block ($a^2_7$, $a^2_8$, $a^2_{12}$ and $a^2_{13}$), a third block ($a^2_8$, $a^2_9$, $a^2_{13}$ and $a^2_{14}$), and a fourth block ($a^2_9$, $a^2_{10}$, $a^2_{14}$ and $a^2_{15}$). Second quadrant $a^3_{q2}$ includes elements $a^3_6$, $a^3_7$, $a^3_8$, $a^3_9$, $a^3_{10}$, $a^3_{11}$, $a^3_{12}$, $a^3_{13}$, $a^3_{14}$ and $a^3_{15}$, from which four blocks of elements are formed, i.e., a first block ($a^3_6$, $a^3_7$, $a^3_{11}$ and $a^3_{12}$), a second block ($a^3_7$, $a^3_8$, $a^3_{12}$ and $a^3_{13}$), a third block ($a^3_8$, $a^3_9$, $a^3_{13}$ and $a^3_{14}$), and a fourth block ($a^3_9$, $a^3_{10}$, $a^3_{14}$ and $a^3_{15}$). Second quadrant $a^4_{q2}$ includes elements $a^4_6$, $a^4_7$, $a^4_8$, $a^4_9$, $a^4_{10}$, $a^4_{11}$, $a^4_{12}$, $a^4_{13}$, $a^4_{14}$ and $a^4_{15}$, from which four blocks of elements are formed, i.e., a first block ($a^4_6$, $a^4_7$, $a^4_{11}$ and $a^4_{12}$), a second block ($a^4_7$, $a^4_8$, $a^4_{12}$ and $a^4_{13}$), a third block ($a^4_8$, $a^4_9$, $a^4_{13}$ and $a^4_{14}$), and a fourth block ($a^4_9$, $a^4_{10}$, $a^4_{14}$ and $a^4_{15}$).

Third quadrant $a^1_{q3}$ includes elements $a^1_{11}$, $a^1_{12}$, $a^1_{13}$, $a^1_{14}$, $a^1_{15}$, $a^1_{16}$, $a^1_{17}$, $a^1_{18}$, $a^1_{19}$ and $a^1_{20}$, from which four blocks of elements are formed, i.e., a first block ($a^1_{11}$, $a^1_{12}$, $a^1_{16}$ and $a^1_{17}$), a second block ($a^1_{12}$, $a^1_{13}$, $a^1_{17}$ and $a^1_{18}$), a third block ($a^1_{13}$, $a^1_{14}$, $a^1_{18}$ and $a^1_{19}$), and a fourth block ($a^1_{14}$, $a^1_{15}$, $a^1_{19}$ and $a^1_{20}$). Third quadrant $a^2_{q3}$ includes elements $a^2_{11}$, $a^2_{12}$, $a^2_{13}$, $a^2_{14}$, $a^2_{15}$, $a^2_{16}$, $a^2_{17}$, $a^2_{18}$, $a^2_{19}$ and $a^2_{20}$, from which four blocks of elements are formed, i.e., a first block ($a^2_{11}$, $a^2_{12}$, $a^2_{16}$ and $a^2_{17}$), a second block ($a^2_{12}$, $a^2_{13}$, $a^2_{17}$ and $a^2_{18}$), a third block ($a^2_{13}$, $a^2_{14}$, $a^2_{18}$ and $a^2_{19}$), and a fourth block ($a^2_{14}$, $a^2_{15}$, $a^2_{19}$ and $a^2_{20}$). Third quadrant $a^3_{q3}$ includes elements $a^3_{11}$, $a^3_{12}$, $a^3_{13}$, $a^3_{14}$, $a^3_{15}$, $a^3_{16}$, $a^3_{17}$, $a^3_{18}$, $a^3_{19}$ and $a^3_{20}$, from which four blocks of elements are formed, i.e., a first block ($a^3_{11}$, $a^3_{12}$, $a^3_{16}$ and $a^3_{17}$), a second block ($a^3_{12}$, $a^3_{13}$, $a^3_{17}$ and $a^3_{18}$), a third block ($a^3_{13}$, $a^3_{14}$, $a^3_{18}$ and $a^3_{19}$), and a fourth block ($a^3_{14}$, $a^3_{15}$, $a^3_{19}$ and $a^3_{20}$). Third quadrant $a^4_{q3}$ includes elements $a^4_{11}$, $a^4_{12}$, $a^4_{13}$, $a^4_{14}$, $a^4_{15}$, $a^4_{16}$, $a^4_{17}$, $a^4_{18}$, $a^4_{19}$ and $a^4_{20}$, from which four blocks of elements are formed, i.e., a first block ($a^4_{11}$, $a^4_{12}$, $a^4_{16}$ and $a^4_{17}$), a second block ($a^4_{12}$, $a^4_{13}$, $a^4_{17}$ and $a^4_{18}$), a third block ($a^4_{13}$, $a^4_{14}$, $a^4_{18}$ and $a^4_{19}$), and a fourth block ($a^4_{14}$, $a^4_{15}$, $a^4_{19}$ and $a^4_{20}$).

Fourth quadrant $a^1_{q4}$ includes elements $a^1_{16}$, $a^1_{17}$, $a^1_{18}$, $a^1_{19}$, $a^1_{20}$, $a^1_{21}$, $a^1_{22}$, $a^1_{23}$, $a^1_{24}$ and $a^1_{25}$, from which four blocks of elements are formed, i.e., a first block ($a^1_{16}$, $a^1_{17}$, $a^1_{21}$ and $a^1_{22}$), a second block ($a^1_{17}$, $a^1_{18}$, $a^1_{22}$ and $a^1_{23}$), a third block ($a^1_{18}$, $a^1_{19}$, $a^1_{23}$ and $a^1_{24}$), and a fourth block ($a^1_{19}$, $a^1_{20}$, $a^1_{24}$ and $a^1_{25}$). Fourth quadrant $a^2_{q4}$ includes elements $a^2_{16}$, $a^2_{17}$, $a^2_{18}$, $a^2_{19}$, $a^2_{20}$, $a^2_{21}$, $a^2_{22}$, $a^2_{23}$, $a^2_{24}$ and $a^2_{25}$, from which four blocks of elements are formed, i.e., a first block ($a^2_{16}$, $a^2_{17}$, $a^2_{21}$ and $a^2_{22}$), a second block ($a^2_{17}$, $a^2_{18}$, $a^2_{22}$ and $a^2_{23}$), a third block ($a^2_{18}$, $a^2_{19}$, $a^2_{23}$ and $a^2_{24}$), and a fourth block ($a^2_{19}$, $a^2_{20}$, $a^2_{24}$ and $a^2_{25}$). Fourth quadrant $a^3_{q4}$ includes elements $a^3_{16}$, $a^3_{17}$, $a^3_{18}$, $a^3_{19}$, $a^3_{20}$, $a^3_{21}$, $a^3_{22}$, $a^3_{23}$, $a^3_{24}$ and $a^3_{25}$, from which four blocks of elements are formed, i.e., a first block ($a^3_{16}$, $a^3_{17}$, $a^3_{21}$ and $a^3_{22}$), a second block ($a^3_{17}$, $a^3_{18}$, $a^3_{22}$ and $a^3_{23}$), a third block ($a^3_{18}$, $a^3_{19}$, $a^3_{23}$ and $a^3_{24}$), and a fourth block ($a^3_{19}$, $a^3_{20}$, $a^3_{24}$ and $a^3_{25}$). Fourth quadrant $a^4_{q4}$ includes elements $a^4_{16}$, $a^4_{17}$, $a^4_{18}$, $a^4_{19}$, $a^4_{20}$, $a^4_{21}$, $a^4_{22}$, $a^4_{23}$, $a^4_{24}$ and $a^4_{25}$, from which four blocks of elements are formed, i.e., a first block ($a^4_{16}$, $a^4_{17}$, $a^4_{21}$ and $a^4_{22}$), a second block ($a^4_{17}$, $a^4_{18}$, $a^4_{22}$ and $a^4_{23}$), a third block ($a^4_{18}$, $a^4_{19}$, $a^4_{23}$ and $a^4_{24}$), and a fourth block ($a^4_{19}$, $a^4_{20}$, $a^4_{24}$ and $a^4_{25}$).

Output feature maps 206 may also be divided into four quadrants; in this case, each quadrant spans all four output data matrices 206$^1$, 206$^2$, 206$^3$ and 206$^4$. The first quadrant spans the top (first) row of each output data matrix, the second quadrant spans the second row of each output data matrix, the third quadrant spans the third row of each output data matrix, and the fourth quadrant spans the fourth (bottom) row of each output data matrix. The first quadrant for output feature maps 206 ($o_{q1}$), is depicted; the remaining three quadrants are not depicted for clarity.

First quadrant $o_{q1}$ includes $o^1_1$, $o^1_2$, $o^1_3$, $o^1_4$, $o^2_1$, $O^2_2$, $o^2_3$, $o^2_4$, $o^3_1$, $o^3_2$, $o^3_3$, $o^3_4$, $o^4_1$, $o^4_2$, $o^4_3$ and $o^4_4$. Second quadrant $o_{q2}$ includes $o^{15}$, $o^1_6$, $o^1_7$, $o^1_8$, $o^2_5$, $o^2_6$, $o^2_7$, $o^2_8$, $o^3_5$, $o^3_6$, $o^3_7$, $o^3_8$, $o^4_5$, $o^4_6$, $o^4_7$ and $o^4_8$. Third quadrant $o_{g3}$ includes 019, $o^1_{10}$, $o^1_{11}$, $o^1_{12}$, $o^2_9$, $o^2_{10}$, $o^2_{11}$, $o^2_{12}$, $o^3_9$, $o^3_{10}$, $o^3_{11}$, $o^3_{12}$, $o^4_9$, $o^4_{10}$, $o^4_{11}$ and $o^4_{12}$. Fourth quadrant $o_{q4}$ includes $o^1_{13}$, $o^1_{14}$, $o^1_{15}$, $o^1_{16}$, $o^2_{13}$, $o^2_{14}$, $o^2_{15}$, $o^2_{16}$, $o^3_{13}$, $o^3_{14}$, $o^3_{15}$, $o^3_{16}$, $o^4_{13}$, $o^4_{14}$, $o^4_{15}$ and $o^4_{16}$.

Generally, each output element within output data matrices 206$^1$, 206$^2$, 206$^3$ and 206$^4$ is the sum of the dot products of one of the weight sets 202$^1$, 202$^2$, 202$^3$ and 202$^4$ and a block of activation elements within a particular quadrant of input data matrices 204$^1$, 204$^2$, 204$^3$ and 204$^4$.

The calculation of the output elements in quadrant $o_{q1}$ follows.

Output element $o^1_1$ of output data matrix 206$^1$ is the sum of the dot products of weight set 202$^1$ and the first block of activation elements within first quadrants $a^1_{q1}$, $a^2_{q1}$, $a^3_{q1}$ and $a^4_{q1}$ of input data matrices 204$^1$, 204$^2$, 204$^3$ and 204$^4$, respectively. The first block of activation elements within first quadrants $a^1_{q1}$, $a^2_{q1}$, $a^3_{q1}$ and $a^4_{q1}$ includes $a^1_1$, $a^1_2$, $a^1_6$ and $a^1_7$; $a^2_1$, $a^2_2$, $a^2_6$ and $a^2_7$; $a^3_1$, $a^3_2$, $a^3_6$ and $a^3_7$; and $a^4_1$, $a^4_2$, $a^4_6$ and $a^4_7$, respectively.

More particularly, the following dot products are summed to generate output element $o^1_1$: the dot product of the first weight matrix of weight set 202$^1$ and the first block of quadrant $a^1_{q1}$ (i.e., $w^1_1 \cdot a^1_1 + w^1_2 \cdot a^1_2 + w^1_3 \cdot a^1_6 + w^1_4 \cdot a^1_7$), the dot product of the second weight matrix of weight set 202$^1$ and the first block of quadrant $a^2_{q1}$ (i.e., $w^1_5 \cdot a^2_1 + w^1_6 \cdot a^2_2 + w^1_7 \cdot a^2_6 + w^1_8 \cdot a^2_7$), the dot product of the third weight matrix of weight set 202$^1$ and the first block of quadrant $a^3_{q1}$ (i.e., $w^1_9 \cdot a^3_1 + w^1_{10} \cdot a^3_2 + w^1_{11} \cdot a^3_6 + w^1_{12} \cdot a^3_7$), and the dot product of the fourth weight matrix of weight set 202$^1$ and the first block of quadrant $a^4_{q1}$ (i.e., $w^1_{13} \cdot a^4_1 + w^1_{14} \cdot a^4_2 + w^1_{15} \cdot a^4_6 + w^1_{16} \cdot a^4_7$).

Similarly, output element $o^2_1$ of output data matrix 206$^2$ is the sum of the dot products of weight set 202$^2$ and the first block of activation elements within first quadrants $a^1_{q1}$, $a^2_{q1}$, $a^3_{q1}$ and $a^4_{q1}$ of input data matrices 204$^1$, 204$^2$, 204$^3$ and 204$^4$ respectively. Output element $o^3_1$ of output data matrix 206$^3$ is the sum of the dot products of weight set 202$^3$ and the first block of activation elements within first quadrants $a^1_{q1}$, $a^2_{q1}$, $a^3_{q1}$ and $a^4_{q1}$ of input data matrices 204$^1$, 204$^2$, 204$^3$ and 204$^4$ respectively. And, output element $o^4_1$ of output data matrix 206$^4$ is the sum of the dot products of weight set 202$^4$ and the first block of activation elements within first quadrants $a^1_{q1}$, $a^2_{q1}$, $a^3_{q1}$ and $a^4_{q1}$ of input data matrices 204$^1$, 204$^2$, 204$^3$ and 204$^4$ respectively.

Output element $o^1_2$ of output data matrix 206$^1$ is the sum of the dot products of weight set 202$^1$ and the second block of activation elements within the first quadrants $a^1_{q1}$, $a^2_{q1}$, $a^3_{q1}$ and $a^4_{q1}$ of input data matrices 204$^1$, 204$^2$, 204$^3$ and 204$^4$, respectively. The second block of activation elements within the first quadrants $a^1_{q1}$, $a^2_{q1}$, $a^3_{q1}$ and $a^4_{q1}$ includes $a^1_2$, $a^1_3$, $a^1_7$ and $a^1_8$; $a^2_2$, $a^2_3$, $a^2_7$ and $a^2_8$; $a^3_2$, $a^3_3$, $a^3_7$ and $a^3_8$; and $a^4_2$, $a^4_3$, $a^4_7$ and $a^4_8$, respectively.

More particularly, the following dot products are summed to generate output element $o^1_2$: the dot product of the first weight matrix of weight set 202$^1$ and the second block of quadrant $a^1_{q1}$ (i.e., $w^1_1 \cdot a^1_2 + w^1_2 \cdot a^1_3 + w^1_3 \cdot a^1_7 + w^1_4 \cdot a^1_8$), the dot product of the second weight matrix of weight set 202$^1$ and the second block of quadrant $a^2_{q1}$ (i.e., $w^1_5 \cdot a^2_2 + w^1_6 \cdot a^2_3 + w^1_7 \cdot a^2_7 + w^1_8 \cdot a^2_8$), the dot product of the third weight matrix of weight set 202$^1$ and the second block of quadrant $a^3_{q1}$ (i.e., $w^1_9 \cdot a^3_2 + w^1_{10} \cdot a^3_3 + w^1_{11} \cdot a^3_7 + w^1_{12} \cdot a^3_8$), and the dot product of the fourth weight matrix of weight set 202$^1$ and the second block of quadrant $a^4_{q1}$ (i.e., $w^1_{13} \cdot a^4_2 + w^1_{14} \cdot a^4_3 + w^1_{15} \cdot a^4_7 + w^1_{16} \cdot a^4_8$).

Similarly, output element $o^2_2$ of output data matrix 206$^2$ is the sum of the dot products of weight set 202$^2$ and the second block of activation elements within first quadrants $a^1_{q1}$, $a^2_{q1}$, $a^3_{q1}$ and $a^4_{q1}$ of input data matrices 204$^1$, 204$^2$, 204$^3$ and 204$^4$ respectively. Output element $o^3_2$ of output data matrix 206$^3$ is the sum of the dot products of weight set 202$^3$ and the second block of activation elements within first quadrants $a^1_{q1}$, $a^2_{q1}$, $a^3_{q1}$ and $a^4_{q1}$ of input data matrices 204$^1$, 204$^2$, 204$^3$ and 204$^4$ respectively. And, output element $o^4_2$ of output data matrix 206$^4$ is the sum of the dot products of weight set 202$^4$ and the second block of activation elements within the quadrants $a^1_{q1}$, $a^2_{q1}$, $a^3_{q1}$ and $a^4_{q1}$ of input data matrices 204$^1$, 204$^2$, 204$^3$ and 204$^4$ respectively.

And so on for output elements $o^1_3$ and $o^1_4$, $o^2_3$ and $o^2_4$, $o^3_3$ and $o^3_4$, and $o^4_3$ and $o^4_4$ of the first rows of output data matrices 206$^1$, 206$^2$, 206$^3$ and 206$^4$.

With respect to quadrant $o^9_2$, output element $o^1_5$ of output data matrix 206$^1$ is the sum of the dot products of weight set 202$^1$ and the first block of activation elements within second quadrants $a^1_{q2}$, $a^2_{q2}$, $a^3_{q2}$ and $a^4_{q2}$ of input data matrices 204$^1$, 204$^2$, 204$^3$ and 204$^4$, respectively. Output element $o^2_5$ of output data matrix 206$^2$ is the sum of the dot products of weight set 202$^2$ and the first block of activation elements within second quadrants $a^1_{q2}$, $a^2_{q2}$, $a^3_{q2}$ and $a^4_{q2}$ of input data matrices 204$^1$, 204$^2$, 204$^3$ and 204$^4$, respectively. Output element $o^3_5$ of output data matrix 206$^3$ is the sum of the dot products of weight set 202$^3$ and the first block of activation elements within second quadrants $a^1_{q2}$, $a^2_{q2}$, $a^3_{q2}$ and $a^4_{q2}$ of input data matrices 204$^1$, 204$^2$, 204$^3$ and 204$^4$ respectively. And, output element $o^4_5$ of output data matrix 206$^4$ is the sum of the dot products of weight set 202$^4$ and the first block of activation elements within second quadrants $a^1_{q2}$, $a^2_{q2}$, $a^3_{q2}$ and $a^4_{q2}$ of input data matrices 204$^1$, 204$^2$, 204$^3$ and 204$^4$ respectively. And so on for output elements $o^1_6$, $o^1_7$ and $o^1_8$, $o^2_6$, $o^2_7$ and $o^2_8$, $o^3_6$, $o^3_7$ and $o^3_8$, and $o^4_6$, $o^4_7$ and $o^4_8$ of the second rows of output data matrices 206$^1$, 206$^2$, 206$^3$ and 206$^4$.

With respect to quadrant $o^9_3$, output element $o^1_9$ of output data matrix 206$^1$ is the sum of the dot products of weight set 202$^1$ and the first block of activation elements within third quadrants $a^1_{q3}$, $a^2_{q3}$, $a^3_{q3}$ and $a^4_{q3}$ of input data matrices 204$^1$, 204$^2$, 204$^3$ and 204$^4$, respectively. Output element $o^2_9$ of output data matrix 206$^2$ is the sum of the dot products of weight set 202$^2$ and the first block of activation elements within third quadrants $a^1_{q3}$, $a^2_{q3}$, $a^3_{q3}$ and $a^4_{q3}$ of input data matrices 204$^1$, 204$^2$, 204$^3$ and 204$^4$, respectively. Output element $o^3_9$ of output data matrix 206$^3$ is the sum of the dot products of weight set 202$^3$ and the first block of activation elements within third quadrants $a^1_{q3}$, $a^2_{q3}$, $a^3_{q3}$ and $a^4_{q3}$ of input data matrices 204$^1$, 204$^2$, 204$^3$ and 204$^4$, respectively. And, output element $o^4_9$ of output data matrix 206$^4$ is the sum of the dot products of weight set 202$^4$ and the first block of activation elements within third quadrants $a^1_{q3}$, $a^2_{q3}$, $a^3_{q3}$ and $a^4_{q3}$ of input data matrices 204$^1$, 204$^2$, 204$^3$ and 204$^4$, respectively. And so on for output elements $o^1_{10}$, $o^1_{11}$ and $o^1_{12}$, $o^2_{10}$, $o^2_{11}$ and $o^2_{12}$, $o^3_{10}$, $o^3_{11}$ and $o^3_{12}$, and $o^4_{10}$, $o^4_{11}$ and $o^4_{12}$ of the third rows of output data matrices 206$^1$, 206$^2$, 206$^3$ and 206$^4$.

With respect to quadrant $o^9_4$, output element $o^1_{13}$ of output data matrix 206$^1$ is the sum of the dot products of weight set 202$^1$ and the first block of activation elements within fourth quadrants $a^1_{q4}$, $a^2_{q4}$, $a^3_{q4}$ and $a^4_{q4}$ of input data matrices 204$^1$, 204$^2$, 204$^3$ and 204$^4$, respectively. Output element $o^2_{13}$ of output data matrix 206$^2$ is the sum of the dot products of weight set 202$^2$ and the first block of activation elements within fourth quadrants $a^1_{q4}$, $a^2_{q4}$, $a^3_{q4}$ and $a^4_{q4}$ of input data matrices 204$^1$, 204$^2$, 204$^3$ and 204$^4$, respectively. Output element $o^3_{13}$ of output data matrix 206$^3$ is the sum of the dot products of weight set 202$^3$ and the first block of activation elements within fourth quadrants $a^1_{q4}$, $a^2_{q4}$, $a^3_{q4}$ and $a^4_{q4}$ of input data matrices 204$^1$, 204$^2$, 204$^3$ and 204$^4$ respectively. And, output element $o^4_{13}$ of output data matrix 206$^4$ is the sum of the dot products of weight set 202$^4$ and the first block of activation elements within third quadrants $a^1_{q4}$, $a^2_{q4}$, $a^3_{q4}$ and $a^4_{q4}$ of input data matrices 204$^1$, 204$^2$, 204$^3$ and 204$^4$, respectively. And so on for output elements $o^1_{14}$, $o^1_{15}$ and $o^1_{16}$, $o^2_{14}$, $o^2_{15}$ and $o^2_{16}$, $o^3_{14}$, $o^3_{15}$ and $o^3_{16}$, and $o^4_{14}$, $o^4_{15}$ and $o^4_{16}$ of the fourth rows of output data matrices 206$^1$, 206$^2$, 206$^3$ and 206$^4$.

Figure 3B:
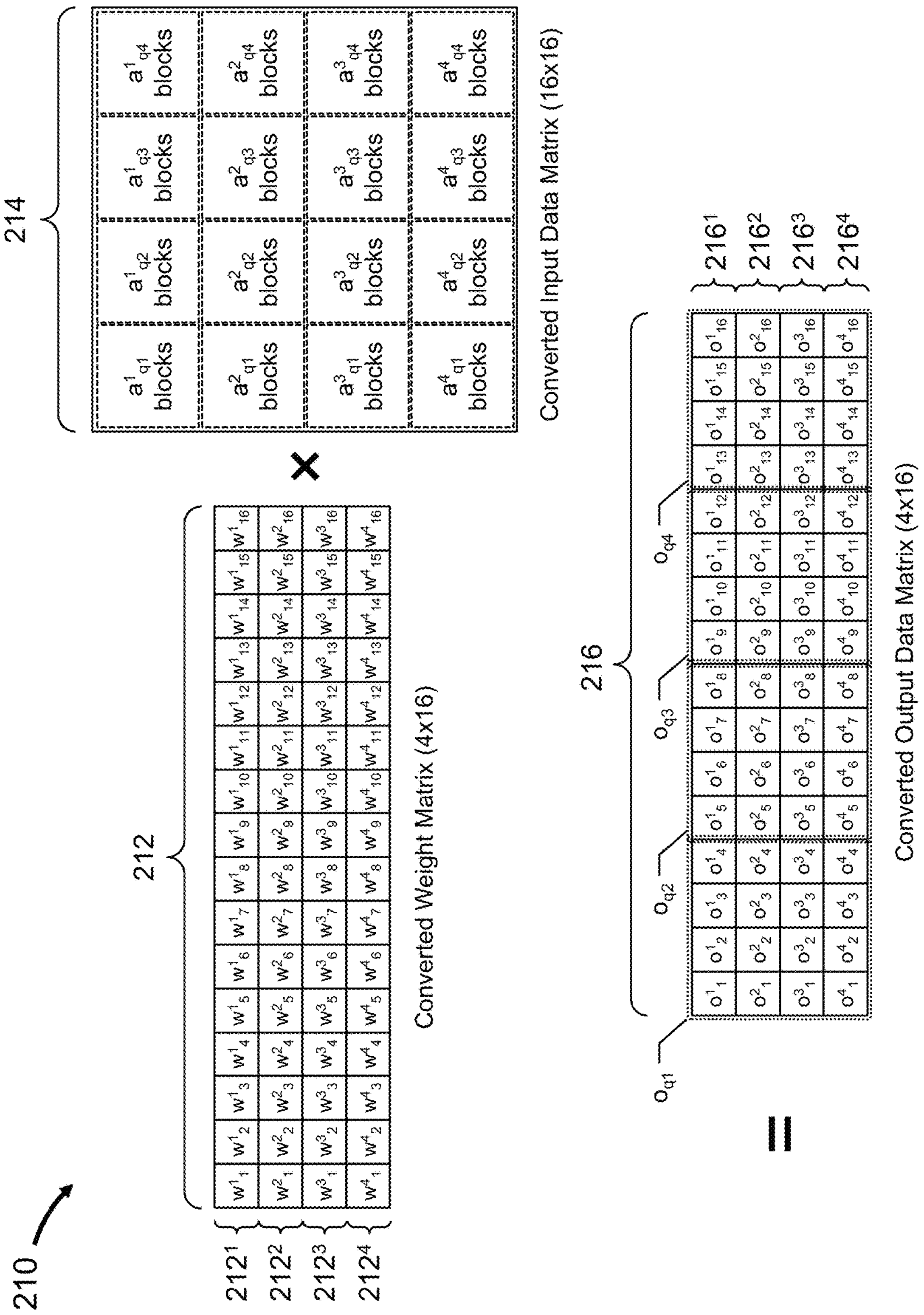
FIG. 3B depicts a converted convolutional layer calculation for a CNN.
Figure 3C:
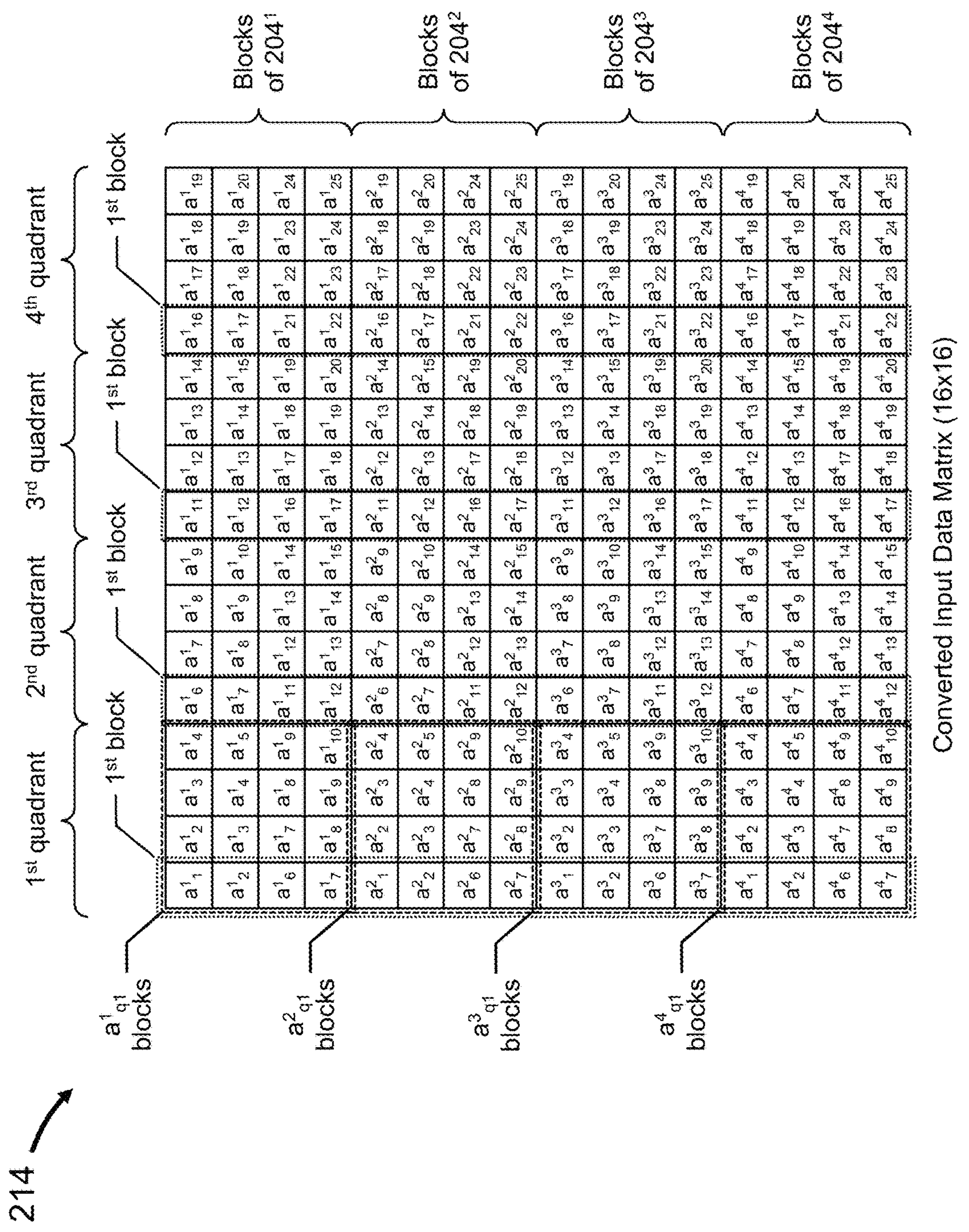
FIG. 3C depicts a converted input data matrix, in accordance with an embodiment of the present disclosure.

FIG. 3B depicts converted convolutional layer calculation 210 for a CNN, while FIG. 3C depicts converted input data matrix 214, in accordance with an embodiment of the present disclosure.

In one embodiment, the convolutional layer calculations for CNNs may be converted into generic matrix multiplication (GEMM) operations for processing by one or more MMAs. Convolution layer calculation 200 is converted into a GEMM operation by converting filters 202 into converted weight matrix 212, converting input feature maps 204 into converted input data matrix 214, and then multiplying converted weight matrix 212 and converted input data matrix 214 to generate converted output data matrix 216. Because simple matrix multiplication is performed rather than a convolution operation, each output element within converted output data matrix 216 is the dot product of one row of converted weight matrix 212 and one column of converted input data matrix 214. Converted output data matrix 216 is then reformed into output feature maps 206.

Converted weight matrix 212 is a 4×16 matrix, and includes converted weight sets 212$^{1}$, 212$^{2}$, 212$^{3}$ and 212$^{4}$. Weight set 202$^{1}$ is flattened to form converted weight set 212$^{1}$, i.e., the first row, and includes weights $w^{1}_{1}$, $w^{1}_{2}$, $w^{1}_{3}$, $w^{1}_{4}$, $w^{1}_{5}$, $w^{1}_{6}$, $w^{1}_{7}$, $w^{1}_{8}$, $w^{1}_{9}$, $w^{1}_{10}$, $w^{1}_{11}$, $w^{1}_{12}$, $w^{1}_{13}$, $w^{1}_{14}$, $w^{1}_{15}$ and $w^{1}_{16}$. Weight set 202$^{2}$ is flattened to form converted weight set 212$^{2}$, i.e., the second row, and includes weights $w^{2}_{1}$, $w^{2}_{2}$, $w^{2}_{3}$, $w^{2}_{4}$, $w^{2}_{5}$, $w^{2}_{6}$, $w^{2}_{7}$, $w^{2}_{8}$, $w^{2}_{9}$, $w^{2}_{10}$, $w^{2}_{11}$, $w^{2}_{12}$, $w^{2}_{13}$, $w^{2}_{14}$, $w^{2}_{15}$ and $w^{2}_{16}$. Weight set 202$^{3}$ is flattened to form converted weight set 212$^{3}$, i.e., the third row, and includes weights $w^{3}_{1}$, $w^{3}_{2}$, $w^{3}_{3}$, $w^{3}_{4}$, $w^{3}_{5}$, $w^{3}_{6}$, $w^{3}_{7}$, $w^{3}_{8}$, $w^{3}_{9}$, $w^{3}_{10}$, $w^{3}_{11}$, $w^{3}_{12}$, $w^{3}_{13}$, $w^{3}_{14}$, $w^{3}_{15}$ and $w^{3}_{16}$. And, weight set 202$^{4}$ is flattened to form converted weight set 212$^{4}$, i.e., the fourth row, and includes weights $w^{4}_{1}$, $w^{4}_{2}$, $w^{4}_{3}$, $w^{4}_{4}$, $w^{4}_{5}$, $w^{4}_{6}$, $w^{4}_{7}$, $w^{4}_{8}$, $w^{4}_{9}$, $w^{4}_{10}$, $w^{4}_{11}$, $w^{4}_{12}$, $w^{4}_{13}$, $w^{4}_{14}$, $w^{4}_{15}$ and $w^{4}_{16}$.

Converted input data matrix 214 is a 16×16 matrix, and includes the blocks of each quadrant of input data matrices 204$^{1}$, 204$^{2}$, 204$^{3}$ and 204$^{4}$, i.e., quadrants $a^{1}_{q1}$, $a^{1}_{q2}$, $a^{1}_{q3}$, $a^{1}_{q4}$, $a^{2}_{q1}$, $a^{2}_{q2}$, $a^{2}_{q3}$, $a^{2}_{q4}$, $a^{3}_{q1}$, $a^{3}_{q2}$, $a^{3}_{q3}$, $a^{3}_{q4}$, $a^{4}_{q1}$, $a^{4}_{q2}$, $a^{4}_{q3}$ and $a^{4}_{q4}$, respectively. Generally, each block is flattened to form a portion of a single column of converted input data matrix 214.

More particularly, the first column of converted input matrix 214 includes the first blocks from quadrants $a^{1}_{q1}$, $a^{2}_{q1}$, $a^{3}_{q1}$ and $a^{4}_{q1}$, i.e., activations $a^{1}_{1}$, $a^{1}_{2}$, $a^{1}_{6}$, $a^{1}_{7}$, $a^{2}_{1}$, $a^{2}_{2}$, $a^{2}_{6}$, $a^{2}_{7}$, $a^{3}_{1}$, $a^{3}_{2}$, $a^{3}_{6}$, $a^{3}_{7}$, $a^{4}_{1}$, $a^{4}_{2}$, $a^{4}_{6}$, and $a^{4}_{7}$. The second column of converted input matrix 214 includes the second blocks from quadrants $a^{1}_{q1}$, $a^{2}_{q1}$, $a^{3}_{q1}$ and $a^{4}_{q1}$, i.e., activations $a^{1}_{2}$, $a^{1}_{3}$, $a^{1}_{7}$, $a^{1}_{8}$, $a^{2}_{2}$, $a^{2}_{3}$, $a^{2}_{7}$, $a^{2}_{8}$, $a^{3}_{2}$, $a^{3}_{3}$, $a^{3}_{7}$, $a^{3}_{8}$, $a^{4}_{2}$, $a^{4}_{3}$, $a^{4}_{7}$, and $a^{4}_{8}$. The third column of converted input matrix 214 includes the third blocks from quadrants $a^{1}_{q1}$, $a^{2}_{q1}$, $a^{3}_{q1}$ and $a^{4}_{q1}$, i.e., activations $a^{1}_{3}$, $a^{1}_{4}$, $a^{1}_{8}$, $a^{1}_{9}$, $a^{2}_{3}$, $a^{2}_{4}$, $a^{2}_{8}$, $a^{2}_{9}$, $a^{3}_{3}$, $a^{3}_{4}$, $a^{3}_{8}$, $a^{3}_{9}$, $a^{4}_{3}$, $a^{4}_{4}$, $a^{4}_{8}$, and $a^{4}_{9}$. And, the fourth column of converted input matrix 214 includes the fourth blocks from quadrants $a^{1}_{q1}$, $a^{2}_{q1}$, $a^{3}_{q1}$ and $a^{4}_{q1}$, i.e., activations $a^{1}_{4}$, $a^{1}_{5}$, $a^{1}_{9}$, $a^{1}_{10}$, $a^{2}_{4}$, $a^{2}_{5}$, $a^{2}_{9}$, $a^{2}_{10}$, $a^{3}_{4}$, $a^{3}_{5}$, $a^{3}_{9}$, $a^{3}_{10}$, $a^{4}_{4}$, $a^{4}_{5}$, $a^{4}_{9}$, and $a^{4}_{10}$.

The remaining columns of converted input data matrix 214 are formed in a similar manner. The fifth to the eighth columns are formed from the blocks of quadrants $a^{1}_{92}$, $a^{2}_{q2}$, $a^{3}_{q2}$ and $a^{4}_{q2}$, the ninth to the twelfth columns are formed from the blocks of quadrants $a^{1}_{q3}$, $a^{2}_{q3}$, $a^{3}_{q3}$ and $a^{4}_{q3}$, and the thirteenth to the sixteenth columns are formed from the blocks of quadrants $a^{1}_{q4}$, $a^{2}_{q4}$, $a^{3}_{q4}$ and $a^{4}_{q4}$.

Converted output data matrix 216 is a 4×16 matrix, and includes flattened versions of output data matrices 206$^{1}$, 206$^{2}$, 206$^{3}$ and 206$^{4}$, i.e., converted output data matrices 216$^{1}$, 216$^{2}$, 216$^{3}$ and 216$^{4}$. Converted output data matrix 216 may also be arranged into four quadrants $o_{q1}$, $o_{q2}$, $o_{q3}$ and $o_{q4}$, which include the same output elements as the four quadrants $o_{q1}$, $o_{q2}$, $o_{q3}$ and $o_{q4}$ of output feature maps 206.

The calculation of the output elements in the first row of quadrant $o_{q1}$ of converted output data matrix 216 follows.

Output element $o^{1}_{1}$ is the dot product of the first row of converted weight matrix 212, i.e., converted weight set 212$^{1}$, and the first column of converted input data matrix 214. More particularly, output element $o^{1}_{1}$ is equal to $w^{1}_{1}\cdot a^{1}_{1}+w^{1}_{2}\cdot a^{1}_{2}+w^{1}_{3}\cdot a^{1}_{6}+w^{1}_{4}\cdot a^{1}_{7}+w^{1}_{5}\cdot a^{2}_{1}+w^{1}_{6}\cdot a^{2}_{2}+w^{1}_{7}\cdot a^{2}_{6}+w^{1}_{8}\cdot a^{2}_{7}+w^{1}_{9}\cdot a^{3}_{1}+w^{1}_{10}\cdot a^{3}_{2}+w^{1}_{11}\cdot a^{3}_{6}+w^{1}_{12}\cdot a^{3}_{7}+w^{1}_{13}\cdot a^{4}_{1}+w^{1}_{14}\cdot a^{4}_{2}+w^{1}_{15}\cdot a^{4}_{6}+w^{1}_{6}\cdot a^{4}_{7}$. As shown above, output element $o^{1}_{1}$ of converted output data matrix 216 is equal to output element $o^{1}_{1}$ of output feature maps 206.

Output element $o^{1}_{2}$ is the dot product of the first row of converted weight matrix 212, i.e., converted weight set 212$^{1}$, and the second column of converted input data matrix 214. More particularly, output element $o^{1}_{2}$ is equal to $w^{1}_{1}\cdot a^{1}_{2}+w^{1}_{2}\cdot a^{1}_{3}+w^{1}_{3}\cdot a^{1}_{7}+w^{1}_{4}\cdot a^{1}_{8}+w^{1}_{5}\cdot a^{2}_{2}+w^{1}_{6}\cdot a^{2}_{3}+w^{1}_{7}\cdot a^{2}_{7}+w^{1}_{8}\cdot a^{2}_{8}+w^{1}_{9}\cdot a^{3}_{2}+w^{1}_{10}\cdot a^{3}_{3}+w^{1}_{11\cdot a}{}^{3}_{7}+w^{1}_{12}\cdot a^{3}_{8}+w^{1}_{13}\cdot a^{4}_{2}+w^{1}_{14}\cdot a^{4}_{3}+w^{1}_{15}\cdot a^{4}_{7}+w^{1}_{16}\cdot a^{4}_{8}$. As shown above, output element $o^{1}_{2}$ of converted output data matrix 216 is equal to output element $o^{1}_{2}$ of output feature maps 206.

Output element $o^{1}_{3}$ is the dot product of the first row of converted weight matrix 212, i.e., converted weight set 212$^{1}$, and the third column of converted input data matrix 214. More particularly, output element $o^{1}_{3}$ is equal to $w^{1}_{1}\cdot a^{1}_{3}+w^{1}_{2}\cdot a^{1}_{4}+w^{1}_{3}\cdot a^{1}_{8}+w^{1}_{4}\cdot a^{1}_{9}+w^{1}_{5}\cdot a^{2}_{3}+w^{1}_{6}\cdot a^{2}_{4}+w^{1}_{7}\cdot a^{2}_{8}+w^{1}_{8}\cdot a^{2}_{9}+w^{1}_{9}\cdot a^{3}_{3}+w^{1}_{10}\cdot a^{3}_{4}+w^{1}_{11}\cdot a^{3}_{8}+w^{1}_{12}\cdot a^{3}_{9}+w^{1}_{13}\cdot a^{4}_{3}+w^{1}_{14}\cdot a^{4}_{4}+w^{1}_{15}\cdot a^{4}_{8}+w^{1}_{16}\cdot a^{4}_{9}$. As shown above, output element $o^{1}_{3}$ of converted output data matrix 216 is equal to output element $o^{1}_{3}$ of output feature maps 206.

Output element $o^{1}_{4}$ is the dot product of the first row of converted weight matrix 212, i.e., converted weight set 212$^{1}$, and the fourth column of converted input data matrix 214. More particularly, output element $o^{1}_{4}$ is equal to $w^{1}_{1}\cdot a^{1}_{4}+w^{1}_{2}\cdot a^{1}_{5}+w^{1}_{3}\cdot a^{1}_{9}+w^{1}_{4}\cdot a^{1}_{10}+w^{1}_{5}\cdot a^{2}_{4}+w^{1}_{6}\cdot a^{2}_{5}+w^{1}_{7}\cdot a^{2}_{9}+w^{1}_{8}\cdot a^{2}_{10}+w^{1}_{9}\cdot a^{3}_{4}+w^{1}_{10}\cdot a^{3}_{5}+w^{1}_{11}\cdot a^{3}_{9}+w^{1}_{12}\cdot a^{3}_{10}+w^{1}_{13}\cdot a^{4}_{4}+w^{1}_{14}\cdot a^{4}_{5}+w^{1}_{15}\cdot a^{4}_{9}+w^{1}_{16}\cdot a^{4}_{10}$. As shown above, output element $o^{1}_{4}$ of converted output data matrix 216 is equal to output element $o^{1}_{4}$ of output feature maps 206.

For the second row of quadrant $o_{q1}$, output element $o^{2}_{1}$ is the dot product of the second row of converted weight matrix 212, i.e., converted weight set 212$^{2}$, and the first column of converted input data matrix 214, output element $o^{22}$ is the dot product of the second row of converted weight matrix 212, i.e., converted weight set 212$^{2}$, and the second column of converted input data matrix 214, output element $o^{2}_{3}$ is the dot product of the second row of converted weight matrix 212, i.e., converted weight set 212$^{2}$, and the third column of converted input data matrix 214, and output element $o^{2}_{4}$ is the dot product of the second row of converted weight matrix 212, i.e., converted weight set 212$^{2}$, and the fourth column of converted input data matrix 214.

For the third row of quadrant $o_{q1}$, output element $o^{3}_{1}$ is the dot product of the third row of converted weight matrix 212, i.e., converted weight set 212$^{3}$, and the first column of converted input data matrix 214, output element $o^{3}_{2}$ is the dot product of the third row of converted weight matrix 212, i.e., converted weight set 212$^{3}$, and the second column of converted input data matrix 214, output element $o^{3}_{3}$ is the dot product of the third row of converted weight matrix 212, i.e., converted weight set 212$^{3}$, and the third column of converted input data matrix 214, and output element $o^{3}_{4}$ is the dot product of the third row of converted weight matrix 212, i.e., converted weight set 212$^{3}$, and the fourth column of converted input data matrix 214.

For the fourth row of quadrant $o_{q1}$, output element $o^{4}_{1}$ is the dot product of the fourth row of converted weight matrix 212, i.e., converted weight set 212$^{4}$, and the first column of converted input data matrix 214, output element $o^{4}_{2}$ is the dot product of the fourth row of converted weight matrix 212, i.e., converted weight set 212$^{4}$, and the second column of converted input data matrix 214, output element $o^{4}_{3}$ is the dot product of the fourth row of converted weight matrix 212, i.e., converted weight set 212$^{4}$, and the third column of converted input data matrix 214, and output element $o^{4}_{4}$ is the dot product of the fourth row of converted weight matrix 212, i.e., converted weight set 212$^{4}$, and the fourth column of converted input data matrix 214.

The elements of the quadrants $o_{q2}$, $o_{q3}$ and $o_{q4}$ are calculated in a similar manner.

Figure 4:
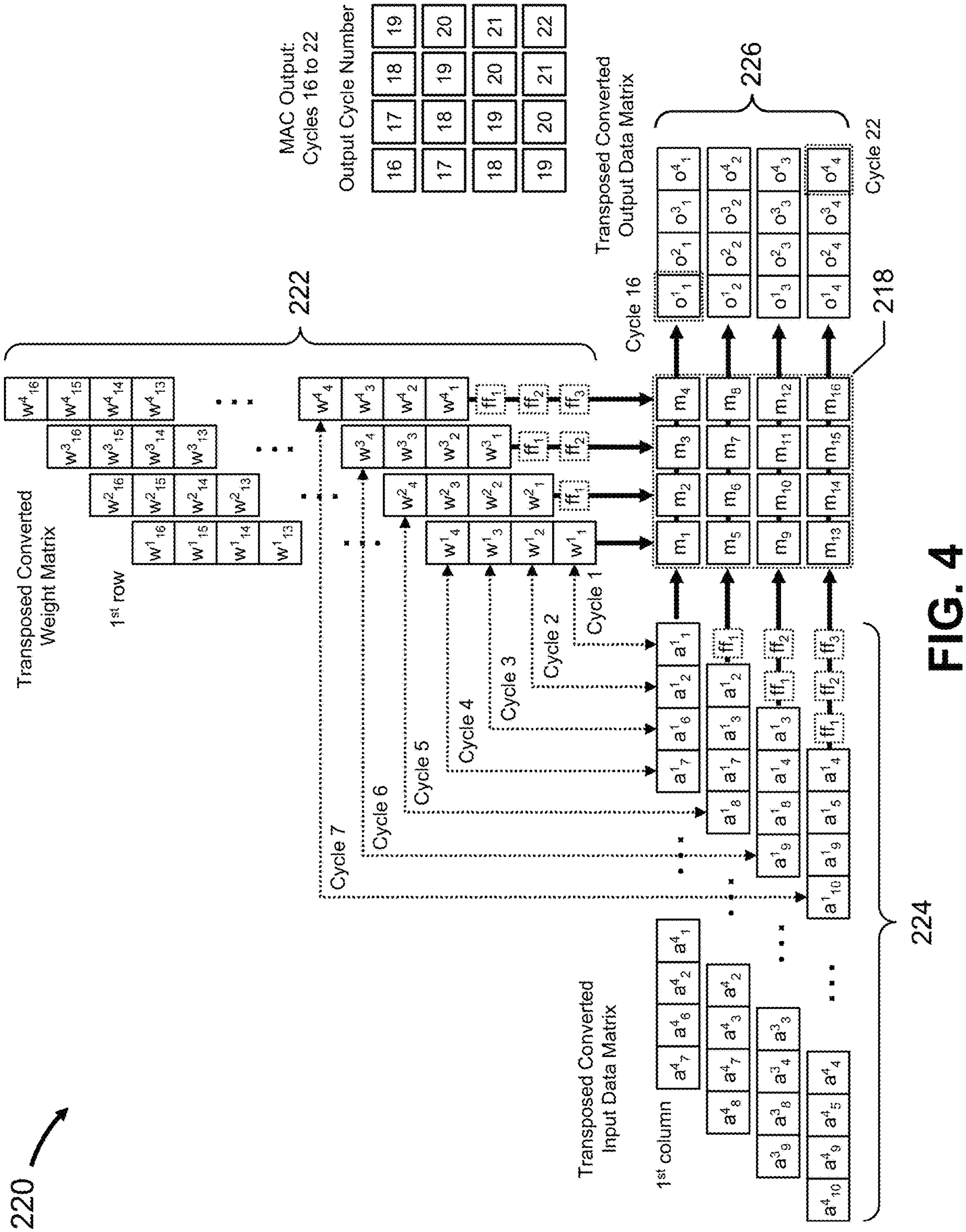
FIG. 4 depicts a data flow diagram for a multiply-and-accumulate (MAC) array.

FIG. 4 depicts data flow diagram 220 for MAC array 218.

As noted above, GEMM operations may be implemented in one or more MMAs, which are dedicated ANN hardware accelerators that include one or more arrays of MAC units. In this embodiment, MAC array 218 is a systolic, output stationary array that implements converted convolution operation 210 using a 4×4 array of MAC units $m_1$, $m_2$, $m_3$, $m_4$, $m_5$, $m_6$, $m_7$, $m_8$, $m_9$, $m_{10}$, $m_{11}$, $m_{12}$, $m_{13}$, $m_{14}$, $m_{15}$ and $m_{16}$. The orientation of transposed converted weight matrix 222, transposed converted input data matrix 224, and transposed converted output data matrix 226 relative to MAC array 218 simplifies illustration; other orientations are also contemplated.

Each MAC unit calculates a dot product, between a row of converted weight matrix 212 and a column of converted input data matrix 214, to generate an element of converted output data matrix 216. Generally, a MAC unit includes, inter alia, a multiplier, an adder and a storage register. Each MAC unit is reset by clearing or zeroing its storage register prior to, or at the start of, a new dot product calculation.

Generally, the rows from converted weight matrix 212 are read from local memory, enter MAC array 218 at the first row of MAC units $m_1$, $m_2$, $m_3$ and $m_4$, and propagate one MAC unit down at the beginning of each processing cycle. Similarly, the columns from converted input data matrix 214 are read from local memory, enter MAC array 218 at the first column of MAC units $m_1$, $m_5$, mg and $m_{13}$, and propagate one MAC unit to the right at the beginning of each processing cycle.

The dot product calculations performed by MAC unit $m_1$ for the blocks of the first quadrants $a^1_{q1}$, $a^2_{q1}$, $a^3_{q1}$ and $a^4_{q1}$ of converted input data matrix 214 are discussed in detail below, while the dot product calculations performed by the remaining MAC units of MAC array 218 are summarized below.

MAC unit $m_1$ calculates the dot product of the first row of converted weight matrix 212 (i.e., converted weight set 212$^1$) and the first column of converted input data matrix 214 to generate element $o^1_1$ of converted output data matrix 216. During the processing cycle 1, MAC unit $m_1$ receives $a^1_1$ and $w^1_1$ from local memory, multiplies $a^1_1$ and $w^1_1$ to generate an intermediate product, adds the intermediate product to the value stored in the storage register (i.e., 0), and stores the accumulated result back in the storage register. During processing cycle 2, MAC unit $m_1$ transmits $a^1_1$ to MAC unit $m_2$ and $w^1_1$ to MAC unit $m_5$, receives $a^1_2$ and $w^1_2$ from local memory, multiplies $a^1_2$ and $w^1_2$ to generate an intermediate product, adds the intermediate product to the value stored in the storage register, and stores the accumulated result back in the storage register.

During processing cycle 3, MAC unit $m_1$ transmits $a^1_2$ to MAC unit $m_2$ and $w^1_2$ to MAC unit $m_5$, receives $a^1_6$ and $w^1_3$ from local memory, multiplies $a^1_6$ and $w^1_3$ to generate an intermediate product, adds the intermediate product to the value stored in the storage register, and stores the accumulated result back in the storage register. During processing cycle 4, MAC unit $m_1$ transmits $a^1_6$ to MAC unit $m_2$ and $w^1_3$ to MAC unit $m_5$, receives $a^1_7$ and $w^1_4$ from the local memory, multiplies $a^1_7$ and $w^1_4$ to generate an intermediate product, adds the intermediate product to the value stored in the storage register, and stores the accumulated result back in the storage register.

Processing cycles 5 through 16 multiply and accumulate the remaining 12 elements of the first row of converted weight matrix 212 and the first column of converted input data matrix 214. At the end of the processing cycle 16, MAC unit $m_1$ outputs element $o^1_1$.

The remainder of the first row of MAC array 218 includes MAC units $m_2$, $m_3$ and $m_4$.

After an initial delay of one processing cycle, MAC unit $m_2$ receives weights from the first delay register $ff_1$ and input data from MAC unit $m_1$, transmits weights to MAC unit me and input data to MAC unit $m_3$, and calculates the dot product of the second row of converted weight matrix 212 (i.e., converted weight set 212$^2$) and the first column of converted input data matrix 214 to generate element $o^2_1$ of converted output data matrix 216. The initial delay of one processing cycle allows the delay pipeline (i.e., delay register $ff_1$) to be filled with weights transferred from memory, and the input data to become available from MAC unit $m_1$. At the end of the processing cycle 17, MAC unit $m_2$ outputs element $o^2_1$.

After an initial delay of two processing cycles, MAC unit $m_3$ receives weights from the second delay register $ff_2$ and input data from MAC unit $m_2$, transmits weights to MAC unit $m_7$ and input data to MAC unit $m_4$, and calculates the dot product of the third row of converted weight matrix 212 (i.e., converted weight set 212$^3$) and the first column of converted input data matrix 214 to generate element $o^3_1$ of converted output data matrix 216. The initial delay of two processing cycles allows the delay pipeline (i.e., delay registers $ff_1$ and $ff_2$) to be filled with weights transferred from memory, and the input data to become available from MAC unit $m_2$. At the end of processing cycle 18, MAC unit $m_3$ outputs element $o^3_1$.

After an initial delay of three processing cycles, MAC unit $m_4$ receives weights from the third delay register ffs and input data from MAC unit $m_3$, transmits weights to MAC unit $m_8$, and calculates the dot product of the fourth row of converted weight matrix 212 (i.e., converted weight set 212$^4$) and the first column of converted input data matrix 214 to generate element $o^4_1$ of converted output data matrix 216. The initial delay of three processing cycles allows the delay pipeline (i.e., delay registers $ff_1$, $ff_2$ and $ff_3$) to be filled with weights transferred from memory, and the input data to become available from MAC unit $m_3$. At the end of processing cycle 19, MAC unit $m_4$ outputs element $o^4_1$.

The second row of MAC array 218 includes MAC units $m_5$, $m_6$, $m_7$ and $m_8$.

After an initial delay of one processing cycle, MAC unit $m_5$ receives weights from MAC unit $m_1$ and input data from a first delay register $ff_1$, transmits weights to MAC unit mg and input data to MAC unit $m_6$, and calculates the dot product of the first row of converted weight matrix 212 (i.e., converted weight set 212$^1$) and the second column of converted input data matrix 214 to generate element $o^1_2$ of converted output data matrix 216. The initial delay of one processing cycle allows the delay pipeline (i.e., delay register $ff_1$) to be filled with input data transferred from memory, and the weights to become available from MAC unit $m_1$. At the end of processing cycle 17, MAC unit $m_5$ outputs element $o^1_2$.

After an initial delay of two processing cycles, MAC unit $m_6$ receives weights from MAC unit $m_2$ and input data from MAC unit $m_5$, transmits weights to MAC unit $m_{10}$ and input data to MAC unit $m_7$, and calculates the dot product of the second row of converted weight matrix 212 (i.e., converted weight set 212$^2$) and the second column of converted input data matrix 214 to generate element $o^2_2$ of converted output data matrix 216. The initial delay of two processing cycles allows the weights to become available from MAC unit $m_2$, and the input data to become available from MAC unit $m_5$. At the end of processing cycle 18, MAC unit me outputs element $o^2_2$.

After an initial delay of three processing cycles, MAC unit $m_7$ receives weights from MAC unit $m_3$ and input data from MAC unit $m_6$, transmits weights to MAC unit $m_{11}$ and input data to MAC unit $m_8$, and calculates the dot product of the third row of converted weight matrix 212 (i.e., converted weight set 212$^3$) and the second column of converted input data matrix 214 to generate element $o^3{}_2$ of converted output data matrix 216. The initial delay of three processing cycles allows the weights to become available from MAC unit $m_3$, and the input data to become available from MAC unit $m_6$. At the end of processing cycle 19, MAC unit $m_7$ outputs element $o^3{}_2$.

After an initial delay of four processing cycles, MAC unit $m_8$ receives weights from MAC unit $m_4$ and input data from MAC unit $m_7$, transmits weights to MAC unit $m_{12}$, and calculates the dot product of the fourth row of converted weight matrix 212 (i.e., converted weight set 212$^4$) and the second column of converted input data matrix 214 to generate element $o^4{}_2$ of converted output data matrix 216. The initial delay of four processing cycles allows the weights to become available from MAC unit $m_4$, and the input data to become available from MAC unit $m_7$. At the end of processing cycle 20, MAC unit $m_8$ outputs element $o^4{}_2$.

The third row of MAC array 218 includes MAC units $m_9$, $m_{10}$, $m_{11}$ and $m_{12}$.

After an initial delay of two processing cycles, MAC unit mg receives weights from MAC unit $m_5$ and input data from a second delay register $ff_2$, transmits weights to MAC unit $m_{13}$ and input data to MAC unit $m_{10}$, and calculates the dot product of the first row of converted weight matrix 212 (i.e., converted weight set 212$^1$) and the third column of converted input data matrix 214 to generate element $o^1{}_3$ of converted output data matrix 216. The initial delay of two processing cycles allows the delay pipeline (i.e., delay registers $ff_1$ and $ff_2$) to be filled with input data transferred from memory, and the weights to become available from MAC unit $m_5$. At the end of processing cycle 18, MAC unit mg outputs element $o^1{}_3$.

After an initial delay of three processing cycles, MAC unit $m_{10}$ receives weights from MAC unit me and input data from MAC unit $m_9$, transmits weights to MAC unit $m_{14}$ and input data to MAC unit $m_{11}$, and calculates the dot product of the second row of converted weight matrix 212 (i.e., converted weight set 212$^2$) and the third column of converted input data matrix 214 to generate element $o^2{}_3$ of converted output data matrix 216. The initial delay of three processing cycles allows the weights to become available from MAC unit $m_6$, and the input data to become available from MAC unit $m_9$. At the end of processing cycle 19, MAC unit $m_{10}$ outputs element $o^2{}_3$.

After an initial delay of four processing cycles, MAC unit $m_{11}$ receives weights from MAC unit $m_7$ and input data from MAC unit $m_{10}$, transmits weights to MAC unit $m_{15}$ and input data to MAC unit $m_{12}$, and calculates the dot product of the third row of converted weight matrix 212 (i.e., converted weight set 212$^3$) and the third column of converted input data matrix 214 to generate element $o^3{}_3$ of converted output data matrix 216. The initial delay of four processing cycles allows the weights to become available from MAC unit $m_7$, and the input data to become available from MAC unit $m_{10}$. At the end of processing cycle 20, MAC unit $m_{11}$ outputs element $o^3{}_3$.

After an initial delay of five processing cycles, MAC unit $m_{12}$ receives weights from MAC unit $m_8$ and input data from MAC unit $m_{11}$, transmits weights to MAC unit $m_{16}$, and calculates the dot product of the fourth row of converted weight matrix 212 (i.e., converted weight set 212$^4$) and the third column of converted input data matrix 214 to generate element $o^4{}_3$ of converted output data matrix 216. The initial delay of five processing cycles allows the weights to become available from MAC unit $m_8$, and the input data to become available from MAC unit $m_{11}$. At the end of processing cycle 21, MAC unit $m_{12}$ outputs element $o^4{}_3$.

The fourth row of MAC array 218 includes MAC units $m_{13}$, $m_{14}$, $m_{15}$ and $m_{16}$.

After an initial delay of three processing cycles, MAC unit $m_{13}$ receives weights from MAC unit mg and input data from a third delay register $ff_3$, transmits input data to MAC unit $m_{14}$, and calculates the dot product of the first row of converted weight matrix 212 (i.e., converted weight set 212$^1$) and the fourth column of converted input data matrix 214 to generate element $o^1{}_4$ of converted output data matrix 216. The initial delay of three processing cycles allows the delay pipeline (i.e., delay registers $ff_1$, $ff_2$ and $ff_3$) to be filled with input data transferred from memory, and the weights to become available from MAC unit $m_9$. At the end of processing cycle 19, MAC unit $m_{13}$ outputs element $o^1{}_4$.

After an initial delay of four processing cycles, MAC unit $m_{14}$ receives weights from MAC unit $m_{10}$ and input data from MAC unit $m_{13}$, transmits input data to MAC unit $m_{15}$, and calculates the dot product of the second row of converted weight matrix 212 (i.e., converted weight set 212$^2$) and the fourth column of converted input data matrix 214 to generate element $o^2{}_4$ of converted output data matrix 216. The initial delay of four processing cycles allows the weights to become available from MAC unit $m_{10}$, and the input data to become available from MAC unit $m_{13}$. At the end of processing cycle 20, MAC unit $m_{14}$ outputs element $o^2{}_4$.

After an initial delay of five processing cycles, MAC unit $m_{15}$ receives weights from MAC unit $m_{11}$ and input data from MAC unit $m_{14}$, transmits input data to MAC unit $m_{16}$, and calculates the dot product of the third row of converted weight matrix 212 (i.e., converted weight set 212$^3$) and the fourth column of converted input data matrix 214 to generate element $o^3{}_4$ of converted output data matrix 216. The initial delay of five processing cycles allows the weights to become available from MAC unit $m_{11}$, and the input data to become available from MAC unit $m_{14}$. At the end of processing cycle 21, MAC unit $m_{15}$ outputs element $o^3{}_4$.

After an initial delay of six processing cycles, MAC unit $m_{16}$ receives weights from MAC unit $m_{12}$ and input data from MAC unit $m_{15}$, and calculates the dot product of the fourth row of converted weight matrix 212 (i.e., converted weight set 212$^4$) and the fourth column of converted input data matrix 214 to generate element $o^4{}_4$ of converted output data matrix 216. The initial delay of six processing cycles allows the weights to become available from MAC unit $m_{12}$, and the input data to become available from MAC unit $m_{15}$. At the end of processing cycle 22, MAC unit $m_{16}$ outputs element $o^4{}_4$.

After the blocks of the first quadrants $a^1{}_{q1}$, $a^2{}_{q1}$, $a^3{}_{q1}$ and $a^4{}_{q1}$ of converted input data matrix 214 have been processed, the next sequence of operations processes the blocks of the second quadrants $a^1{}_{92}$, $a^2{}_{q2}$, $a^3{}_{92}$ and $a^4{}_{q2}$. After the blocks of the second quadrants $a^1{}_{q2}$, $a^2{}_{q2}$, $a^3{}_{q2}$ and $a^4{}_{q2}$ have been processed, the next sequence of operations processes the blocks of the third quadrants $a^1{}_{q3}$, $a^2{}_{q3}$, $a^3{}_{q3}$ and $a^4{}_{q3}$. And, after the blocks of the third quadrants $a^1{}_{q3}$, $a^2{}_{q3}$, $a^3{}_{q3}$ and $a^4{}_{q3}$ have been processed, the final sequence of operations processes the blocks of the fourth quadrants $a^1{}_{q4}$, $a^2{}_{q4}$, $a^3{}_{q4}$ and $a^4{}_{q4}$. Converted weight matrix 212 is accessed for each sequence of operations.

Many Machine Learning (ML) inference applications employ quantized ANNs, such as quantized CNNs, that require high-throughput, low-precision matrix multiplication operations. A conventional ANN has fixed bit-width dot product datapaths, such as, for example, 8 bits, 16 bits, 32 bits, etc. MMAs that support conventional ANNs include one or more MAC unit arrays that multiply operands having corresponding fixed bit-widths, such as, for example, 8 bits, 16 bits, 32 bits, etc.

A quantized ANN may have smaller bit-width dot product datapaths, such as 3 bits, 4 bits, 5 bits, etc. For example, one matrix for a particular CNN layer may contain weight data having a resolution of 3 bits, while another matrix for this particular CNN layer may contain input data having a resolution of 5 bits. Generally, a quantized ANN may have dot product datapaths with bit-widths that vary from 1 bit to 8 bits (or more).

MMAs that support conventional ANNs may be used to support quantized ANNs.

Figure 5:
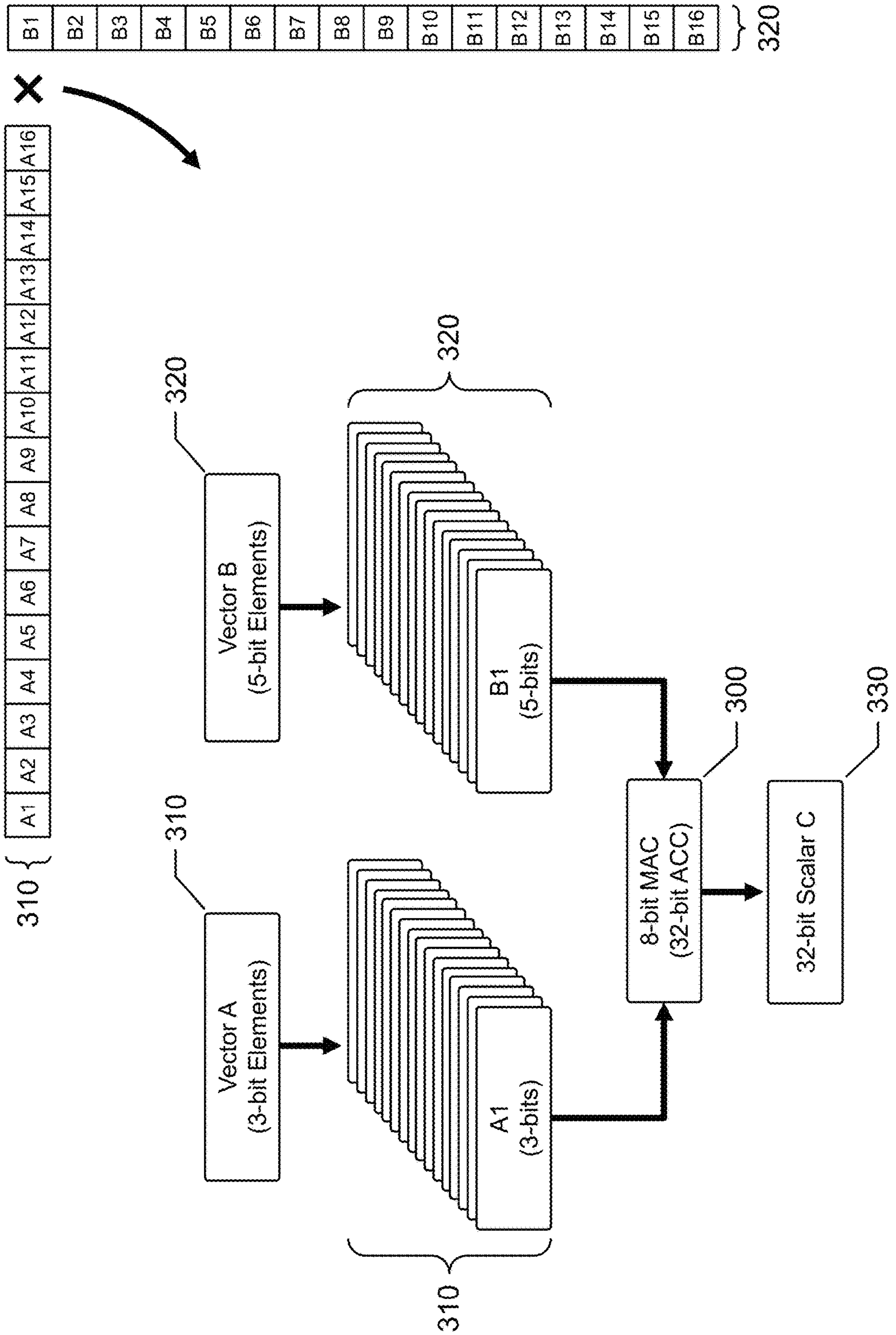
FIG. 5 depicts the computation of the dot product between vector A and vector B using a MAC unit, in accordance with an embodiment of the present disclosure.

FIG. 5 depicts the computation of the dot product between vector A 310 and vector B 320 using MAC unit 300, in accordance with an embodiment of the present disclosure.

Vector A 310 includes sixteen 3-bit elements, i.e., A1, A2, A3, A4, A5, A6, A7, A8, A9, A10, A11, A12, A13, A14, A15 and A16. Vector A 310 may represent, for example, one row from converted weight matrix 212. Vector B 320 includes sixteen 5-bit elements, i.e., B1, B2, B3, B4, B5, B6, B7, B8, B9, B10, B11, B12, B13, B14, B15 and B16. Vector B 320 may represent, for example, one column from converted input data matrix 214. MAC unit 300 calculates the dot product between vector A 310 and vector B 320 by multiplying corresponding pairs of elements as 8-bit unsigned operands (i.e., UINT8), accumulating the intermediate products into a 32-bit accumulator register (ACC), and then outputting 32-bit scalar C 330 (e.g., UINT32, etc.), which may represent, for example, one element from converted output data matrix 216.

More particularly, during the first processing cycle, MAC unit 300 multiplies A1 and B1 as 8-bit operands to generate an intermediate product (i.e., A1. B1), adds the intermediate product to the value stored in the accumulator register (i.e., 0), and then stores the accumulated value back to the accumulator register (i.e., A1·B1). During the second processing cycle, MAC unit 300 multiplies A2 and B2 as 8-bit operands to generate an intermediate product (i.e., A2·B2), adds the intermediate product to the value stored in the accumulator register (i.e., A1·B1) and then stores the accumulated value back to the accumulator register (i.e., A1·B1+A2·B2). MAC unit 300 processes the remaining 14 pairs of elements from vector A 310 and vector B 320 in the same manner, and, after MAC unit 300 has processed A16 and B16, MAC unit 300 outputs the accumulated value stored in the accumulator register as 32-bit scalar C 330 (i.e., A1·B1+A2·B2+A3·B3+A4·B4+A5·B5+A6·B6+A7·B7+A8·B8+A9·B9+A10·B10+A11·B11+A12·B12+A13·B13+A14·B14+A15·B15+A16·B16).

However, using a wide datapath MAC unit array to multiply narrower operands is inefficient because the upper bits of the wide datapath are wasted. For example, a MAC unit that multiplies 3-bit operands and 5-bit operands as 8-bit operands operates much less efficiently that a MAC unit that multiplies 3-bit operands and 5-bit operands at their native resolution. Unfortunately, it is impractical to deploy narrow 1 bit-width to 8 bit-width MAC units in hardware to achieve maximal power and area efficiency.

Embodiments of the present disclosure advantageously provide a system and method for efficiently multiplying matrices with variable bit-width operands using an MMA with an array of BSDP units.

Figure 6A:
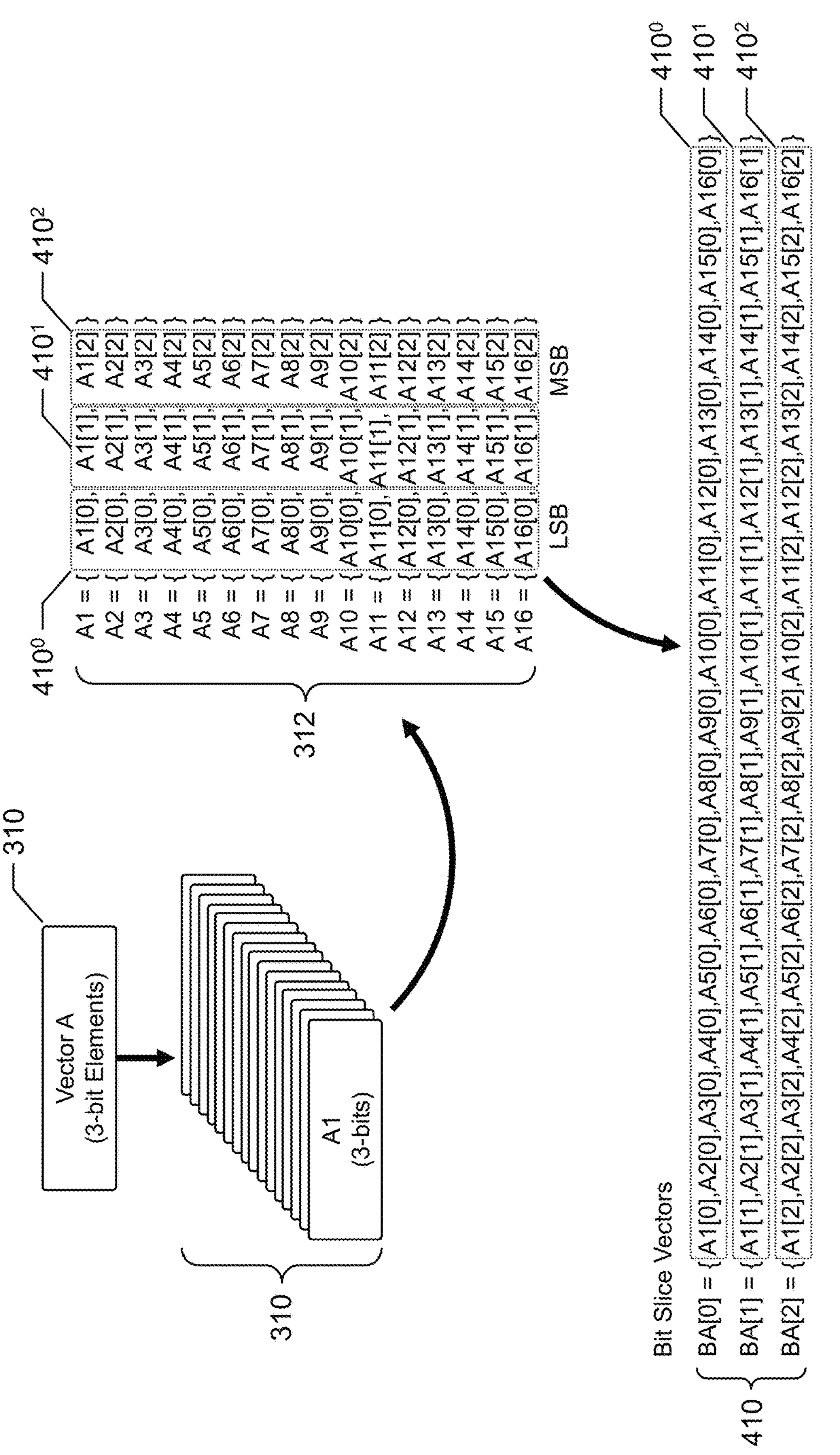
FIG. 6A depicts the creation of bit slice vectors from the vector A depicted in FIG. 5, in accordance with an embodiment of the present disclosure.

FIG. 6A depicts the creation of bit slice vectors 410 from vector A 310 depicted in FIG. 5, in accordance with an embodiment of the present disclosure.

The elements of vector A 310 are first arranged in bit vector form as bit vector A 312. The bit vector for each element of vector A 310 is a sequence of bits from the LSB (i.e., bit position "0") to the MSB (i.e., bit position "2"). For example, the bit vector for element A1 is {A1 [0], A1 [1], A1 [2]}, where A1 [0] is the value of the bit at the first bit position (i.e., the LSB), A1 [1] is the value of the bit at the second bit position, and A1 [2] is the value of the bit at the third bit position (i.e., the MSB). Similarly, the bit vector for element A2 is {A2 [0], A2 [1], A2 [2]}, where A2 [0] is the value of the bit at the first bit position (i.e., the LSB), A2 [1] is the value of the bit at the second bit position, and A2 [2] is the value of the bit at the third bit position (i.e., the MSB). The remaining elements of bit vector A 312 are formed in a similar manner from the remaining elements of vector A 310.

Bit slice vectors 410 are then formed from bit vector A 312. Bit slice vector $\mathbf{410}^0$ is a sequence of bits formed from the bit at the first bit position of each element of bit vector A 312, i.e., {A1 [0], A2 [0], A3 [0], A4 [0], A5 [0], A6 [0], A7 [0], A8 [0], A9 [0], A10 [0], A11 [0], A12 [0], A13 [0], A14 [0], A15 [0], A16 [0]}. Bit slice vector $\mathbf{410}^1$ is a sequence of bits formed from the bit at the second bit position of each element of bit vector A 312, i.e., {A1 [1], A2 [1], A3 [1], A4 [1], A5 [1], A6 [1], A7 [1], A8 [1], A9 [1], A10 [1], A11 [1], A12 [1], A13 [1], A14 [1], A15 [1], A16 [1]}. Bit slice vector $\mathbf{410}^2$ is a sequence of bits formed from the bit at the third bit position of each element of bit vector A 312, i.e., {A1 [2], A2 [2], A3 [2], A4 [2], A5 [2], A6 [2], A7 [2], A8 [2], A9 [2], A10 [2], A11 [2], A12 [2], A13 [2], A14 [2], A15 [2], A16 [2]}.

Figure 6B:
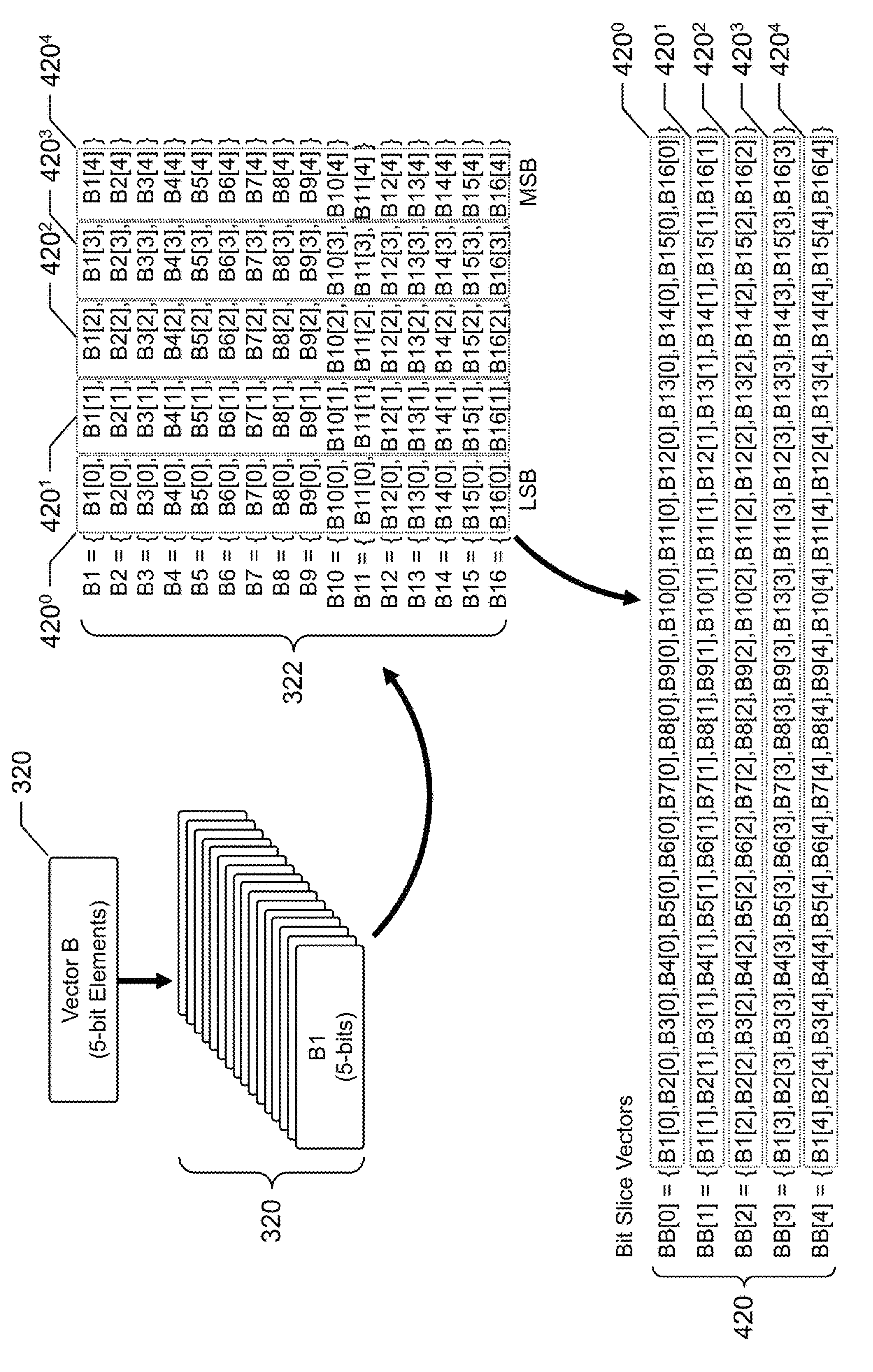
FIG. 6B depicts the creation of bit slice vectors from the vector B depicted in FIG. 5, in accordance with an embodiment of the present disclosure.

FIG. 6B depicts the creation of bit slice vectors 420 from vector B 320 depicted in FIG. 5, in accordance with an embodiment of the present disclosure.

The elements of vector B 320 are first arranged in bit vector form as bit vector B 322. The bit vector for each element of vector B 320 is a sequence of bits from the LSB (i.e., bit position "0") to the MSB (i.e., bit position "4"). For example, the bit vector for element B1 is {B1 [0], B1 [1], B1 [2], B1 [3], B1 [4]}, where B1 [0] is the value of the bit at the first bit position (i.e., the LSB), B1 [1] is the value of the bit at the second bit position, B1 [2] is the value of the bit at the third bit position, B1 [3] is the value of the bit at the fourth bit position, and B1 [4] is the value of the bit at the fifth bit position (i.e., the MSB). Similarly, the bit vector for element B2 is {B2 [0], B2 [1], B2 [2], B2 [3], B2 [4]}, where B2 [0] is the value of the bit at the first bit position (i.e., the LSB), B2 [1] is the value of the bit at the second bit position, B2 [2] is the value of the bit at the third bit position, B2 [3] is the value of the bit at the fourth bit position, and B2 [4] is the value of the bit at the fifth bit position (i.e., the MSB). The remaining elements of bit vector B 312 are formed in a similar manner from the remaining elements of vector B 320.

Bit slice vectors 420 are then formed from bit vector B 322. Bit slice vector $\mathbf{420}^0$ is a sequence of bits formed from the bit at the first bit position of each element of bit vector B 312, i.e., {B1 [0], B2 [0], B3 [0], B4 [0], B5 [0], B6 [0], B7 [0], B8 [0], B9 [0], B10 [0], B11 [0], B12 [0], B13 [0], B14 [0], B15 [0], B16 [0]}. Bit slice vector $\mathbf{420}^1$ is a sequence of bits formed from the bit at the second bit position of each element of bit vector B 312, i.e., {B1 [1], B2 [1], B3 [1], B4 [1], B5 [1], B6 [1], B7 [1], B8 [1], B9 [1], B10 [1], B11 [1], B12 [1], B13 [1], B14 [1], B15 [1], B16 [1]}. Bit slice vector $\mathbf{410}^{2}$ is a sequence of bits formed from the bit at the third bit position of each element of bit vector B 312, i.e., {B1 [2], B2 [2], B3 [2], B4 [2], B5 [2], B6 [2], B7 [2], B8 [2], B9 [2], B10 [2], B11 [2], B12 [2], B13 [2], B14 [2], B15 [2], B16 [2]}. Bit slice vector $\mathbf{410}^{3}$ is a sequence of bits formed from the bit at the fourth bit position of each element of bit vector B 312, i.e., {B1 [3], B2 [3], B3 [3], B4 [3], B5 [3], B6 [3], B7 [3], B8 [3], B9 [3], B10 [3], B11 [3], B12 [3], B13 [3], B14 [3], B15 [3], B16 [3]}. Bit slice vector $\mathbf{410}^{4}$ is a sequence of bits formed from the bit at the fifth bit position of each element of bit vector B 312, i.e., {B1[4], B2 [4], B3 [4], B4 [4], B5 [4], B6 [4], B7 [4], B8 [4], B9 [4], B10 [4], B11 [4], B12 [4], B13 [4], B14 [4], B15 [4], B16 [4]}.

Figure 6C:
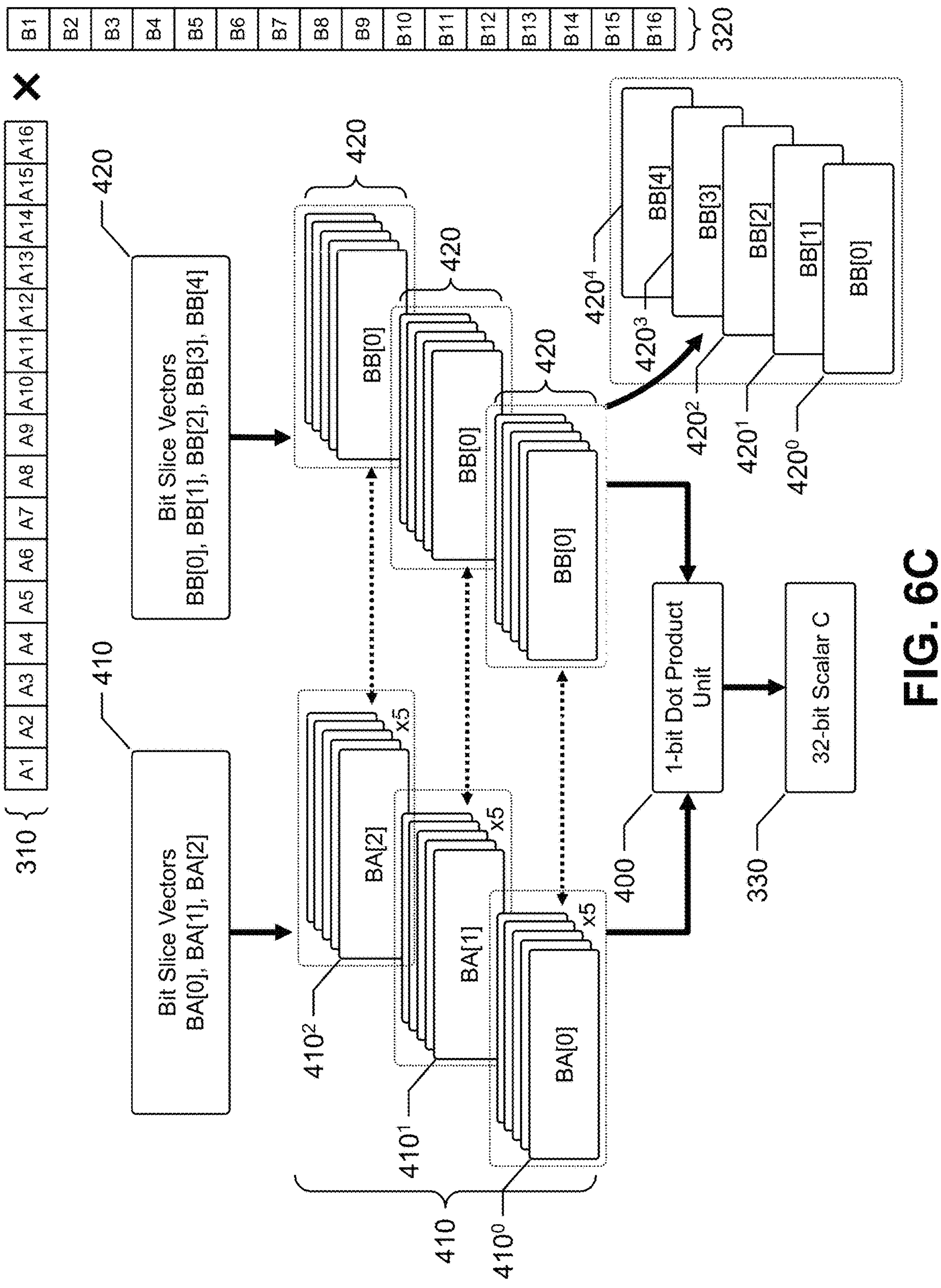
FIG. 6C depicts the computation of the 1-bit dot product between two bit slice vectors using a 1-bit dot product unit, in accordance with an embodiment of the present disclosure.

FIG. 6C depicts the computation of the 1-bit dot product between bit slice vectors 410 and bit slice vectors 420 using 1-bit dot product unit 400, in accordance with an embodiment of the present disclosure.

One-bit dot product unit 400 calculates the dot product between vector A 310 and vector B 320 by multiplying bit slice vectors 410 and 420 in a particular sequence, and then outputting 32-bit scalar C 330. Generally, 1-bit dot product unit 400 multiplies each bit slice vector $\mathbf{410}^{0}$, $\mathbf{410}^{1}$ and $\mathbf{410}^{2}$ with each bit slice vector $\mathbf{412}^{0}$, $\mathbf{412}^{1}$, $\mathbf{412}^{2}$, $\mathbf{412}^{3}$ and $\mathbf{412}^{4}$, accumulates the intermediate products and then generates the 32-bit scalar C 330.

Advantageously, 1-bit dot product unit 400 calculates the dot product between any two vectors A and B with the same or different bit-width elements.

In one embodiment, the bit slice vector multiplication process is a nested loop, in which an outer loop index j selects a particular bit slice vector $\mathbf{410}^{i}$ (i.e., BA[j]), while an inner loop index k selects a particular bit slice vector $\mathbf{420}^{k}$ (i.e., BB[k]). Each iteration of the inner loop multiplies a particular bit slice vector BA[j] and a particular bit slice vector BB[k] by performing a bit-wise AND operation and then counting the number of ones that are generated using, for example, a population count function, a sequence of adders including 32 1-bit adders, 50% full adders and 50% half adders, etc. In certain embodiments, the partial reduction may be used for the count.

The nested loop may be given by Equation 1:

```
for ( j = 0; j < 3; j++ ) {                    Eq. 1
  for ( k = 0; k < 5; k++ ) {
    n = j + k;
    int t = DP1( BA[ j ], BB[ k ] );
    S += t << n;
  }
}
```

The function DP1( ) represents the bit-wise AND operation followed by the counting operation, the variable t stores the count value, and the variable S accumulates the values of the intermediate products. Due to the nature of the bit multiplication process, the variable t is left-shifted by the sum of the indices j and k prior to accumulation. As described above, indices j and k represent the respective bit positions of the bits in each bit slice.

For the first iteration of the nested loop, index j is 0, index k is 0, and n is 0. The function DP1( ) first performs the bit-wise AND operation between BA[0] and BB[0] to generate an intermediate bit vector b, as follows:

$$\begin{aligned} b = \{&A1[0]\,\&B1[0],\ A2[0]\,\&B2[0],\ A3[0]\,\&B3[0],\ A4[0]\,\&B4[0],\\ &A5[0]\,\&B5[0],\ A6[0]\,\&B6[0],\ A7[0]\,\&B7[0],\ A8[0]\,\&B8[0],\\ &A9[0]\,\&B9[0],\ A10[0]\,\&B10[0],\ A11[0]\,\&B11[0],\ A12[0]\,\&B12[0],\\ &A13[0]\,\&B13[0],\ A14[0]\,\&B14[0],\ A15[0]\,\&B15[0],\ A16[0]\,\&B16[0]\}\\ = \{&b1, b2, b3, b4, b5, b6, b6, b8, b9, b10, b11, b12, b13, b14, b15, b16\} \end{aligned}$$

The function DP1( ) then performs the population count operation on the intermediate bit vector b to count the number of bits bn that have a value of one. The result is returned and assigned to the variable t, which is left-shifted by 0 bits and then added to the variable S.

For the 2nd iteration of the nested loop, index j is 0, index k is 1, and n is 1. The function DP1( ) first performs the bit-wise AND operation between BA[0] and BB[1] to generate the intermediate bit vector b, as follows:

$$\begin{aligned} b = \{&A1[0]\,\&B1[1],\ A2[0]\,\&B2[1],\ A3[0]\,\&B3[1],\ A4[0]\,\&B4[1],\\ &A5[0]\,\&B5[1],\ A6[0]\,\&B6[1],\ A7[0]\,\&B7[1],\ A8[0]\,\&B8[1],\\ &A9[0]\,\&B9[1],\ A10[0]\,\&B10[1],\ A11[0]\,\&B11[1],\ A12[0]\,\&B12[1],\\ &A13[0]\,\&B13[1],\ A14[0]\,\&B14[1],\ A15[0]\,\&B15[1],\ A16[0]\,\&B16[1]\}\\ = \{&b1, b2, b3, b4, b5, b6, b6, b8, b9, b10, b11, b12, b13, b14, b15, b16\} \end{aligned}$$

The function DP1( ) then performs the population count operation on the intermediate bit vector b to count the number of bits bn that have a value of one. The result is returned and assigned to the variable t, which is left-shifted by 1 bit and then added to the variable S.

For the $3^{rd}$ iteration of the nested loop, index j is 0, index k is 2, and n is 2. The function DP1( ) first performs the bit-wise AND operation between BA[0] and BB[2] to generate the intermediate bit vector b, as follows:

$$\begin{aligned} b = \{&A1[0]\,\&B1[2],\ A2[0]\,\&B2[2],\ A3[0]\,\&B3[2],\ A4[0]\,\&B4[2],\\ &A5[0]\,\&B5[2],\ A6[0]\,\&B6[2],\ A7[0]\,\&B7[2],\ A8[0]\,\&B8[2],\\ &A9[0]\,\&B9[2],\ A10[0]\,\&B10[2],\ A11[0]\,\&B11[2],\ A12[0]\,\&B12[2],\\ &A13[0]\,\&B13[2],\ A14[0]\,\&B14[2],\ A15[0]\,\&B15[2],\ A16[0]\,\&B16[2]\}\\ = \{&b1, b2, b3, b4, b5, b6, b6, b8, b9, b10, b11, b12, b13, b14, b15, b16\} \end{aligned}$$

The function DP1( ) then performs the population count operation on the intermediate bit vector b to count the number of bits bn that have a value of one. The result is returned and assigned to the variable t, which is left-shifted by 2 bits and then added to the variable S.

For the $4^{th}$ iteration of the nested loop, index j is 0, index k is 3, and n is 3. The function DP1( ) first performs the bit-wise AND operation between BA[0] and BB[3] to generate the intermediate bit vector b, as follows:

$$\begin{aligned} b = \{&A1[0]\,\&B1[3],\ A2[0]\,\&B2[3],\ A3[0]\,\&B3[3],\ A4[0]\,\&B4[3],\\ &A5[0]\,\&B5[3],\ A6[0]\,\&B6[3],\ A7[0]\,\&B7[3],\ A8[0]\,\&B8[3],\\ &A9[0]\,\&B9[3],\ A10[0]\,\&B10[3],\ A11[0]\,\&B11[3],\ A12[0]\,\&B12[3], \end{aligned}$$

-continued $$A13[0]\ \&B13[3],\ A14[0]\ \&B14[3],\ A15[0]\ \&B15[3],\ A16[0]\ \&B16[3]\}$$
$$= \{b1, b2, b3, b4, b5, b6, b6, b8, b9, b10, b11, b12, b13, b14, b15, b16\}$$

The function DP1( ) then performs the population count operation on the intermediate bit vector b to count the number of bits bn that have a value of one. The result is returned and assigned to the variable t, which is left-shifted by 3 bits and then added to the variable S.

For the 5th iteration of the nested loop, index j is 0, index k is 4, and n is 4. The function DP1( ) first performs the bit-wise AND operation between BA[0] and BB[4] to generate the intermediate bit vector b, as follows:

$$b = \{A1[0]\ \&B1[4],\ A2[0]\ \&B2[4],\ A3[0]\ \&B3[4],\ A4[0]\ \&B4[4],$$
$$A5[0]\ \&B5[4],\ A6[0]\ \&B6[4],\ A7[0]\ \&B7[4],\ A8[0]\ \&B8[4],$$
$$A9[0]\ \&B9[4],\ A10[0]\ \&B10[4],\ A11[0]\ \&B11[4],\ A12[0]\ \&B12[4],$$
$$A13[0]\ \&B13[4],\ A14[0]\ \&B14[4],\ A15[0]\ \&B15[4],\ A16[0]\ \&B16[4]\}$$
$$= \{b1, b2, b3, b4, b5, b6, b6, b8, b9, b10, b11, b12, b13, b14, b15, b16\}$$

The function DP1( ) then performs the population count operation on the intermediate bit vector b to count the number of bits bn that have a value of one. The result is returned and assigned to the variable t, which is left-shifted by 4 bits and then added to the variable S.

For the 6th iteration of the nested loop, index j is 1, index k is 0, and n is 1. The function DP1( ) first performs the bit-wise AND operation between BA[1] and BB[0] to generate an intermediate bit vector b, as follows:

$$b = \{A1[1]\ \&B1[0],\ A2[1]\ \&B2[0],\ A3[1]\ \&B3[0],\ A4[1]\ \&B4[0],$$
$$A5[1]\ \&B5[0],\ A6[1]\ \&B6[0],\ A7[1]\ \&B7[0],\ A8[1]\ \&B8[0],$$
$$A9[1]\ \&B9[0],\ A10[1]\ \&B10[0],\ A11[1]\ \&B11[0],\ A12[1]\ \&B12[0],$$
$$A13[1]\ \&B13[0],\ A14[1]\ \&B14[0],\ A15[1]\ \&B15[0],\ A16[1]\ \&B16[0]\}$$
$$= \{b1, b2, b3, b4, b5, b6, b6, b8, b9, b10, b11, b12, b13, b14, b15, b16\}$$

The function DP1( ) then performs the population count operation on the intermediate bit vector b to count the number of bits bn that have a value of one. The result is returned and assigned to the variable t, which is left-shifted by 1 bit and then added to the variable S.

For the 7th iteration of the nested loop, index j is 1, index k is 1, and n is 2. The function DP1( ) first performs the bit-wise AND operation between BA[1] and BB[1] to generate the intermediate bit vector b, as follows:

$$b = \{A1[1]\ \&B1[1],\ A2[1]\ \&B2[1],\ A3[1]\ \&B3[1],\ A4[1]\ \&B4[1],$$
$$A5[1]\ \&B5[1],\ A6[1]\ \&B6[1],\ A7[1]\ \&B7[1],\ A8[1]\ \&B8[1],$$
$$A9[1]\ \&B9[1],\ A10[1]\ \&B10[1],\ A11[1]\ \&B11[1],\ A12[1]\ \&B12[1],$$
$$A13[1]\ \&B13[1],\ A14[1]\ \&B14[1],\ A15[1]\ \&B15[1],\ A16[1]\ \&B16[1]\}$$
$$= \{b1, b2, b3, b4, b5, b6, b6, b8, b9, b10, b11, b12, b13, b14, b15, b16\}$$

The function DP1( ) then performs the population count operation on the intermediate bit vector b to count the number of bits bn that have a value of one. The result is returned and assigned to the variable t, which is left-shifted by 2 bits and then added to the variable S.

For the 8th iteration of the nested loop, index j is 1, index k is 2, and n is 3. The function DP1( ) first performs the bit-wise AND operation between BA[1] and BB[2] to generate the intermediate bit vector b, as follows:

$$b = \{A1[1]\ \&B1[2],\ A2[1]\ \&B2[2],\ A3[1]\ \&B3[2],\ A4[1]\ \&B4[2],$$
$$A5[1]\ \&B5[2],\ A6[1]\ \&B6[2],\ A7[1]\ \&B7[2],\ A8[1]\ \&B8[2],$$
$$A9[1]\ \&B9[2],\ A10[1]\ \&B10[2],\ A11[1]\ \&B11[2],\ A12[1]\ \&B12[2],$$
$$A13[1]\ \&B13[2],\ A14[1]\ \&B14[2],\ A15[1]\ \&B15[2],\ A16[1]\ \&B16[2]\}$$
$$= \{b1, b2, b3, b4, b5, b6, b6, b8, b9, b10, b11, b12, b13, b14, b15, b16\}$$

The function DP1( ) then performs the population count operation on the intermediate bit vector b to count the number of bits bn that have a value of one. The result is returned and assigned to the variable t, which is left-shifted by 3 bits and then added to the variable S.

For the 9th iteration of the nested loop, index j is 1, index k is 3, and n is 4. The function DP1( ) first performs the bit-wise AND operation between BA[1] and BB[3] to generate the intermediate bit vector b, as follows:

$$b = \{A1[1]\ \&B1[3],\ A2[1]\ \&B2[3],\ A3[1]\ \&B3[3],\ A4[1]\ \&B4[3],$$
$$A5[1]\ \&B5[3],\ A6[1]\ \&B6[3],\ A7[1]\ \&B7[3],\ A8[1]\ \&B8[3],$$
$$A9[1]\ \&B9[3],\ A10[1]\ \&B10[3],\ A11[1]\ \&B11[3],\ A12[1]\ \&B12[3],$$
$$A13[1]\ \&B13[3],\ A14[1]\ \&B14[3],\ A15[1]\ \&B15[3],\ A16[1]\ \&B16[3]\}$$
$$= \{b1, b2, b3, b4, b5, b6, b6, b8, b9, b10, b11, b12, b13, b14, b15, b16\}$$

The function DP1( ) then performs the population count operation on the intermediate bit vector b to count the number of bits bn that have a value of one. The result is returned and assigned to the variable t, which is left-shifted by 4 bits and then added to the variable S.

For the 10th iteration of the nested loop, index j is 1, index k is 4, and n is 5. The function DP1( ) first performs the bit-wise AND operation between BA[1] and BB[4] to generate the intermediate bit vector b as follows:

$$b = \{A1[1]\ \&B1[4],\ A2[1]\ \&B2[4],\ A3[1]\ \&B3[4],\ A4[1]\ \&B4[4],$$
$$A5[1]\ \&B5[4],\ A6[1]\ \&B6[4],\ A7[1]\ \&B7[4],\ A8[1]\ \&B8[4],$$
$$A9[1]\ \&B9[4],\ A10[1]\ \&B10[4],\ A11[1]\ \&B11[4],\ A12[1]\ \&B12[4],$$
$$A13[1]\ \&B13[4],\ A14[1]\ \&B14[4],\ A15[1]\ \&B15[4],\ A16[1]\ \&B16[4]\}$$
$$= \{b1, b2, b3, b4, b5, b6, b6, b8, b9, b10, b11, b12, b13, b14, b15, b16\}$$

The function DP1( ) then performs the population count operation on the intermediate bit vector b to count the number of bits bn that have a value of one. The result is returned and assigned to the variable t, which is left-shifted by 5 bits and then added to the variable S.

For the 11th iteration of the nested loop, index j is 2, index k is 0, and n is 2. The function DP1( ) first performs the bit-wise AND operation between BA[2] and BB[0] to generate an intermediate bit vector b, as follows:

$$b = \{A1[2]\ \&B1[0],\ A2[2]\ \&B2[0],\ A3[2]\ \&B3[0],\ A4[2]\ \&B4[0],\ A5[2]\ \&B5[0],\ A6[2]\ \&B6[0],\ A7[2]\ \&B7[0],\ A8[2]\ \&B8[0],\ A9[2]\ \&B9[0],\ A10[2]\ \&B10[0],\ A11[2]\ \&B11[0],\ A12[2]\ \&B12[0],\ A13[2]\ \&B13[0],\ A14[2]\ \&B14[0],\ A15[2]\ \&B15[0],\ A16[2]\ \&B16[0]\} = \{b1, b2, b3, b4, b5, b6, b6, b8, b9, b10, b11, b12, b13, b14, b15, b16\}$$

The function DP1( ) then performs the population count operation on the intermediate bit vector b to count the number of bits bn that have a value of one. The result is returned and assigned to the variable t, which is left-shifted by 2 bits and then added to the variable S.

For the 12th iteration of the nested loop, index j is 2, index k is 1, and n is 3. The function DP1( ) first performs the bit-wise AND operation between BA[2] and BB[1] to generate the intermediate bit vector b, as follows:

$$b = \{A1[2]\ \&B1[1],\ A2[2]\ \&B2[1],\ A3[2]\ \&B3[1],\ A4[2]\ \&B4[1],\ A5[2]\ \&B5[1],\ A6[2]\ \&B6[1],\ A7[2]\ \&B7[1],\ A8[2]\ \&B8[1],\ A9[2]\ \&B9[1],\ A10[2]\ \&B10[1],\ A11[2]\ \&B11[1],\ A12[2]\ \&B12[1],\ A13[2]\ \&B13[1],\ A14[2]\ \&B14[1],\ A15[2]\ \&B15[1],\ A16[2]\ \&B16[1]\} = \{b1, b2, b3, b4, b5, b6, b6, b8, b9, b10, b11, b12, b13, b14, b15, b16\}$$

The function DP1( ) then performs the population count operation on the intermediate bit vector b to count the number of bits bn that have a value of one. The result is returned and assigned to the variable t, which is left-shifted by 3 bits and then added to the variable S.

For the 13th iteration of the nested loop, index j is 2, index k is 2, and n is 4. The function DP1( ) first performs the bit-wise AND operation between BA[1] BA[2] and BB[2] to generate the intermediate bit vector b, as follows:

$$b = \{A1[2]\ \&B1[2],\ A2[2]\ \&B2[2],\ A3[2]\ \&B3[2],\ A4[2]\ \&B4[2],\ A5[2]\ \&B5[2],\ A6[2]\ \&B6[2],\ A7[2]\ \&B7[2],\ A8[2]\ \&B8[2],\ A9[2]\ \&B9[2],\ A10[2]\ \&B10[2],\ A11[2]\ \&B11[2],\ A12[2]\ \&B12[2],\ A13[2]\ \&B13[2],\ A14[2]\ \&B14[2],\ A15[2]\ \&B15[2],\ A16[2]\ \&B16[2]\} = \{b1, b2, b3, b4, b5, b6, b6, b8, b9, b10, b11, b12, b13, b14, b15, b16\}$$

The function DP1( ) then performs the population count operation on the intermediate bit vector b to count the number of bits bn that have a value of one. The result is returned and assigned to the variable t, which is left-shifted by 4 bits and then added to the variable S.

For the 14th iteration of the nested loop, index j is 2, index k is 3, and n is 5. The function DP1( ) first performs the bit-wise AND operation between BA[2] and BB[3] to generate the intermediate bit vector b, as follows:

$$b = \{A1[2]\ \&B1[3],\ A2[2]\ \&B2[3],\ A3[2]\ \&B3[3],\ A4[2]\ \&B4[3],\ A5[2]\ \&B5[3],\ A6[2]\ \&B6[3],\ A7[2]\ \&B7[3],\ A8[2]\ \&B8[3],\ A9[2]\ \&B9[3],\ A10[2]\ \&B10[3],\ A11[2]\ \&B11[3],\ A12[2]\ \&B12[3],$$

-continued $$A13[2]\ \&B13[3],\ A14[2]\ \&B14[3],\ A15[2]\ \&B15[3],\ A16[2]\ \&B16[3]\} = \{b1, b2, b3, b4, b5, b6, b6, b8, b9, b10, b11, b12, b13, b14, b15, b16\}$$

The function DP1( ) then performs the population count operation on the intermediate bit vector b to count the number of bits bn that have a value of one. The result is returned and assigned to the variable t, which is left-shifted by 5 bits and then added to the variable S.

For the 15th and final iteration of the nested loop, index j is 2, index k is 4, and n is 6. The function DP1( ) first performs the bit-wise AND operation between BA[2] and BB[4] to generate the intermediate bit vector b, as follows:

$$b = \{A1[2]\ \&B1[4],\ A2[2]\ \&B2[4],\ A3[2]\ \&B3[4],\ A4[2]\ \&B4[4],\ A5[2]\ \&B5[4],\ A6[2]\ \&B6[4],\ A7[2]\ \&B7[4],\ A8[2]\ \&B8[4],\ A9[2]\ \&B9[4],\ A10[2]\ \&B10[4],\ A11[2]\ \&B11[4],\ A12[2]\ \&B12[4],\ A13[2]\ \&B13[4],\ A14[2]\ \&B14[4],\ A15[2]\ \&B15[4],\ A16[2]\ \&B16[4]\} = \{b1, b2, b3, b4, b5, b6, b6, b8, b9, b10, b11, b12, b13, b14, b15, b16\}$$

The function DP1( ) then performs the population count operation on the intermediate bit vector b to count the number of bits bn that have a value of one. The result is returned and assigned to the variable t, which is left-shifted by 6 bits and then added to the variable S.

After the last loop has completed, 1-bit dot product unit 400 outputs the final value of S as 32-bit scalar C 330. For this embodiment, there are a total of 15 loops, and, optionally, a loop iteration may be skipped if either BA[j] or BB[k] has a value of zero in each bit position. While vector A 310 and vector B 320 are 16 element vectors, any vectors with the same number of elements may be accommodated.

Figure 6D:
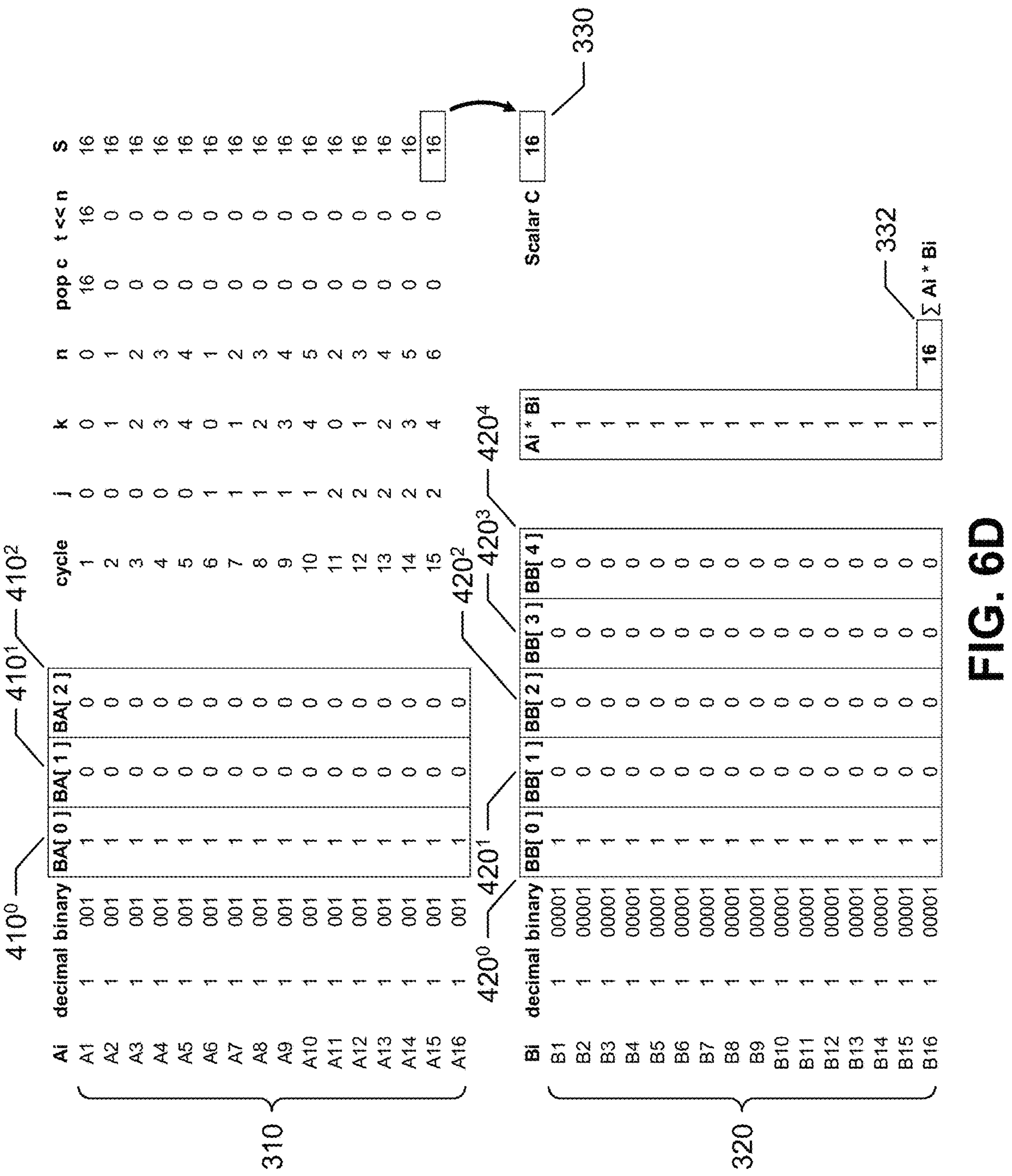

FIG. 6D depicts a first example of the computation of the dot product between vector A 310 and vector B 320 using 1-bit dot product unit 400, in accordance with an embodiment of the present disclosure.

Vector A 310 includes sixteen 3-bit elements, i.e., A1, A2, A3, A4, A5, A6, A7, A8, A9, A10, A11, A12, A13, A14, A15 and A16, all of which are equal to 1 (i.e., binary "001"). Vector B 320 includes sixteen 5-bit elements, i.e., B1, B2, B3, B4, B5, B6, B7, B8, B9, B10, B11, B12, B13, B14, B15 and B16, all of which are equal to 1 (i.e., binary "00001"). Bit slice vectors $\mathbf{410}^0$, $\mathbf{410}^1$ and $\mathbf{410}^2$ are depicted, as well as bit slice vectors $\mathbf{420}^0$, $\mathbf{420}^1$, $\mathbf{420}^2$, $\mathbf{420}^3$, and $\mathbf{420}^4$. Scalar C 330 is equal to 16. Result 332 is the result of the calculation of the decimal dot product, and is also equal to 16.

Figure 6E:
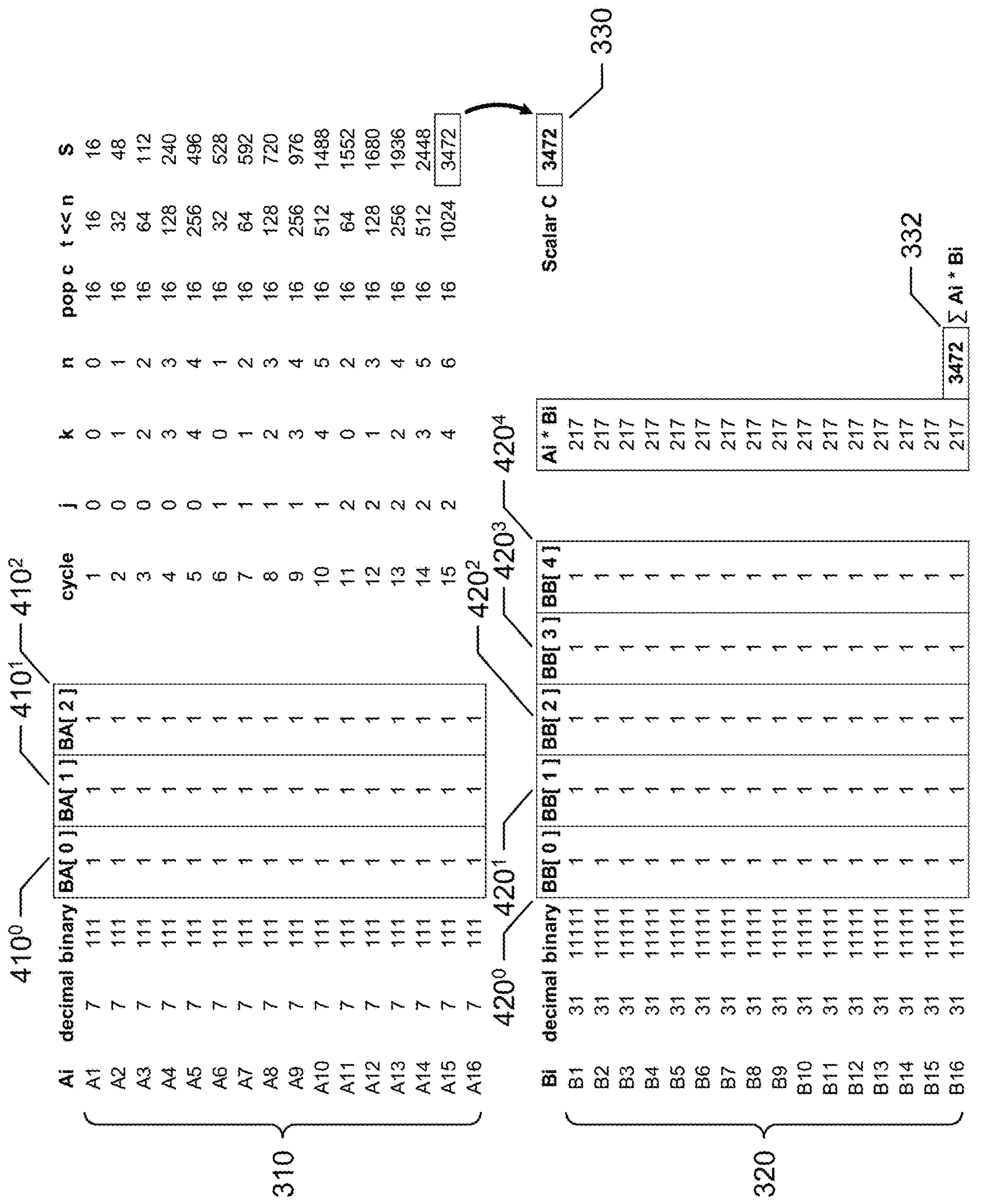

FIG. 6E depicts a second example of the computation of the dot product between vector A 310 and vector B 320 using 1-bit dot product unit 400, in accordance with an embodiment of the present disclosure.

Vector A 310 includes sixteen 3-bit elements, i.e., A1, A2, A3, A4, A5, A6, A7, A8, A9, A10, A11, A12, A13, A14, A15 and A16, all of which are equal to 7 (i.e., binary "111"). Vector B 320 includes sixteen 5-bit elements, i.e., B1, B2, B3, B4, B5, B6, B7, B8, B9, B10, B11, B12, B13, B14, B15 and B16, all of which are equal to 31 (i.e., binary "11111"). Bit slice vectors $\mathbf{410}^0$, $\mathbf{410}^1$ and $\mathbf{410}^2$ are depicted, as well as bit slice vectors $\mathbf{420}^0$, $\mathbf{420}^1$, $\mathbf{420}^2$, $\mathbf{420}^3$, and $\mathbf{420}^4$. Scalar C 330 is equal to 3,472, and result 332 is also equal to 3,472.

FIG. 6F depicts a third example of the computation of the dot product between vector A 310 and vector B 320 using 1-bit dot product unit 400, in accordance with an embodiment of the present disclosure.

Vector A 310 includes sixteen 3-bit elements, i.e., A1, A2, A3, A4, A5, A6, A7, A8, A9, A10, A11, A12, A13, A14, A15 and A16. A1 is equal to 0 (i.e., binary "000"), A2 is equal to 1 (i.e., binary "001"), A3 is equal to 1 (i.e., binary "001"), A4 is equal to 0 (i.e., binary "000"), A5 is equal to 3 (i.e., binary "011"), A6 is equal to 7 (i.e., binary "111"), A7 is equal to 7 (i.e., binary "111"), A8 is equal to 3 (i.e., binary "011"), A9 is equal to 3 (i.e., binary "011"), A10 is equal to 7 (i.e., binary "111"), A11 is equal to 7 (i.e., binary "111"), A12 is equal to 3 (i.e., binary "011"), A13 is equal to 0 (i.e., binary "000"), A14 is equal to 1 (i.e., binary "001"), A15 is equal to 1 (i.e., binary "001"), and A16 is equal to 0 (i.e., binary "000").

Vector B 320 includes sixteen 5-bit elements, i.e., B1, B2, B3, B4, B5, B6, B7, B8, B9, B10, B11, B12, B13, B14, B15 and B16·B1 is equal to 1 (i.e., binary "00001"), B2 is equal to 2 (i.e., binary "00010"), B3 is equal to 2 (i.e., binary "00010"), B4 is equal to 1 (i.e., binary "00001"), B5 is equal to 3 (i.e., binary "00011"), B6 is equal to 6 (i.e., binary "00110"), B7 is equal to 6 (i.e., binary "00110"), B8 is equal to 3 (i.e., binary "00011"), B9 is equal to 3 (i.e., binary "00011"), B10 is equal to 9 (i.e., binary "01001"), B11 is equal to 9 (i.e., binary "01001"), B12 is equal to 3 (i.e., binary "00011"), B13 is equal to 1 (i.e., binary "00001"), B14 is equal to 2 (i.e., binary "00010"), B15 is equal to 2 (i.e., binary "00010"), and B16 is equal to 1 (i.e., binary "00001").

Bit slice vectors $\mathbf{410}^0$, $\mathbf{410}^1$ and $\mathbf{410}^2$ are depicted, as well as bit slice vectors $\mathbf{420}^0$, $\mathbf{420}^1$, $\mathbf{420}^2$, $\mathbf{420}^3$, and $\mathbf{420}^4$. Scalar C 330 is equal to 254, and result 332 is also equal to 254.

In one embodiment, the conversion of vectors A and B to bit slice representation may be performed by a system processor, such as, for example, a central processing unit (CPU), etc. In another embodiment, the conversion of vectors A and B to bit slice representation may be performed by an MMA processor, such as, for example a processor or processor core, microprocessor, controller, microcontroller, etc.

Embodiments of the present disclosure advantageously break down variable bit-width vectors to 1-bit operations to increase power efficiency for variable bit-width matrix multiplications. The power reduction for the embodiment described above would be approximately (8·8)/(3·5)=64/15=4.3x.

In another embodiment, a first matrix and a second matrix are multiplied to generate a third matrix. The multiplication of each row of the first matrix with each column of the second matrix is a dot product operation that generates one element of the third matrix.

Figure 7A:
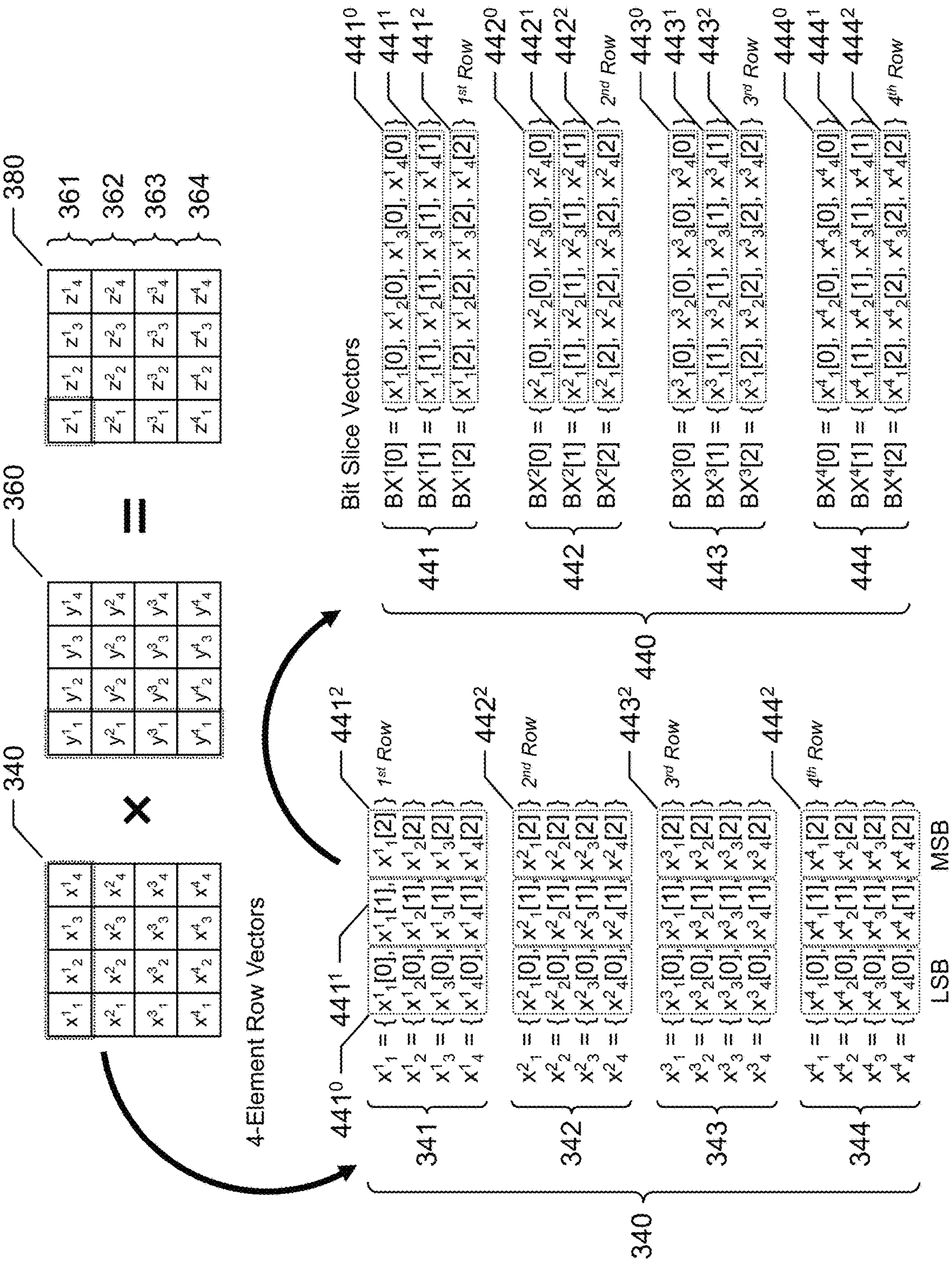
FIGS. 7A and 7B depict the creation of a bit slice tensor from a matrix X, in accordance with an embodiment of the present disclosure.
Figure 7B:
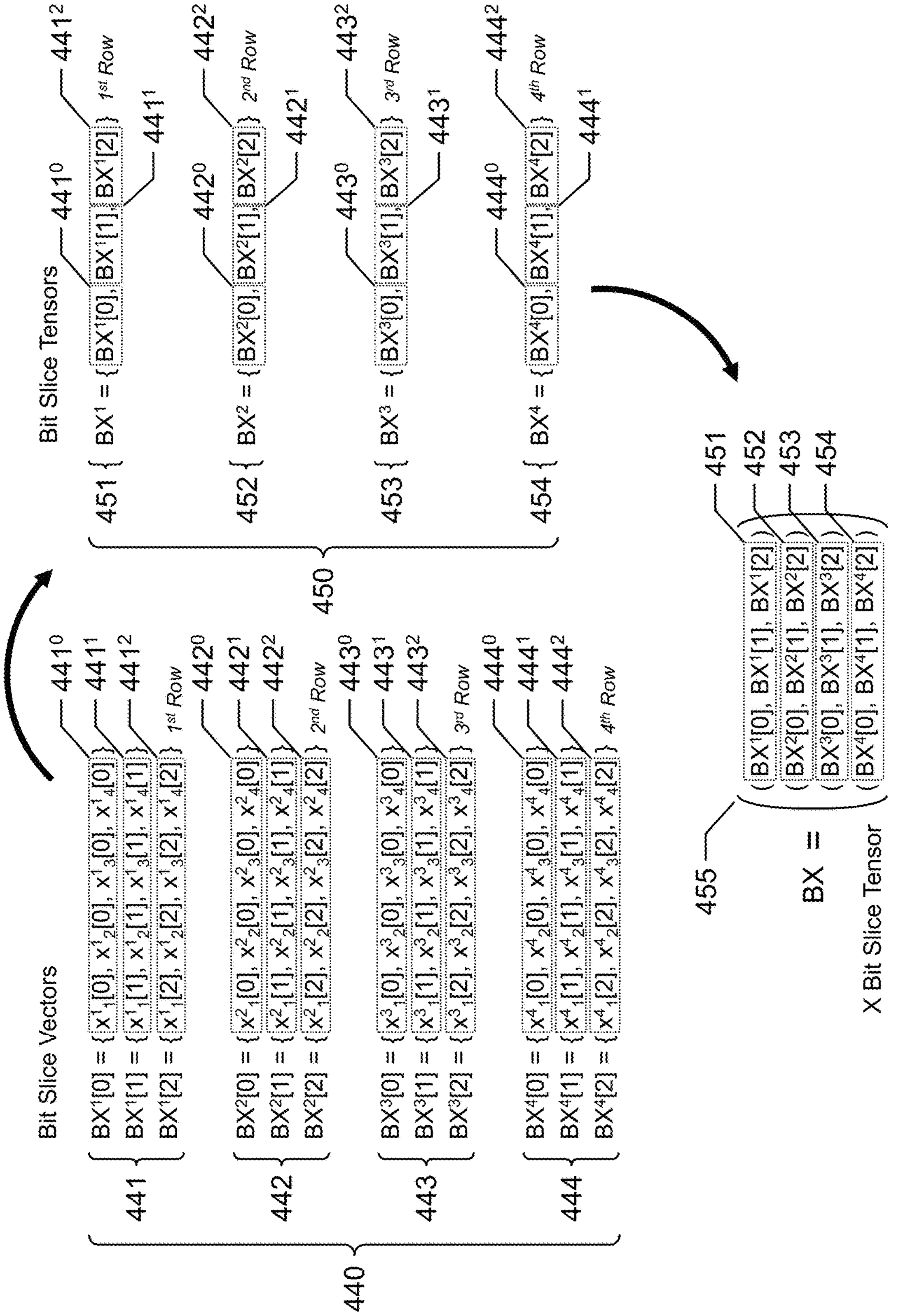

FIGS. 7A and 7B depict the creation of bit slice tensor 455 from matrix X 340, in accordance with an embodiment of the present disclosure.

Matrix X 340 and matrix Y 360 are multiplied to generate matrix Z 380. Matrix X 340 is a 4×4 matrix having 16 3-bit elements. The first row includes elements $x^1_1$, $x^1_2$, $x^1_3$ and $x^1_4$, the second row includes elements $x^2_1$, $x^2_2$, $x^2_3$ and $x^2_4$, the third row includes elements $x^3_1$, $x^3_2$, $x^3_3$ and $x^3_4$, and the fourth row includes elements $x^4_1$, $x^4_2$, $x^4_3$ and $x^4_4$.

Matrix Y 360 is a 4×4 matrix having 16 5-bit elements. The first column includes elements $y^1_1$, $y^2_1$, $y^3_1$ and $y^4_1$, the second column includes elements $y^1_2$, $y^2_2$, $y^3_2$ and $y^4_2$, the third column includes elements $y^1_3$, $y^2_3$, $y^3_3$ and $y^4_3$, and the fourth column includes elements $y^1_4$, $y^2_4$, $y^3_4$ and $y^4_4$.

Matrix Z 380 is a 4×4 matrix having 16 32-bit elements. The first row includes elements $z^1_1$, $z^1_2$, $z^1_3$ and $z^1_4$, the second row includes elements $z^2_1$, $z^2_2$, $z^2_3$ and $z^2_4$, the third row includes elements $z^3_1$, $z^3_2$, $z^3_3$ and $z^3_4$, and the fourth row includes elements $z^4_1$, $z^4_2$, $z^4_3$ and $z^4_4$.

Generally, the elements of the rows of matrix X 340 are first arranged in bit vector form. The elements of the first row of matrix X 340 are arranged in bit vector form as bit vector X 341, the elements of the second row of matrix X 340 are arranged in bit vector form as bit vector X 342, the elements of the third row of matrix X 340 are arranged in bit vector form as bit vector X 343, and the elements of the fourth row of matrix X 340 are arranged in bit vector form as bit vector X 344.

The bit vector for each element of bit vectors X 341, 342, 343 and 344 is a sequence of bits from the LSB (i.e., bit position "0") to the MSB (i.e., bit position "2"). With respect to bit vector X 341, the bit vector for element $x^1_1$ is $\{x^1_1[0], x^1_1[1], x^1_1[2]\}$, where $x^1_1[0]$ is the value of the bit at the first bit position (i.e., the LSB), $x^1_1[1]$ is the value of the bit at the second bit position, and $x^1_1[2]$ is the value of the bit at the third bit position (i.e., the MSB). Similarly, the bit vector for element $x^1_2$ is $\{x^1_2[0], x^1_2[1], x^1_2[2]\}$, the bit vector for element $x^1_3$ is $\{x^1_3[0], x^1_3[1], x^1_3[2]\}$, and the bit vector for element $x^1_4$ is $\{x^1_4[0], x^1_4[1], x^1_4[2]\}$. Bit vectors X 342, 343 and 344 are formed in a similar manner from the second, third and fourth rows of matrix X 340, respectively.

Bit slice vector set 440 includes bit slice vectors 441, 442, 443 and 444, which are formed from bit vectors X 341, 342, 343 and 344, respectively. Bit slice vector $\mathbf{441}^0$ is a sequence of bits formed from the bit at the first bit position of each element of bit vector X 341, i.e., $\{x^1_1[0], x^1_2[0], x^1_3[0], x^1_4[0]\}$. Bit slice vector $\mathbf{441}^1$ is a sequence of bits formed from the bit at the second bit position of each element of bit vector X 341, i.e., $\{x^1_1[1], x^1_2[1], x^1_3[1], x^1_4[1]\}$. Bit slice vector $\mathbf{441}^2$ is a sequence of bits formed from the bit at the third bit position of each element of bit vector X 341, i.e., $\{x^1_1[2], x^1_2[2], x^1_3[2], x^1_4[2]\}$.

Bit slice vectors 442, 443 and 444 are formed in a similar manner from bit vectors X 342, 343 and 344, respectively. Bit slice vectors 442 include bit slice vectors $\mathbf{442}^0$, $\mathbf{442}^1$ and $\mathbf{442}^2$, bit slice vectors 443 include bit slice vectors $\mathbf{443}^0$, $\mathbf{443}^1$ and $\mathbf{443}^2$, and bit slice vectors 444 include bit slice vectors $\mathbf{444}^0$, $\mathbf{444}^1$ and $\mathbf{444}^2$.

Bit slice tensor set 450 includes bit slice tensors 451, 452, 453 and 454, which are formed from bit slice vectors 441, 442, 443 and 444, respectively. Bit slice tensor 451 is formed from the sequence of bit slice vectors $\mathbf{441}^0$, $\mathbf{441}^1$, and $\mathbf{441}^2$. Bit slice tensor 452 is formed from the sequence of bit slice vectors $\mathbf{442}^0$, $\mathbf{442}^1$, and $\mathbf{442}^2$. Bit slice tensor 453 is formed from the sequence of bit slice vectors $\mathbf{443}^0$, $\mathbf{443}^1$, and $\mathbf{443}^2$. Bit slice tensor 454 is formed from the sequence of bit slice vectors $\mathbf{444}^0$, $\mathbf{444}^1$, and $\mathbf{444}^2$.

X bit slice tensor 455 is formed from bit slice tensors 451, 452, 453 and 454.

Figure 7C:
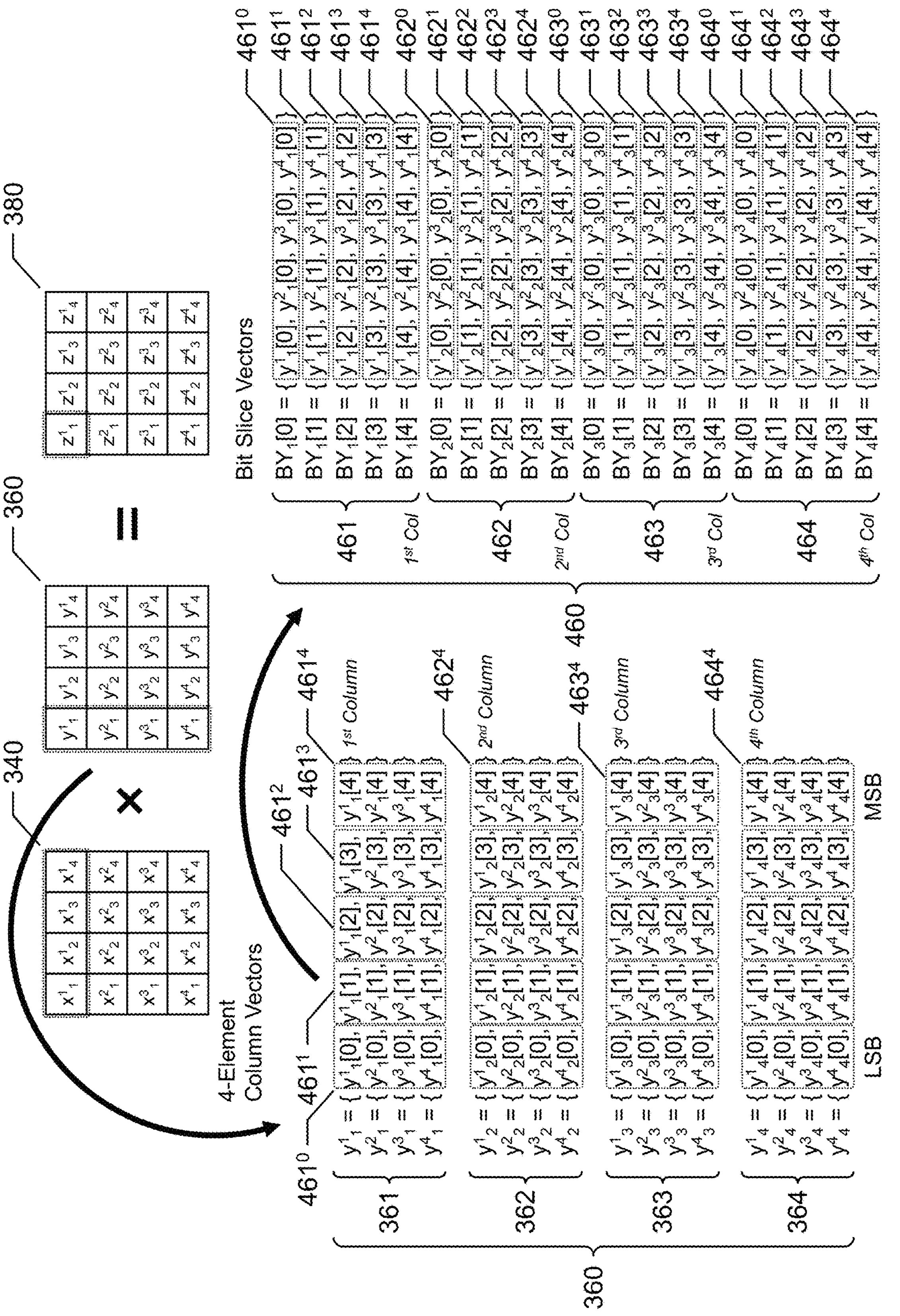
FIGS. 7C and 7D depict the creation of a bit slice tensor from a matrix Y, in accordance with an embodiment of the present disclosure.
Figure 7D:
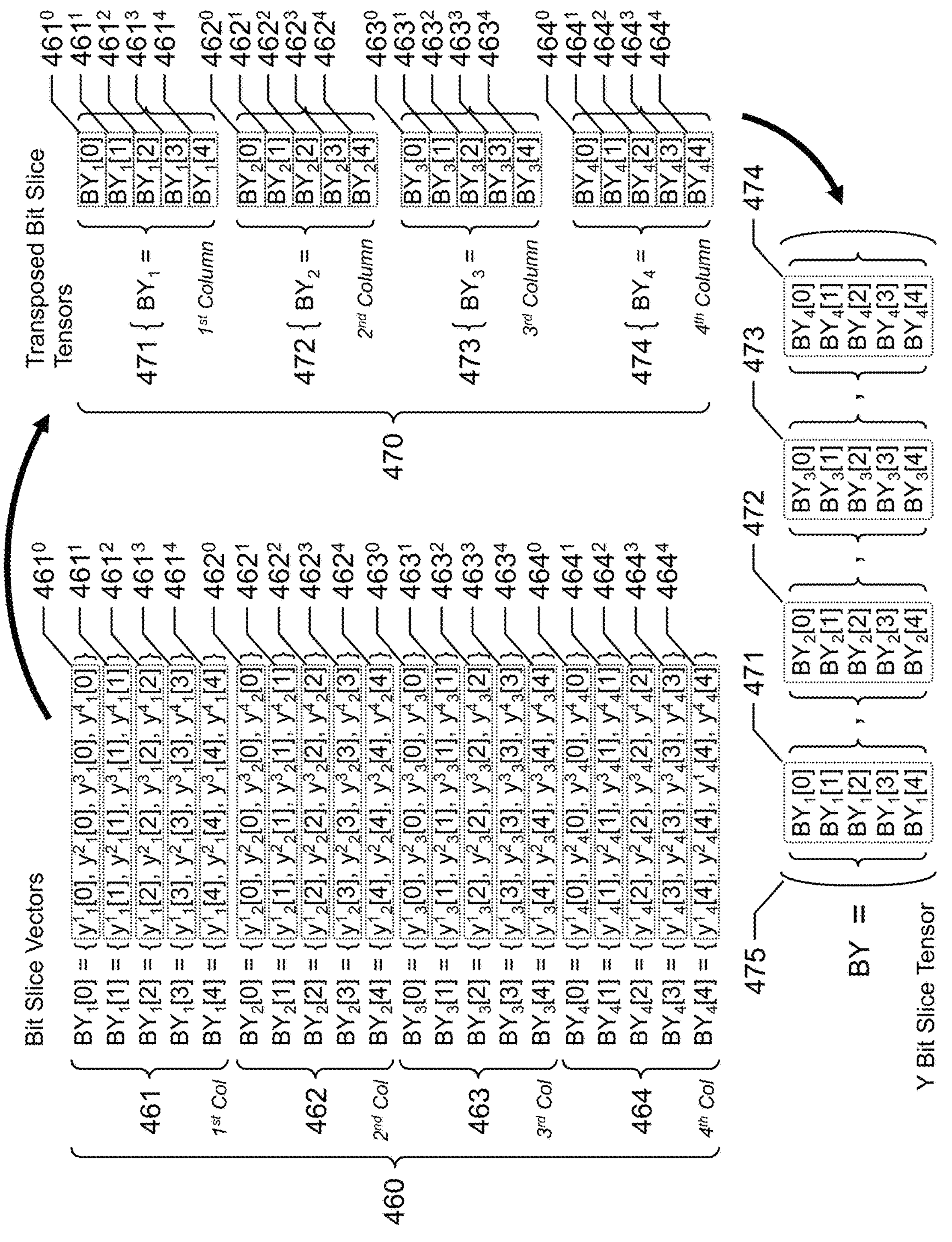

FIGS. 7C and 7D depict the creation of bit slice tensor 475 from matrix Y 360, in accordance with an embodiment of the present disclosure.

Generally, the elements of the columns of matrix Y 360 are first arranged in bit vector form. The elements of the first column of matrix Y 360 are arranged in bit vector form as bit vector Y 361, the elements of the second column of matrix Y 360 are arranged in bit vector form as bit vector Y 362, the elements of the third column of matrix Y 360 are arranged in bit vector form as bit vector Y 363, and the elements of the fourth column of matrix Y 360 are arranged in bit vector form as bit vector Y 364.

The bit vector for each element of bit vectors Y 361, 362, 363 and 364 is a sequence of bits from the LSB (i.e., bit position "0") to the MSB (i.e., bit position "4"). With respect to bit vector Y 361, the bit vector for element $y^1_1$ is {$y^1_1[0]$, $y^1_1[1]$, $y^1_1[2]$, $y^1_1[3]$, $y^1_1[4]$}, where $y^1_1[0]$ is the value of the bit at the first bit position (i.e., the LSB), $y^1_1[1]$ is the value of the bit at the second bit position, $y^1_1[2]$ is the value of the bit at the third bit position, $y^1_1[3]$ is the value of the bit at the fourth bit position, and $y^1_1[4]$ is the value of the bit at the fifth bit position (i.e., the MSB). Similarly, the bit vector for element $y^2_1$ is {$y^2_1[0]$, $y^2_1[1]$, $y^2_1[2]$, $y^2_1[3]$, $y^2_1[4]$}, the bit vector for element $y^3_1$ is {$y^3_1[0]$, $y^3_1[1]$, $y^3_1[2]$, $y^3_1[3]$, $y^3_1[4]$}, and the bit vector for element $y^4_1$ is {$y^4_1[0]$, $y^4_1[1]$, $y^4_1[2]$, $y^4_1[3]$, $y^4_1[4]$}. Bit vectors Y 362, 363 and 363 are formed in a similar manner from the second, third and fourth columns of matrix Y 360, respectively.

Bit slice vector set 460 includes bit slice vectors 461, 462, 463 and 464, which are formed from bit vectors Y 361, 362, 363 and 364, respectively. Bit slice vector $\mathbf{461}^0$ is a sequence of bits formed from the bit at the first bit position of each element of bit vector Y 361, i.e., {$y^1_1[0]$, $y^2_1[0]$, $y^3_1[0]$, $y^4_1[0]$}. Bit slice vector $\mathbf{461}^1$ is a sequence of bits formed from the bit at the second bit position of each element of bit vector Y 361, i.e., {$y^1_1[1]$, $y^2_1[1]$, $y^3_1[1]$, $y^4_1[1]$}. Bit slice vector $\mathbf{461}^2$ is a sequence of bits formed from the bit at the third bit position of each element of bit vector Y 361, i.e., {$y^1_1[2]$, $y^2_1[2]$, $y^3_1[2]$, $y^4_1[2]$}. Bit slice vector $\mathbf{461}^3$ is a sequence of bits formed from the bit at the fourth bit position of each element of bit vector Y 361, i.e., {$y^1_1[3]$, $y^2_1[3]$, $y^3_1[3]$, $y^4_1[3]$}. Bit slice vector $\mathbf{461}^4$ is a sequence of bits formed from the bit at the fifth bit position of each element of bit vector Y 361, i.e., {$y^1_1[4]$, $y^2_1[4]$, $y^3_1[4]$, $y^4_1[4]$}.

Bit slice vectors 462, 463 and 464 are formed in a similar manner from bit vectors Y 362, 363 and 364, respectively. Bit slice vectors 462 include bit slice vectors $\mathbf{462}^0$, $\mathbf{462}^1$, $\mathbf{462}^2$, $\mathbf{462}^3$ and $\mathbf{462}^4$, bit slice vectors 463 include bit slice vectors $\mathbf{463}^0$, $\mathbf{463}^1$, $\mathbf{463}^2$, $\mathbf{463}^3$ and $\mathbf{463}^4$, and bit slice vectors 464 include bit slice vectors $\mathbf{464}^0$, $\mathbf{464}^1$, $\mathbf{464}^2$, $\mathbf{464}^3$ and $\mathbf{464}^4$.

Bit slice tensor set 470 includes bit slice tensors 471, 472, 473 and 474, which are formed from bit slice vectors 461, 462, 463 and 464, respectively. Bit slice tensor 471 is formed from the sequence of bit slice vectors $\mathbf{461}^0$, $\mathbf{461}^1$, $\mathbf{461}^2$, $\mathbf{461}^3$ and $\mathbf{461}^4$. Bit slice tensor 472 is formed from the sequence of bit slice vectors $\mathbf{462}^0$, $\mathbf{462}^1$, $\mathbf{462}^2$, $\mathbf{462}^3$ and $\mathbf{462}^4$. Bit slice tensor 473 is formed from the sequence of bit slice vectors $\mathbf{463}^0$, $\mathbf{463}^1$, $\mathbf{463}^2$, $\mathbf{463}^3$ and $\mathbf{463}^4$. Bit slice tensor 474 is formed from the sequence of bit slice vectors $\mathbf{464}^0$, $\mathbf{464}^1$, $\mathbf{464}^2$, $\mathbf{464}^3$ and $\mathbf{464}^4$.

Y bit slice tensor 475 is formed from bit slice tensors 471, 472, 473 and 474.

Figure 8A:
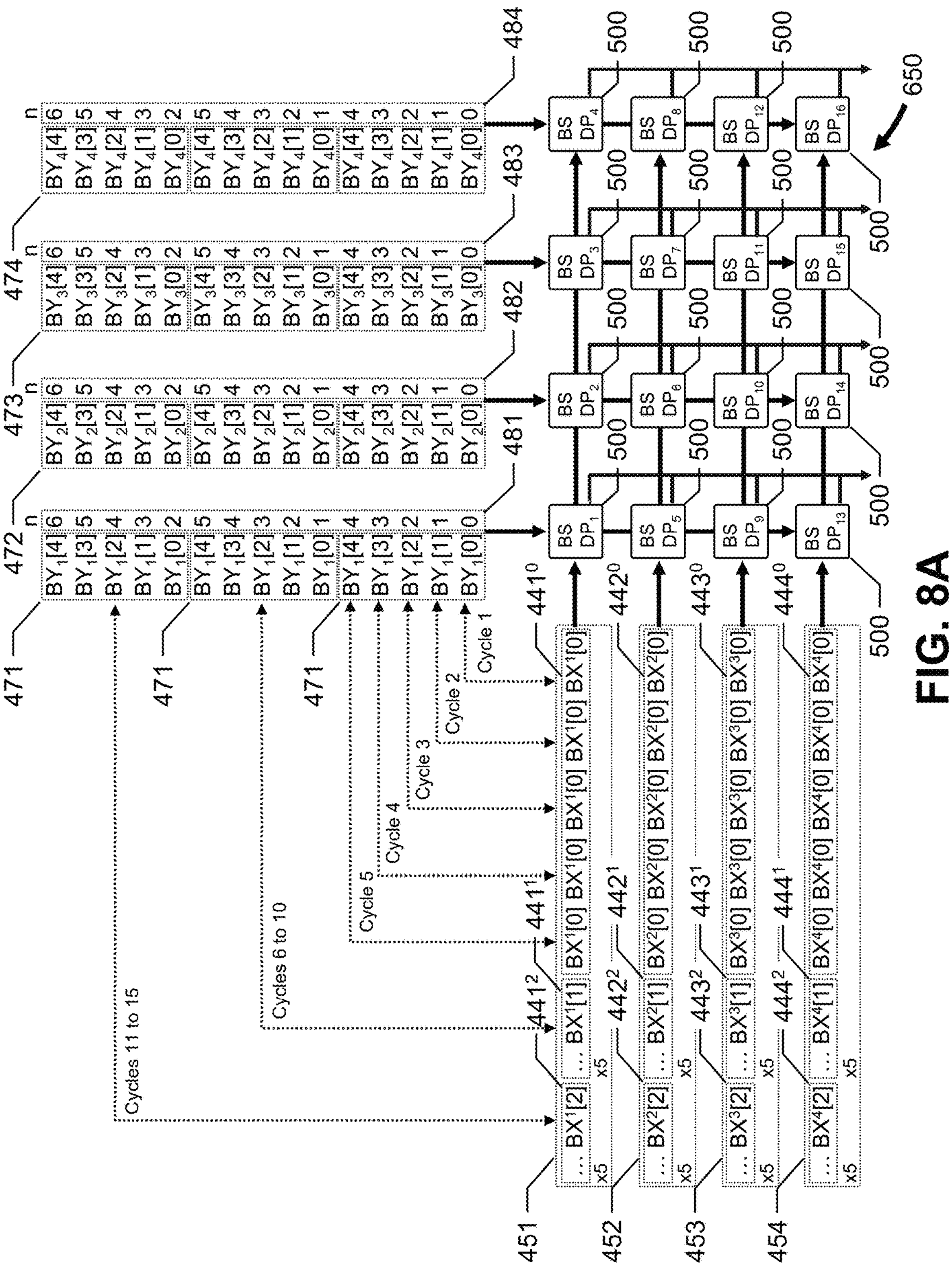
Figure 8B:
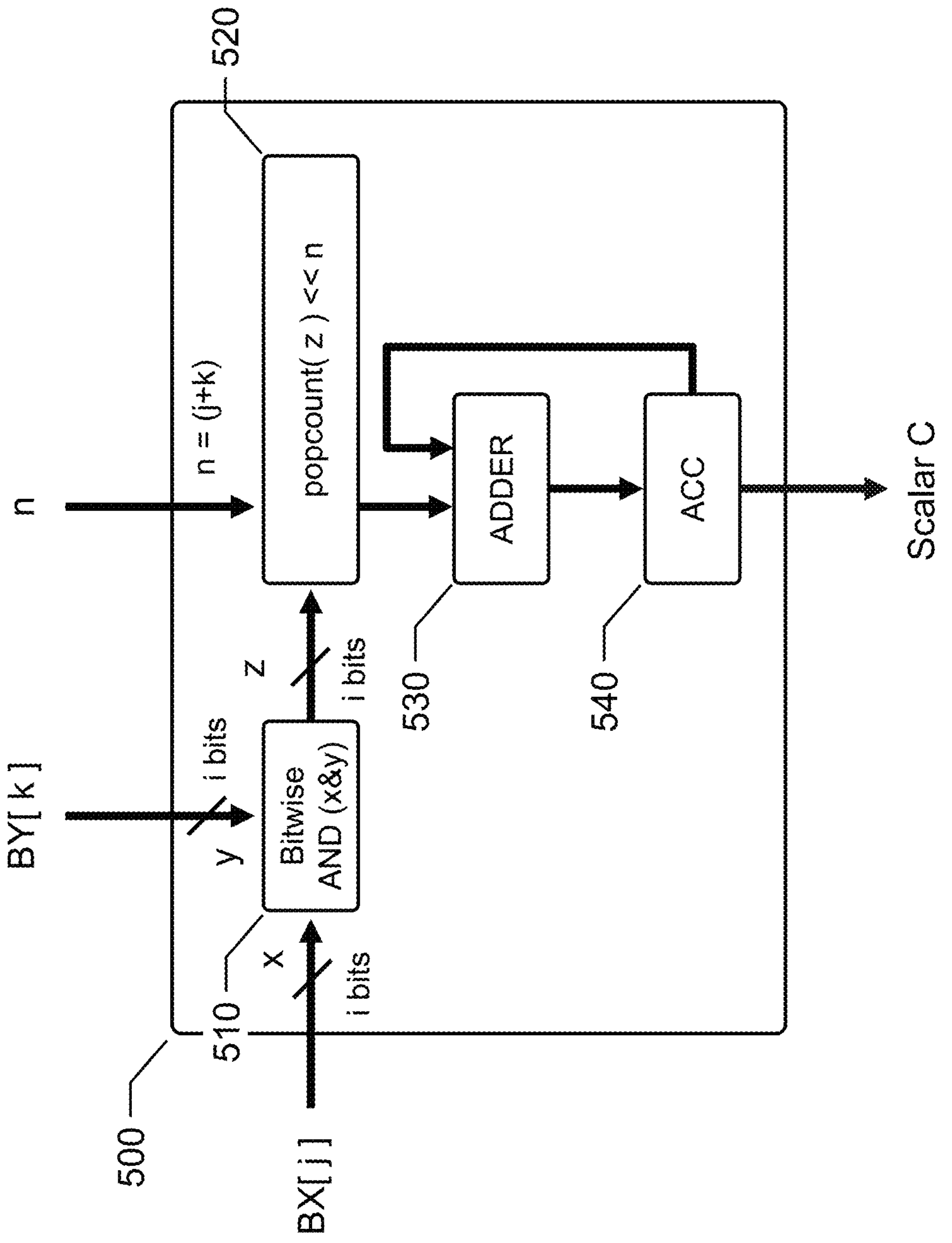
FIG. 8B depicts a BSDP unit, in accordance with embodiments of the present disclosure.

FIG. 8A depicts a data flow diagram for BSDP array 650, while FIG. 8B depicts BSDP unit 500, in accordance with embodiments of the present disclosure.

In this embodiment, BSDP array 650 is an output stationary array that implements a bit slice dot product operation using a 4×4 array of BSDP units 500, i.e., $BSDP_1$, $BSDP_2$, $BSDP_3$, $BSDP_4$, $BSDP_5$, $BSDP_6$, $BSDP_7$, $BSDP_8$, $BSDP_9$, $BSDP_{10}$, $BSDP_{11}$, $BSDP_{12}$, $BSDP_{13}$, $BSDP_{14}$, $BSDP_{15}$ and $BSDP_{16}$. Each BSDP unit 500 calculates a dot product between one row of matrix X and one column of matrix Y by multiplying certain elements of X bit slice tensor 455 and certain elements of Y bit slice tensor 475, in a particular sequence, and then outputting the result.

For example, $BSDP_1$ multiplies bit slice tensors 451 and 471, accumulates the intermediate products and then generates the result. As described above, bit slice tensor 451 represents the elements of the first row of matrix X 340 (i.e., $x^1_1$, $x^1_2$, $x^1_3$ and $x^1_4$), and bit slice tensor 471 represents the elements of the first column of matrix Y 360 (i.e., $y^1_1$, $y^2_1$, $y^3_1$ and $y^4_1$), and the result is $z^1_1$. In addition to the bit slice vectors of bit slice tensor 451 and the bit slice vectors of bit slice tensor 471, the sum of indices j and k, i.e., "n" as indicated by 481, 482, 483 and 484, is provided to $BSDP_1$.

BSDP array 650 may be a systolic or non-systolic array. FIG. 8A depicts the data flow for a non-systolic array. During each processing cycle, the appropriate element of X bit slice tensor 455 is provided to each BSDP unit 500 in each row, and the appropriate element of Y bit slice tensor 475 is provided to each BSDP unit 500 in each column. For example, during the first processing cycle (i.e., Cycle 1), bit slice vector $\mathbf{441}^0$ (i.e., $BX^1[0]$) is provided to $BSDP_1$, $BSDP_2$, $BSDP_3$ and $BSDP_4$, while bit slice vector $\mathbf{461}^0$ (i.e., $BY^1[0]$) is provided to $BSDP_1$, $BSDP_5$, $BSDP_9$ and $BSDP_{13}$.

Advantageously, BSDP unit 500 calculates the dot product between a row of a first matrix and a column of a second matrix with the same or different bit-width elements.

BSDP unit 500 includes bitwise AND circuit 510, intermediate product circuit 520, adder circuit 530 and accumulator register 540. BSDP unit 500 receives a bit slice vector BX[j], a bit slice vector BY[k], and "n". Bitwise AND circuit 510 performs a bitwise AND on BX[j] and BY[k] to generate an intermediate bit vector z. Intermediate product circuit 520 determines the number of ones in the intermediate bit vector z, left-shifts this count by index sum "n" to generate an intermediate product. Adder circuit 530 adds the intermediate value to the value stored in accumulator register 540, and then stores the accumulated value in accumulator register 540.

In many embodiment, the elements of matrix X 340 and matrix Y 360 are unsigned integer values (e.g., UINT8, UINT32, etc.). In certain embodiments, the elements of matrix X 340 and matrix Y 360 may be signed or unsigned integer values, and a sign signal may be generated for each processing cycle and provided to each BSDP unit 500 to correct the accumulated value for the sign of the matrix elements, which advantageously supports processing signed operations as well as mixed unsigned and signed operations.

Figure 8C:
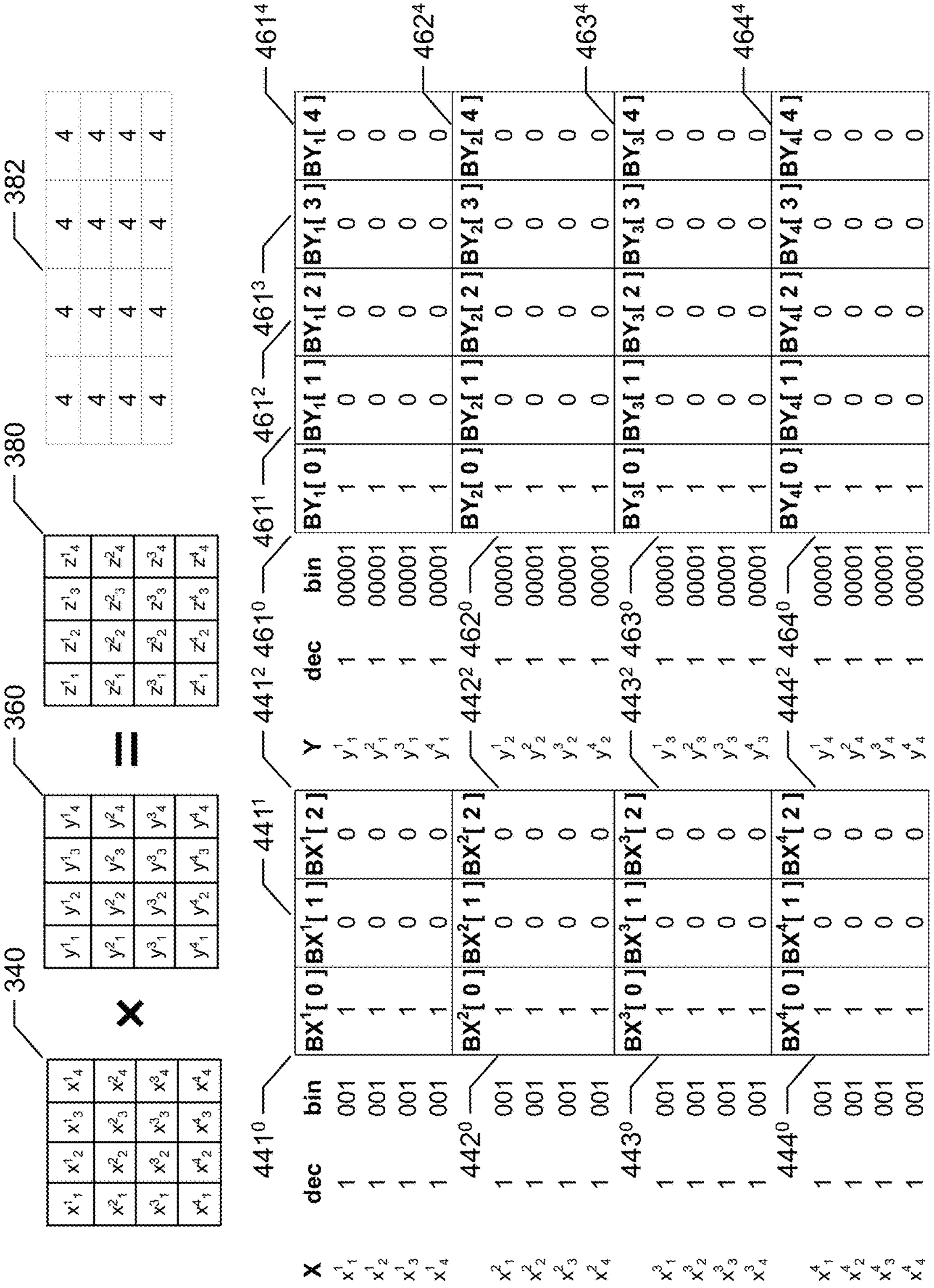

FIGS. 8C and 8D depict a first example of the multiplication of matrix X 340 and matrix Y 360 to generate matrix Z 380 using BSDP array 650, in accordance with an embodiment of the present disclosure.

Matrix X 340 includes sixteen 3-bit elements, i.e., $x^1_1$, $x^1_2$, $x^1_3$, $x^1_4$, $x^2_1$, $x^2_2$, $x^2_3$, $x^2_4$, $x^3_1$, $x^3_2$, $x^3_3$, $x^3_4$, $x^4_1$, $x^4_2$, $x^4_3$ and $x^4_4$, all of which are equal to 1 (i.e., binary "001"). Matrix Y 360 includes sixteen 5-bit elements, i.e., $y^1_1$, $y^2_1$, $y^3_1$, $y^4_1$, $y^1_2$, $y^2_2$, $y^3_2$, $y^4_2$, $y^1_3$, $y^2_3$, $y^3_3$, $y^4_3$, $y^1_4$, $y^2_4$, $y^3_4$ and $y^4_4$, all of which are equal to 1 (i.e., binary "00001"). Matrix Z 380 includes sixteen 32-bit elements, i.e., $z^1_1$, $z^1_2$, $z^1_3$, $z^1_4$, $z^2_1$, $z^2_2$, $z^2_3$, $z^2_4$, $z^3_1$, $z^3_2$, $z^3_3$, $z^3_4$, $z^4_1$, $z^4_2$, $z^4_3$ and $z^4_4$. Result matrix 382 presents the result of multiplying the decimal values of matrix X 340 and matrix Y 360; the values of all of the elements of result matrix 382 are equal to 4.

Bit slice vectors $\mathbf{441}^0$, $\mathbf{441}^1$ and $\mathbf{441}^2$ of bit slice tensor 451, bit slice vectors $\mathbf{442}^0$, $\mathbf{442}^1$ (not labeled for clarity) and $\mathbf{442}^2$ of bit slice tensor 452, bit slice vectors $\mathbf{443}^0$, $\mathbf{443}^1$ (not labeled for clarity) and $\mathbf{443}^2$ of bit slice tensor 453, and bit slice vectors $\mathbf{444}^0$, $\mathbf{444}^1$ (not labeled for clarity) and $\mathbf{444}^2$ of bit slice tensor 454 are depicted.

Similarly, bit slice vectors $\mathbf{461}^0$, $\mathbf{461}^1$, $\mathbf{461}^2$, $\mathbf{461}^3$ and $\mathbf{461}^4$ of bit slice tensor 471, bit slice vectors $\mathbf{462}^0$, $\mathbf{462}^1$ (not labeled for clarity), $\mathbf{462}^2$ (not labeled for clarity), $\mathbf{462}^3$ (not labeled for clarity) and $\mathbf{462}^4$ of bit slice tensor 472, bit slice vectors $\mathbf{463}^0$, $\mathbf{463}^1$ (not labeled for clarity), $\mathbf{463}^2$ (not labeled for clarity), $\mathbf{463}^3$ (not labeled for clarity) and $\mathbf{463}^4$ of bit slice tensor 473, and bit slice vectors $\mathbf{464}^0$, $\mathbf{464}^1$ (not labeled for clarity), 464$^2$ (not labeled for clarity), 464$^3$ (not labeled for clarity) and 464$^4$ of bit slice tensor 474 are depicted.

Computation array 384 depicts the computation of the bit slice dot product between a respective row of matrix X 340 and a respective column of matrix Y 360 by each BSDB unit 500 in BSDP array 650. The dot product computation is described above with respect to 1-bit dot product unit 400.

The value for each element of matrix z 380 depicted in FIG. 8D, i.e., $z^1_1$, $z^1_2$, $z^1_3$, $z^1_4$, $z^2_1$, $z^2_2$, $z^2_3$, $z^2_4$, $z^3_1$, $z^3_2$, $z^3_3$, $z^3_4$, $z^4_1$, $z^4_2$, $z^4_3$ and $z^4_4$, are depicted in a box directly beneath the element name. The values of all of the elements of matrix z 380 are equal to 4, and match the values of the elements of results matrix 382 depicted in FIG. 8C.

Figure 8E:
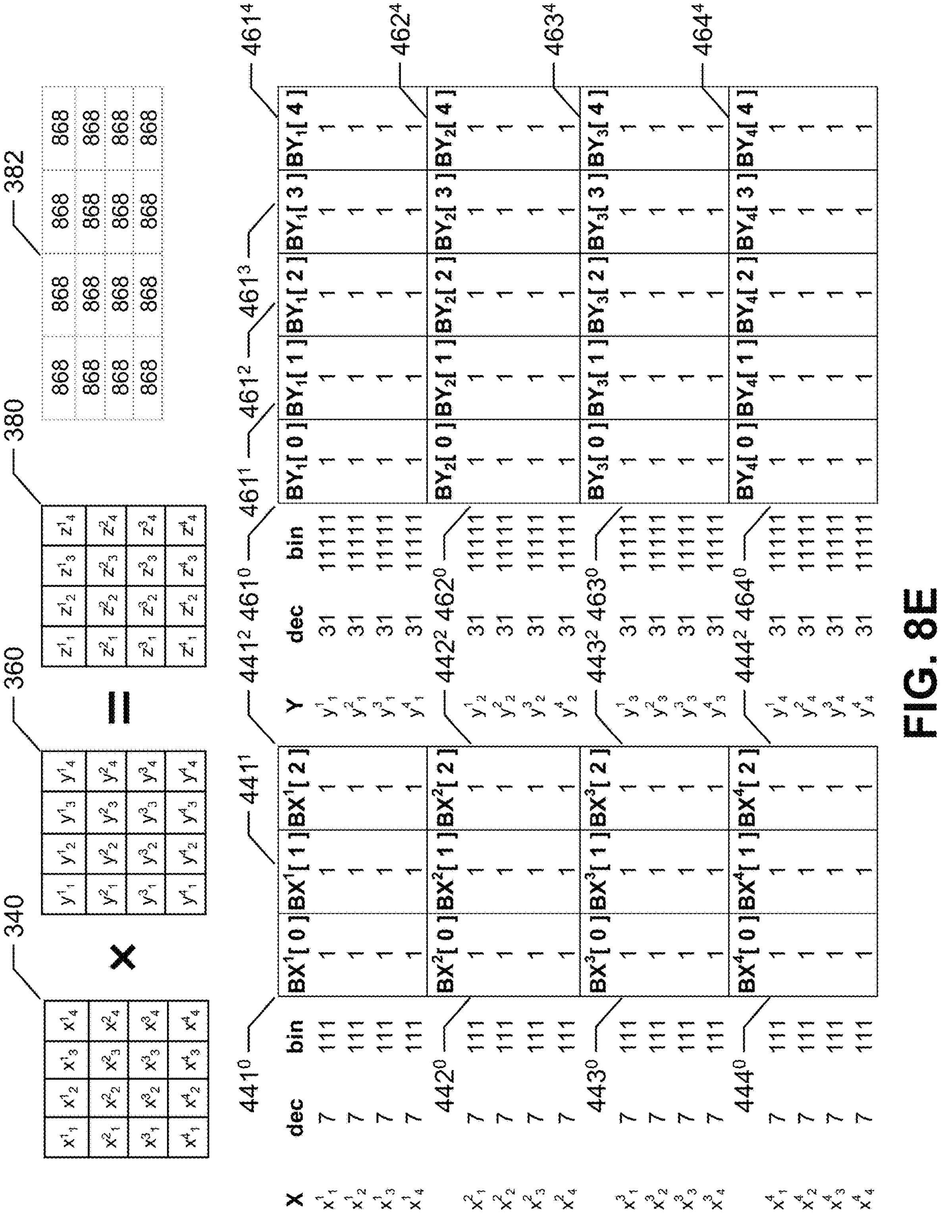

FIGS. 8E and 8F depict a second example of the multiplication of matrix X 340 and matrix Y 360 to generate matrix Z 380 using BSDP array 650, in accordance with an embodiment of the present disclosure.

Matrix X 340 includes sixteen 3-bit elements, i.e., $x^1_1$, $x^1_2$, $x^1_3$, $x^1_4$, $x^2_1$, $x^2_2$, $x^2_3$, $x^2_4$, $x^3_1$, $x^3_2$, $x^3_3$, $x^3_4$, $x^4_1$, $x^4_2$, $x^4_3$ and $x^4_4$, all of which are equal to 7 (i.e., binary "111"). Matrix Y 360 includes sixteen 5-bit elements, i.e., $y^1_1$, $y^2_1$, $y^3_1$, $y^4_1$, $y^1_2$, $y^2_2$, $y^3_2$, $y^4_2$, $y^1_3$, $y^2_3$, $y^3_3$, $y^4_3$, $y^1_4$, $y^2_4$, $y^3_4$ and $y^4_4$, all of which are equal to 31 (i.e., binary "11111"). Matrix Z 380 includes sixteen 32-bit elements, i.e., $z^1_1$, $z^1_2$, $z^1_3$, $z^1_4$, $z^2_1$, $z^2_2$, $z^2_3$, $z^2_4$, $z^3_1$, $z^3_2$, $z^3_3$, $z^3_4$, $z^4_1$, $z^4_2$, $z^4_3$ and $z^4_4$. Result matrix 382 presents the result of multiplying the decimal values of matrix X 340 and matrix Y 360; the values of all of the elements of result matrix 382 are equal to 868.

Bit slice vectors 441$^0$, 441$^1$ and 441$^2$ of bit slice tensor 451, bit slice vectors 442$^0$, 442$^1$ (not labeled for clarity) and 442$^2$ of bit slice tensor 452, bit slice vectors 443$^0$, 443$^1$ (not labeled for clarity) and 443$^2$ of bit slice tensor 453, and bit slice vectors 444$^0$, 444$^1$ (not labeled for clarity) and 444$^2$ of bit slice tensor 454 are depicted.

Similarly, bit slice vectors 461$^0$, 461$^1$, 461$^2$, 461$^3$ and 461$^4$ of bit slice tensor 471, bit slice vectors 462$^0$, 462$^1$ (not labeled for clarity), 462$^2$ (not labeled for clarity), 462$^3$ (not labeled for clarity) and 462$^4$ of bit slice tensor 472, bit slice vectors 463$^0$, 463$^1$ (not labeled for clarity), 463$^2$ (not labeled for clarity), 463$^3$ (not labeled for clarity) and 463$^4$ of bit slice tensor 473, and bit slice vectors 464$^0$, 464$^1$ (not labeled for clarity), 464$^2$ (not labeled for clarity), 464$^3$ (not labeled for clarity) and 464$^4$ of bit slice tensor 474 are depicted.

Computation array 384 depicts the computation of the bit slice dot product between a respective row of matrix X 340 and a respective column of matrix Y 360 by each BSDB unit 500 in BSDP array 650. The dot product computation is described above with respect to 1-bit dot product unit 400.

The value for each element of matrix z 380 depicted in FIG. 8F, i.e., $z^1_1$, $z^1_2$, $z^1_3$, $z^1_4$, $z^2_1$, $z^2_2$, $z^2_3$, $z^2_4$, $z^3_1$, $z^3_2$, $z^3_3$, $z^3_4$, $z^4_1$, $z^4_2$, $z^4_3$ and $z^4_4$, are depicted in a box directly beneath the element name. The values of all of the elements of matrix z 380 are equal to 868, and match the values of the elements of results matrix 382 depicted in FIG. 8E.

Figure 8G:
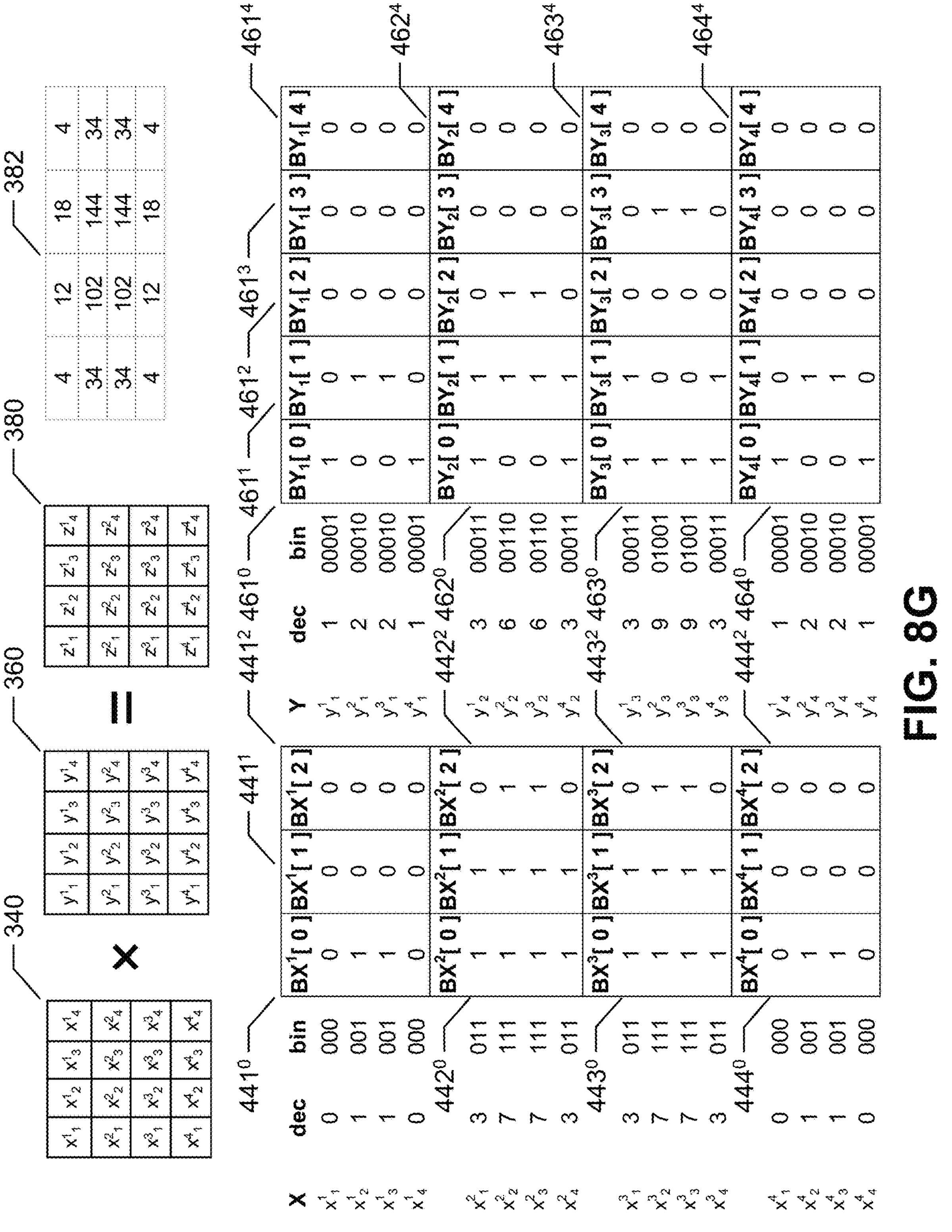

FIGS. 8G and 8H depict a third example of the multiplication of matrix X 340 and matrix Y 360 to generate matrix Z 380 using BSDP array 650, in accordance with an embodiment of the present disclosure.

Matrix X 340 includes sixteen 3-bit elements, i.e., $x^1_1$, $x^1_2$, $x^1_3$, $x^1_4$, $x^2_1$, $x^2_2$, $x^2_3$, $x^2_4$, $x^3_1$, $x^3_2$, $x^3_3$, $x^3_4$, $x^4_1$, $x^4_2$, $x^4_3$ and $x^4_4$. Element $x^1_1$ is equal to 0 (i.e., binary "000"), $x^1_2$ is equal to 1 (i.e., binary "001"), $x^1_3$ is equal to 1 (i.e., binary "001"), $x^1_4$ is equal to 0 (i.e., binary "000"), $x^2_1$ is equal to 3 (i.e., binary "011"), $x^2_2$ is equal to 7 (i.e., binary "111"), $x^2_3$ is equal to 7 (i.e., binary "111"), $x^2_4$ is equal to 3 (i.e., binary "011"), $x^3_1$ is equal to 3 (i.e., binary "011"), $x^3_2$ is equal to 7 (i.e., binary "111"), $x^3_3$ is equal to 7 (i.e., binary "111"), $x^3_4$ is equal to 3 (i.e., binary "011"), $x^4_1$ is equal to 0 (i.e., binary "00"), $x^4_2$ is equal to 1 (i.e., binary "001"), $x^4_3$ is equal to 1 (i.e., binary "001"), and $x^4_4$ is equal to 0 (i.e., binary "000").

Matrix Y 360 includes sixteen 5-bit elements, i.e., $y^1_1$, $y^2_1$, $y^3_1$, $y^4_1$, $y^1_2$, $y^2_2$, $y^3_2$, $y^4_2$, $y^1_3$, $y^2_3$, $y^3_3$, $y^4_3$, $y^1_4$, $y^2_4$, $y^3_4$ and $y^4_4$. Element $y^1_1$ is equal to 1 (i.e., binary "00001"), $y^2_1$ is equal to 2 (i.e., binary "00010"), $y^3_1$ is equal to 2 (i.e., binary "00010"), $y^4_1$ is equal to 1 (i.e., binary "00001"), $y^1_2$ is equal to 3 (i.e., binary "00011"), $y^2_2$ is equal to 6 (i.e., binary "00110"), $y^3_2$ is equal to 6 (i.e., binary "00110"), $y^4_2$ is equal to 3 (i.e., binary "00011"), $y^1_3$ is equal to 3 (i.e., binary "00011"), $y^2_3$ is equal to 9 (i.e., binary "01001"), $y^3_3$ is equal to 9 (i.e., binary "01001"), $y^4_3$ is equal to 3 (i.e., binary "00011"), $y^1_4$ is equal to 1 (i.e., binary "001"), $y^2_4$ is equal to 2 (i.e., binary "0010"), $y^3_4$ is equal to 2 (i.e., binary "00010"), and $y^4_4$ is equal to 1 (i.e., binary "00001").

Matrix Z 380 includes sixteen 32-bit elements, i.e., $z^1_1$, $z^1_2$, $z^1_3$, $z^1_4$, $z^2_1$, $z^2_2$, $z^2_3$, $z^2_4$, $z^3_1$, $z^3_2$, $z^3_3$, $z^3_4$, $z^4_1$, $z^4_2$, $z^4_3$ and $z^4_4$. Result matrix 382 presents the result of multiplying the decimal values of matrix X 340 and matrix Y 360.

Bit slice vectors 441$^0$, 441$^1$ and 441$^2$ of bit slice tensor 451, bit slice vectors 442$^0$, 442$^1$ (not labeled for clarity) and 442$^2$ of bit slice tensor 452, bit slice vectors 443$^0$, 443$^1$ (not labeled for clarity) and 443$^2$ of bit slice tensor 453, and bit slice vectors 444$^0$, 444$^1$ (not labeled for clarity) and 444$^2$ of bit slice tensor 454 are depicted.

Similarly, bit slice vectors 461$^0$, 461$^1$, 461$^2$, 461$^3$ and 461$^4$ of bit slice tensor 471, bit slice vectors 462$^0$, 462$^1$ (not labeled for clarity), 462$^2$ (not labeled for clarity), 462$^3$ (not labeled for clarity) and 462$^4$ of bit slice tensor 472, bit slice vectors 463$^0$, 463$^1$ (not labeled for clarity), 463$^2$ (not labeled for clarity), 463$^3$ (not labeled for clarity) and 463$^4$ of bit slice tensor 473, and bit slice vectors 464$^0$, 464$^1$ (not labeled for clarity), 464$^2$ (not labeled for clarity), 464$^3$ (not labeled for clarity) and 464$^4$ of bit slice tensor 474 are depicted.

Computation array 384 depicts the computation of the bit slice dot product between a respective row of matrix X 340 and a respective column of matrix Y 360 by each BSDB unit 500 in BSDP array 650. The dot product computation is described above with respect to 1-bit dot product unit 400.

The value for each element of matrix z 380 depicted in FIG. 8H, i.e., $z^1_1$, $z^1_2$, $z^1_3$, $z^1_4$, $z^2_1$, $z^2_2$, $z^2_3$, $z^2_4$, $z^3_1$, $z^3_2$, $z^3_3$, $z^3_4$, $z^4_1$, $z^4_2$, $z^4_3$ and $z^4_4$, are depicted in a box directly beneath the element name, i.e., 4, 12, 18, 4, 34, 102, 144, 34, 34, 102, 144, 34, 4, 12, 18 and 4, respectively. The values of all of the elements of matrix z 380 match the values of the elements of results matrix 382 depicted in FIG. 8G.

Figure 9:
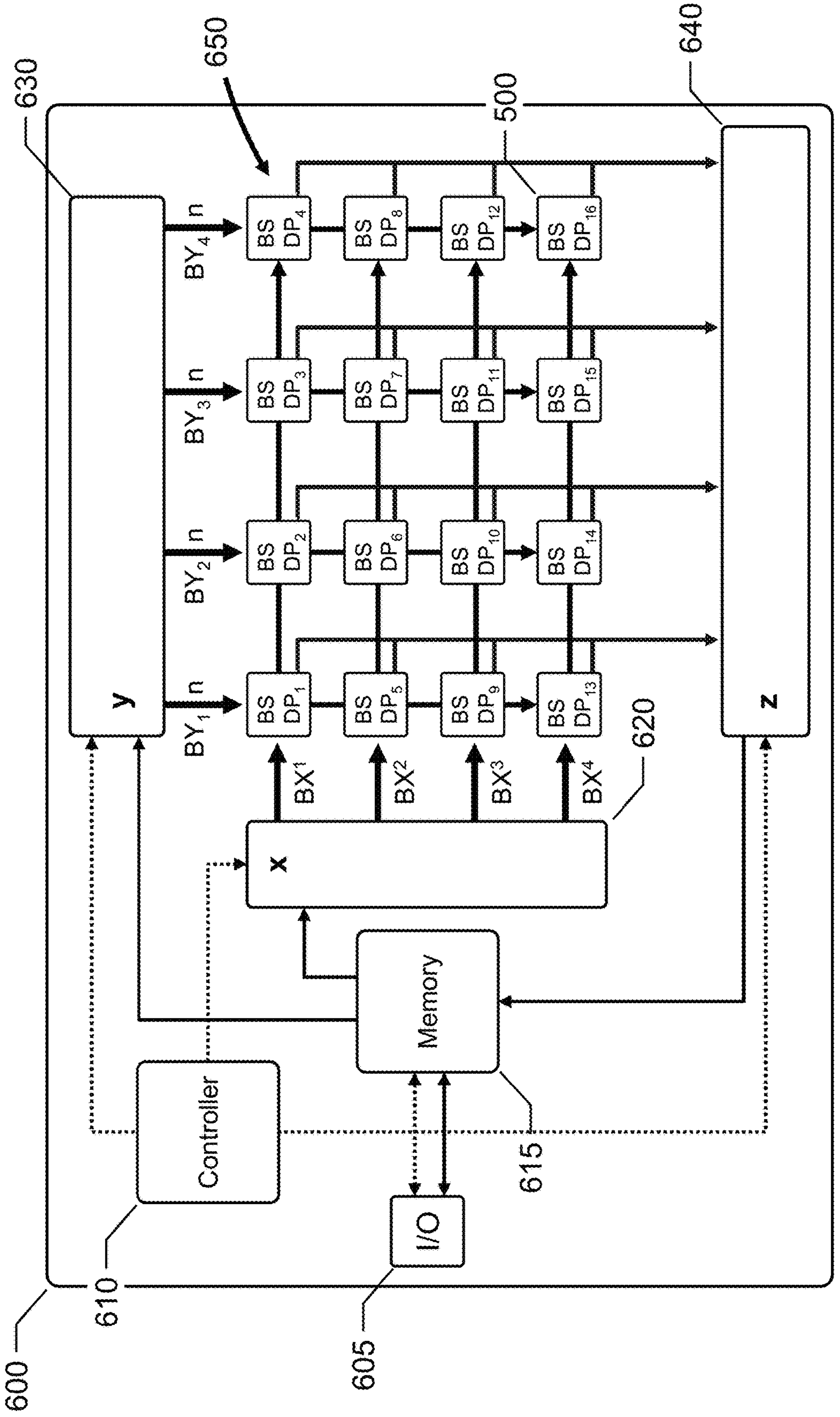
FIG. 9 depicts a block diagram of an MMA, in accordance with embodiments of the present disclosure.

FIG. 9 depicts a block diagram of MMA 600, in accordance with embodiments of the present disclosure.

MMA 600 includes I/O interface 605, controller 610, memory 615, register 620, register 630, register 640 and BSDP array 650.

In this embodiment, BSDP array 650 includes 16 BSDP units 500 arranged in a 4×4 array; other numbers of BSDP units 500 and arrangements are also contemplated, such as, for example, four BSDP units 500 arranged in a 2×2 array, nine BSDP units 500 arranged in a 3×3 array, 25 BSDP units 500 arranged in a 5×5 array, 36 BSDP units 500 arranged in a 6×6 array, 49 BSDP units 500 arranged in a 7×7 array, 64 BSDP units 500 arranged in a 8×8 array, etc. Non-symmetric arrangements, such as a 2×3 array, a 3×4 array, a 4×5 array, a 4×6 array, etc., may be advantageous for certain applications. Each BSDP unit 500 is coupled to register 620, register 630 and register 640, and calculates a dot product for one element of converted output data matrix 216.

For example, the BSDP unit 500 located in the first row and the first column (i.e., $BSDP_1$) of BSDP array 650 may calculate the dot products of the $1^{st}$ row of converted weight matrix 212 and the $1^{st}$, $5^{th}$, $9^{th}$ and $13^{th}$ columns of converted input data matrix 214, using bit slice tensor matrices, to generate the $o^1_1$, $o^1_5$, $o^1_9$ and $o^1_{13}$ elements of converted output data matrix 216.

I/O interface 605 is coupled to bus 710, controller 610 and memory 615. I/O interface 605 includes a microcontroller that sends data to, and receives data and commands from, processor 720, memory 730, etc. The microcontroller implements a set of instructions that controls the data flow and the operation of BSDP units 500.

In some embodiments, a dedicated controller, microcontroller, field programmable gate array (FPGA), etc., may control the data flow and the operation of MMA 600. For example, the controller may implement load/store (L/S) instructions, memory mapped I/O (MMIO), direct memory access (DMA), etc., to load elements of X bit slice tensor 455 and associated data into register 620, to load elements of Y bit slice tensor 475 and associated data into register 630, start the matrix multiply operation, read back the output matrix from register 640, etc. In one embodiment, a software module executing on a CPU calculates the bit slice tensors and related data for each matrix, and then sends these data and the appropriate commands to MMA 600 to upload memory 615, registers 620 and 630, start the matrix multiply operation, read back the results from register 640, etc. In another embodiment, the software module sends the matrices to MMA 600, and then controller 610 calculates the bit slice tensor data and related data (i.e., n) for each matrix, upload registers 620 and 630, start the matrix multiply operation, read back the results from register 640, etc.

Generally, register 620 simultaneously provides certain data from X bit slice tensor 455 to each row of BSDP units 500 in BSDP array 650, register 630 simultaneously provides certain data from Y bit slice tensor 475 and other related data (i.e., n) to each column of BSDP units 500 in BSDP array 650, and register 640 stores the elements of the output matrix in the multiplication operation.

Figure 10:
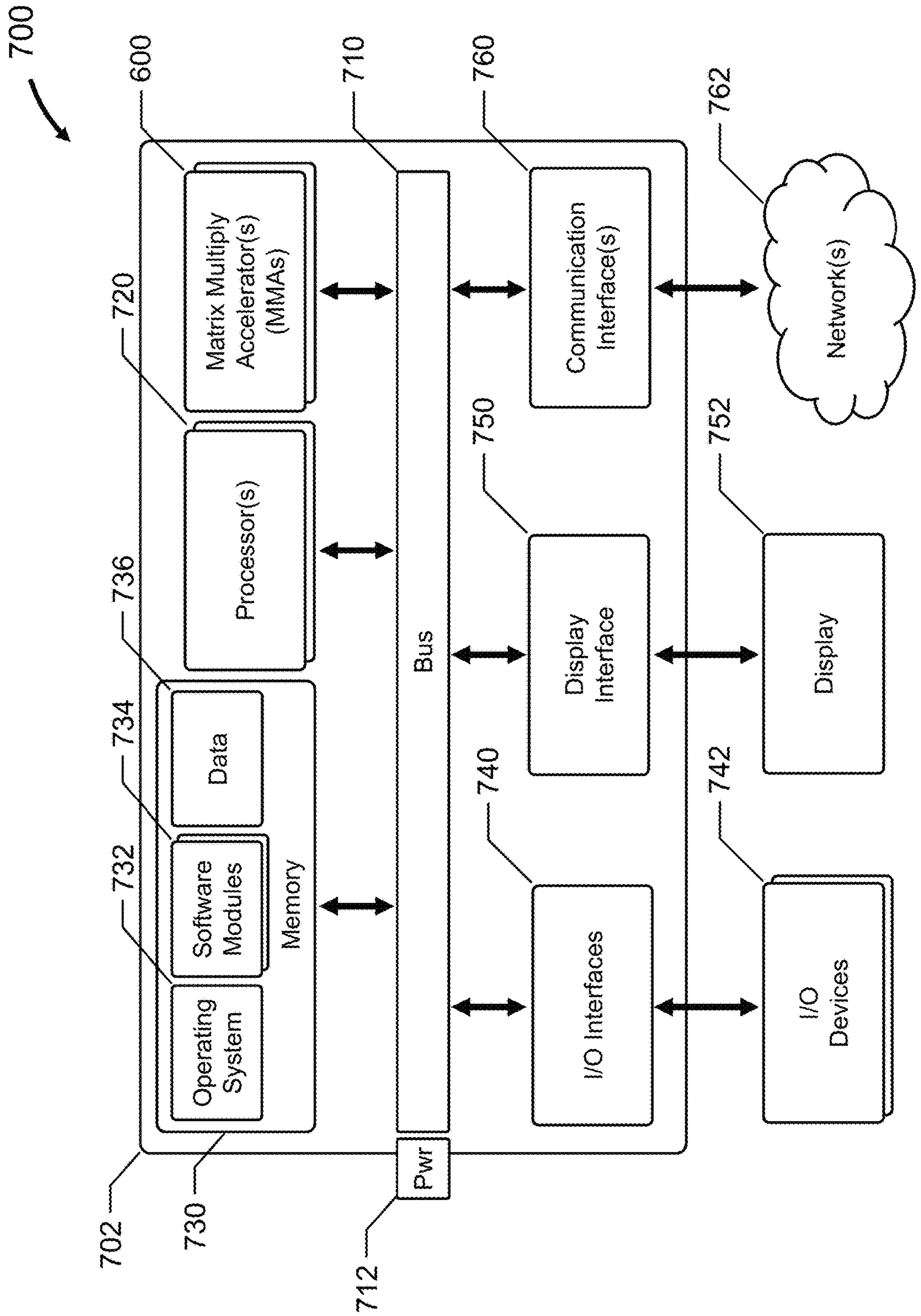
FIG. 10 depicts a block diagram of system, in accordance with an embodiment of the present disclosure.

FIG. 10 depicts a block diagram of system 700, in accordance with an embodiment of the present disclosure.

Computer 702 includes bus 710 coupled to one or more processors 720, memory 730, I/O interfaces 740, display interface 750, one or more communication interfaces 760 and one or more MMAs 600. Generally, I/O interfaces 740 are coupled to I/O devices 742 using a wired or wireless connection, display interface 750 is coupled to display 752, and communication interface 760 is connected to network 762 using a wired or wireless connection.

Bus 710 is a communication system that transfers data between processor 720, memory 730, I/O interfaces 740, display interface 750, communication interface 760, MMA 600, as well as other components not depicted in FIG. 10. Power connector 712 is coupled to bus 710 and a power supply (not shown).

Processor 720 includes one or more general-purpose or application-specific microprocessors that executes instructions to perform control, computation, input/output, etc, functions for computer 702. Processor 720 may include a single integrated circuit, such as a micro-processing device, or multiple integrated circuit devices and/or circuit boards working in cooperation to accomplish the functions of processor 720. In addition, processor 720 may execute computer programs or modules, such as operating system 732, software modules 734, etc., stored within memory 730. For example, software modules 734 may include an ML application, an ANN application, a CNN application, etc.

Generally, storage element or memory 730 stores instructions for execution by processor 720 and data. Memory 730 may include a variety of non-transitory computer-readable medium that may be accessed by processor 720. In various embodiments, memory 730 may include volatile and non-volatile medium, non-removable medium and/or removable medium. For example, memory 730 may include any combination of random access memory (RAM), dynamic RAM (DRAM), static RAM (SRAM), read only memory (ROM), flash memory, cache memory, and/or any other type of non-transitory computer-readable medium.

Memory 730 contains various components for retrieving, presenting, modifying, and storing data. For example, memory 730 stores software modules that provide functionality when executed by processor 720. The software modules include operating system 732 that provides operating system functionality for computer 702. Software modules 734 provide various functionality, such as image classification using convolutional neural networks, etc. Data 736 may include data associated with operating system 732, software modules 734, etc.

I/O interfaces 740 are configured to transmit and/or receive data from I/O devices 742. I/O interfaces 740 enable connectivity between processor 720 and I/O devices 742 by encoding data to be sent from processor 720 to I/O devices 742, and decoding data received from I/O devices 742 for processor 720. Generally, data may be sent over wired and/or wireless connections. For example, I/O interfaces 740 may include one or more wired communications interfaces, such as USB, Ethernet, etc., and/or one or more wireless communications interfaces, coupled to one or more antennas, such as WiFi, Bluetooth, cellular, etc.

Generally, I/O devices 742 provide input to computer 702 and/or output from computer 702. As discussed above, I/O devices 742 are operably connected to computer 702 using a wired and/or wireless connection. I/O devices 742 may include a local processor coupled to a communication interface that is configured to communicate with computer 702 using the wired and/or wireless connection. For example, I/O devices 742 may include a keyboard, mouse, touch pad, joystick, etc.

Display interface 750 is configured to transmit image data from computer 702 to monitor or display 752.

Communication interface 760 is configured to transmit data to and from network 762 using one or more wired and/or wireless connections. Network 762 may include one or more local area networks, wide area networks, the Internet, etc., which may execute various network protocols, such as, for example, wired and/or wireless Ethernet, Bluetooth, etc. Network 762 may also include various combinations of wired and/or wireless physical layers, such as, for example, copper wire or coaxial cable networks, fiber optic networks, Bluetooth wireless networks, WiFi wireless networks, CDMA, FDMA and TDMA cellular wireless networks, etc.

MMA 600 is configured to multiply matrices and generate output matrices to support various applications implemented by software modules 734.

The embodiments described herein are combinable.

In one embodiment, a system includes a memory, a processor coupled to the memory, and a matrix multiply accelerator (MMA) coupled to the processor and the memory. The memory is configured to store at least one weight matrix and at least one input data matrix, the weight matrix having a number of rows, a number of columns, a number of elements and a bit resolution, the input data matrix including a number of rows, a number of columns, a number of elements and a bit resolution. The processor is configured to, for the weight matrix, generate, based on the bit resolution, a number of bit slice vectors for each row, and generate a bit slice weight tensor based on the bit slice vectors for each row; and, for the input data matrix, generate, based on the bit resolution, a number of bit slice vectors for each column, and generate a bit slice input data tensor based on the bit slice vectors for each column. The MMA is configured to receive the bit slice weight tensor and the bit slice input data tensor, and multiply the bit slice weight tensor and the bit slice input data tensor to generate an output data matrix.

In another embodiment of the system, the number of columns of the weight matrix is the same as the number of rows of the input data matrix; and, for each row of the weight matrix, each bit slice vector includes one bit from each element within the row; each bit slice vector is associated with a different bit position; and the number of bit slice vectors is the same as the bit resolution of the weight matrix.

In another embodiment of the system, for each column of the input data matrix, each bit slice vector includes one bit from each element within the column; each bit slice vector is associated with a different bit position; and the number of bit slice vectors is the same as the bit resolution of the input data matrix.

In another embodiment of the system, the MMA includes a memory; a controller coupled to the memory; a first register, coupled to the controller and the memory, configured to store at least a portion of the bit slice input data tensor; a second register, coupled to the controller and the memory, configured to store at least a portion of the bit slice weight tensor; a third register, coupled to the controller and the memory, configured to store at least a portion of the output data matrix; and an array of bit slice dot product (BSDP) elements, coupled to the controller and the first, second and third registers, configured to multiply the bit slice weight tensor and the bit slice input data tensor, each BSDP element configured to generate a dot product between one row of the weight matrix and one column of the input data matrix.

In another embodiment of the system, each BSDP element includes a bit-wise AND circuit configured to input a first operand from the first register, input a second operand from the second register, and output a resultant value; a popcount circuit configured to receive the resultant value and output an intermediate value; an ADDER circuit configured to add the intermediate value to an accumulated value; and an accumulation register configured to store the accumulated value, and output a final accumulated value to the third register.

In another embodiment of the system, the first operand is a bit slice vector from the bit slice input data tensor having an index k equal to the associated bit position of the bit slice vector; and the second operand is a bit slice vector from the bit slice weight tensor having an index j equal to the associated bit position of the bit slice vector.

In another embodiment of the system, the popcount circuit is configured to receive an index value from the second register, the index value being equal to j+k; count a number of bits set to one in the resultant value to generate a population count value; and left-shift the population count value based on the index value to generate the intermediate value.

In one embodiment, a further system includes a memory, a processor coupled to the memory, and a matrix multiply accelerator (MMA) coupled to the processor and the memory. The memory is configured to store at least one weight matrix and at least one input data matrix, the weight matrix having a number of rows, a number of columns, a number of elements and a bit resolution, the input data matrix including a number of rows, a number of columns, a number of elements and a bit resolution. The MMA includes a local memory, an array of bit slice dot product (BSDP) elements, and a controller coupled to the local memory and the array. The controller is configured to receive the weight matrix and the input data matrix; for the weight matrix, generate, based on the bit resolution, a number of bit slice vectors for each row, and generate a bit slice weight tensor based on the bit slice vectors for each row; for the input data matrix, generate, based on the bit resolution, a number of bit slice vectors for each column, and generate a bit slice input data tensor based on the bit slice vectors for each column. The array is configured to multiply the bit slice weight tensor and the bit slice input data tensor to generate an output data matrix.

In another embodiment of the further system, the number of columns of the weight matrix is the same as the number of rows of the input data matrix; and, for each row of the weight matrix, each bit slice vector includes one bit from each element within the row; each bit slice vector is associated with a different bit position; and the number of bit slice vectors is the same as the bit resolution of the weight matrix.

In another embodiment of the further system, for each column of the input data matrix, each bit slice vector includes one bit from each element within the column; each bit slice vector is associated with a different bit position; and the number of bit slice vectors is the same as the bit resolution of the input data matrix.

In another embodiment of the further system, the MMA further includes a first register, coupled to the controller and the local memory, configured to store at least a portion of the bit slice input data tensor; a second register, coupled to the controller and the local memory, configured to store at least a portion of the bit slice weight tensor; and a third register, coupled to the controller and the local memory, configured to store at least a portion of the output data matrix. The array is coupled to the first, second and third registers, and each BSDP element is configured to generate a dot product between one row of the weight matrix and one column of the input data matrix.

In another embodiment of the further system, each BSDP element includes a bit-wise AND circuit configured to input a first operand from the first register, input a second operand from the second register, and output a resultant value; a popcount circuit configured to receive the resultant value and output an intermediate value; an ADDER circuit configured to add the intermediate value to an accumulated value; and an accumulation register configured to store the accumulated value, and output a final accumulated value to the third register.

In another embodiment of the further system, the first operand is a bit slice vector from the bit slice input data tensor having an index k equal to the associated bit position of the bit slice vector; and the second operand is a bit slice vector from the bit slice weight tensor having an index j equal to the associated bit position of the bit slice vector.

In another embodiment of the further system, the popcount circuit is configured to receive an index value from the second register, the index value being equal to j+k; count a number of bits set to one in the resultant value to generate a population count value; and left-shift the population count value based on the index value to generate the intermediate value.

In one embodiment, a method includes, at a memory, storing at least one weight matrix and at least one input data matrix, the weight matrix having a number of rows, a number of columns, a number of elements and a bit resolution, the input data matrix including a number of rows, a number of columns, a number of elements and a bit resolution. At a processor or a matrix multiply accelerator (MMA), for the weight matrix, generating, based on the bit resolution, a number of bit slice vectors for each row, generating a bit slice weight tensor based on the bit slice vectors for each row; for the input data matrix, generating, based on the bit resolution, a number of bit slice vectors for each column, generating a bit slice input data tensor based on the bit slice vectors for each column. At the MMA, multiplying the bit slice weight tensor and the bit slice input data tensor to generate an output data matrix.

In another embodiment of the method, the number of columns of the weight matrix is the same as the number of rows of the input data matrix; and, for each row of the weight matrix, each bit slice vector includes one bit from each element within the row; each bit slice vector is associated with a different bit position; and the number of bit slice vectors is the same as the bit resolution of the weight matrix.

In another embodiment of the method, for each column of the input data matrix, each bit slice vector includes one bit from each element within the column; each bit slice vector is associated with a different bit position; and the number of bit slice vectors is the same as the bit resolution of the input data matrix.

In another embodiment of the method, the MMA includes a memory; a controller coupled to the memory; a first register, coupled to the controller and the local memory, configured to store at least a portion of the bit slice input data tensor; a second register, coupled to the controller and the local memory, configured to store at least a portion of the bit slice weight tensor; a third register, coupled to the controller and the local memory, configured to store at least a portion of the output data matrix; an array of bit slice dot product (BSDP) elements, coupled to the controller and the first, second and third registers, configured to multiply the bit slice weight tensor and the bit slice input data tensor. The method further includes, at each BSDP element, generating a dot product between one row of the weight matrix and one column of the input data matrix.

In another embodiment of the method, each BSDP element includes a bit-wise AND circuit configured to input a first operand from the first register, input a second operand from the second register, and output a resultant value; a popcount circuit configured to receive the resultant value and output an intermediate value; an ADDER circuit configured to add the intermediate value to an accumulated value; and an accumulation register configured to store the accumulated value, and output a final accumulated value to the third register.

In another embodiment of the method, the first operand is a bit slice vector from the bit slice input data tensor having an index k equal to the associated bit position of the bit slice vector; and the second operand is a bit slice vector from the bit slice weight tensor having an index j equal to the associated bit position of the bit slice vector.

In another embodiment of the method, the method further includes, at each popcount circuit, receiving an index value from the second register, the index value being equal to j+k; counting a number of bits set to one in the resultant value to generate a population count value; and left-shifting the population count value based on the index value to generate the intermediate value.

While implementations of the disclosure are susceptible to embodiment in many different forms, there is shown in the drawings and will herein be described in detail specific embodiments, with the understanding that the present disclosure is to be considered as an example of the principles of the disclosure and not intended to limit the disclosure to the specific embodiments shown and described. In the description above, like reference numerals may be used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms “comprises,” “comprising,” “includes,” “including,” “has,” “having,” or any other variations thereof, are intended to cover a non-exclusive inclusion, such that a process, method, article, or apparatus that comprises a list of elements does not include only those elements but may include other elements not expressly listed or inherent to such process, method, article, or apparatus. An element preceded by “comprises . . . a” does not, without more constraints, preclude the existence of additional identical elements in the process, method, article, or apparatus that comprises the element.

Reference throughout this document to “one embodiment,” “certain embodiments,” “an embodiment,” “implementation(s),” “aspect(s),” or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The term “or” as used herein is to be interpreted as an inclusive or meaning any one or any combination. Therefore, “A, B or C” means “any of the following: A; B; C; A and B; A and C; B and C; A, B and C.” An exception to this definition will occur only when a combination of elements, functions, steps or acts are in some way inherently mutually exclusive. Also, grammatical conjunctions are intended to express any and all disjunctive and conjunctive combinations of conjoined clauses, sentences, words, and the like, unless otherwise stated or clear from the context. Thus, the term “or” should generally be understood to mean “and/or” and so forth. References to items in the singular should be understood to include items in the plural, and vice versa, unless explicitly stated otherwise or clear from the text.

Recitation of ranges of values herein are not intended to be limiting, referring instead individually to any and all values falling within the range, unless otherwise indicated, and each separate value within such a range is incorporated into the specification as if it were individually recited herein. The words “about,” “approximately,” or the like, when accompanying a numerical value, are to be construed as indicating a deviation as would be appreciated by one of ordinary skill in the art to operate satisfactorily for an intended purpose. Ranges of values and/or numeric values are provided herein as examples only, and do not constitute a limitation on the scope of the described embodiments. The use of any and all examples, or exemplary language ("e.g.," "such as," "for example," or the like) provided herein, is intended merely to better illuminate the embodiments and does not pose a limitation on the scope of the embodiments. No language in the specification should be construed as indicating any unclaimed element as essential to the practice of the embodiments.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

In the following description, it is understood that terms such as "first," "second," "top," "bottom," "up," "down," "above," "below," and the like, are words of convenience and are not to be construed as limiting terms. Also, the terms apparatus, device, system, etc. may be used interchangeably in this text.

The many features and advantages of the disclosure are apparent from the detailed specification, and, thus, it is intended by the appended claims to cover all such features and advantages of the disclosure which fall within the scope of the disclosure. Further, since numerous modifications and variations will readily occur to those skilled in the art, it is not desired to limit the disclosure to the exact construction and operation illustrated and described, and, accordingly, all suitable modifications and equivalents may be resorted to that fall within the scope of the disclosure.

What is claimed is:

1. A system, comprising:

a memory configured to store at least one converted weight matrix and at least one converted input data matrix, the converted weight matrix having a number of rows, a number of columns, a number of elements and a bit resolution, the converted input data matrix including a number of rows, a number of columns, a number of elements and a bit resolution;

a processor, coupled to the memory, configured to:

generate each row of a converted weight matrix from a weight tensor of a convolution neural network layer, the weight tensor having a height, a width, and a depth greater than one and each row having a number (i) of elements;

generate each column of a converted input matrix from an input feature map of the convolutional neural network layer, each column having i elements;

for the converted weight matrix:

generate, based on the bit resolution, a number of bit slice vectors for each row, each bit slice vector having i elements; and generate a bit slice weight tensor based on the bit slice vectors for each row; and for the converted input data matrix:

generate, based on the bit resolution, a number of bit slice vectors for each column, each bit slice vector having i elements; and generate a bit slice input data tensor based on the bit slice vectors for each column; and a matrix multiply accelerator (MMA), coupled to the processor and the memory, the MMA including a controller, a first register a second register a third register, and an array of bit-slice dot-product (BSDP) elements, the MMA configured to:

receive the bit slice weight tensor and the bit slice input data tensor;

determine, by the controller for each pair of bit-slice indices (j, k), an index value n=j+k, each bit slice index corresponding to a bit position; and multiply the bit slice weight tensor and the bit slice input data tensor to generate an output data matrix, including, for each processing cycle of a plurality of processing cycles:

broadcast, by the controller, a selected bit-slice vector, with index i, of the bit-slice weight tensor to each BSDP element in a row via the first register:

broadcast, by the controller, a selected bit-slice vector, with index k, of the bit-slice input data tensor to each BSDP element in a column via the second register; and provide, by the controller, an index value n=j+k to each BSDP element; and store, in the third register, at least a portion of an output data matrix:

wherein each BSDP element is configured to perform, for the broadcast bit-slice vectors, a bit-wise AND, a population count of the resultant bits to produce an intermediate value, left-shift the intermediate value by the broadcasted index value n, and accumulate the result to form a dot product between one row of the converted weight matrix and one column of the converted input data matrix, to thereby generate the output data matrix, wherein said generate, based on the bit resolution, the number of bit slice vectors for each row of the converted weight matrix includes:

arrange elements of the row in bit vector form as a bit vector including a sequence of bits; and for each bit position in the sequence of bits:

form a bit slice vector as values of the bits in the bit position for elements of the row; and wherein said generate, based on the bit resolution, the number of bit slice vectors for each column of the converted input data matrix includes:

arrange elements of the column in bit vector form as a bit vector including a sequence of bits; and for each bit position in the sequence of bits:

form a bit slice vector as values of the bits in the bit position for elements of the column.

2. The system according to claim 1, wherein:

the number of columns of the converted weight matrix is the same as the number of rows of the converted input data matrix;

for each row of the converted weight matrix:

each bit slice vector includes one bit from each element within the row;

each bit slice vector is associated with a different bit position; and the number of bit slice vectors is the same as the bit resolution of the converted weight matrix, and the bit resolution of the converted weight matrix is variable.

3. The system according to claim 2, wherein:

for each column of the converted input data matrix:

each bit slice vector includes one bit from each element within the column;

each bit slice vector is associated with a different bit position; and the number of bit slice vectors is the same as the bit resolution of the converted input data matrix.

4. The system according to claim 1, wherein the controller of the MMA is configured to provide the index value n each BSDP element by broadcasting the index value to each BSDP element in a column via the second register.

5. The system according to claim 1, wherein each BSDP element includes:

a bit-wise AND circuit configured to input a first operand from the first register, input a second operand from the second register, and output a resultant value;

a popcount circuit configured to receive the resultant value and output the intermediate value;

an ADDER circuit configured to add the intermediate value to an accumulated value; and an accumulation register configured to store the accumulated value, and output a final accumulated value to the third register.

6. The system according to claim 5, wherein the popcount circuit is configured to:

receive the broadcasted index value, the index value being equal to j+k;

count a number of bits set to one in the resultant value to generate a population count value; and left-shift the population count value based on the index value to generate the intermediate value.

7. A system, comprising:

a memory configured to store at least one converted weight matrix and at least one converted input data matrix, the converted weight matrix having a number of rows, a number of columns, a number of elements and a bit resolution, the converted input data matrix including a number of rows, a number of columns, a number of elements and a bit resolution;

a processor coupled to the memory the processor configured to:

generate each row of a converted weight matrix from a weight tensor of a convolution neural network layer, the weight tensor having a height, a width, and a depth greater than one and each row having a number (i) of elements; and generate each column of a converted input matrix from an input feature map of the convolutional neural network layer, each column having i elements; and a matrix multiply accelerator (MMA), coupled to the processor and the memory, including a local memory, an array of bit slice dot product (BSDP) elements, and a controller coupled to the local memory and the array, wherein:

the controller is configured to:

receive the converted weight matrix and the converted input data matrix, for the converted weight matrix:

generate, based on the bit resolution, a number of bit slice vectors for each row, each bit slice vector having i elements; and generate a bit slice weight tensor based on the bit slice vectors for each row, for the converted input data matrix:

generate, based on the bit resolution, a number of bit slice vectors for each column, each bit slice vector having i elements;

generate a bit slice input data tensor based on the bit slice vectors for each column, and determine, for each pair of bit-slice indices (j, k), an index value n=j+k, each bit slice index corresponding to a bit position; and for each processing cycle of a plurality of processing cycles:

broadcast a selected bit-slice vector, with index j, of the bit-slice weight tensor to each BSDP element in a row via the first register:

broadcast a selected bit-slice vector, with index k, of the bit-slice input data tensor to each BSDP element in a column via the second register:

broadcast the index value n=j+k to each BSDP element; and each BSDP element the array is configured to, for the broadcast bit-slice vectors and the broadcast index value:

perform a bit-wise AND, a population count of the resultant bits to produce an intermediate value, left-shift the intermediate value by the broadcasted index value n, and accumulate the result to form a dot product between one row of the converted weight matrix and one column of the converted input data matrix, to thereby generate an element of an output data matrix; and store, in the third register, the generated element of the output data matrix:

wherein the output data matrix is a product of the bit slice weight tensor and the bit slice input data tensor, wherein said generate, based on the bit resolution, the number of bit slice vectors for each row of the converted weight matrix includes:

arrange elements of the row in bit vector form as a bit vector including a sequence of bits; and for each bit position in the sequence of bits:

form a bit slice vector as values of the bits in the bit position for elements of the row; and wherein said generate, based on the bit resolution, the number of bit slice vectors for each column of the converted input data matrix includes:

arrange elements of the column in bit vector form as a bit vector including a sequence of bits; and for each bit position in the sequence of bits:

form a bit slice vector as values of the bits in the bit position for elements of the column.

8. The system according to claim 7, wherein:

the number of columns of the converted weight matrix is the same as the number of rows of the converted input data matrix;

for each row of the converted weight matrix:

each bit slice vector includes one bit from each element within the row;

each bit slice vector is associated with a different bit position; and the number of bit slice vectors is the same as the bit resolution of the converted weight matrix, and the bit resolution of the converted weight matrix is variable.

9. The system according to claim 8, wherein:

for each column of the converted input data matrix:

each bit slice vector includes one bit from each element within the column;

each bit slice vector is associated with a different bit position; and the number of bit slice vectors is the same as the bit resolution of the converted input data matrix.

10. The system according to claim 9, wherein the controller of the MMA is configured to broadcast the index value n to each BSDP element by broadcasting the index value to each BSDP element in a column via the second register.

11. The system according to claim 10, wherein each BSDP element includes:

a bit-wise AND circuit configured to input a first operand from the first register, input a second operand from the second register, and output a resultant value;

a popcount circuit configured to receive the resultant value and output the intermediate value;

an ADDER circuit configured to add the intermediate value to an accumulated value; and an accumulation register configured to store the accumulated value, and output a final accumulated value to the third register.

12. The system according to claim 11, wherein the popcount circuit is configured to:

receive the index value from the second register, the index value being equal to j+k;

count a number of bits set to one in the resultant value to generate a population count value; and left-shift the population count value based on the index value to generate the intermediate value.

13. A method, comprising:

at a memory:

storing at least one converted weight matrix and at least one converted input data matrix, the converted weight matrix having a number of rows, a number of columns, a number of elements and a bit resolution, the converted input data matrix including a number of rows, a number of columns, a number of elements and a bit resolution;

at a processor or a matrix multiply accelerator (MMA):

generating each row of a converted weight matrix from a weight tensor of a convolution neural network layer, the weight tensor having a height, a width, and a depth greater than one and each row having a number (i) of elements;

generating each column of a converted input matrix from an input feature map of the convolutional neural network layer, each column having i elements;

for the converted weight matrix:

generating, based on the bit resolution, a number of bit slice vectors for each row, each bit slice vector having i elements; and generating a bit slice weight tensor based on the bit slice vectors for each row, for the converted input data matrix:

generating, based on the bit resolution, a number of bit slice vectors for each column, each bit slice vector having i elements;

generating a bit slice input data tensor based on the bit slice vectors for each column; and determining for each pair of bit-slice indices (j, k) an index value n=j+k, each bit slice index corresponding to a bit position; and at the MMA:

multiplying the bit slice weight tensor and the bit slice input data tensor to generate an output data matrix, including, for each processing cycle of a plurality of processing cycles:

broadcasting a selected bit-slice vector, with index i, of the bit-slice weight tensor to each BSDP element in a row via a first register of the MMA;

broadcasting a selected bit-slice vector, with index k, of the bit-slice input data tensor to each BSDP element in a column via a second register of the MMA:

broadcasting an index value n=i+k to each BSDP element; and storing, in a third register of the MMA, at least a portion of an output data matrix; and at each BSDP element of an array of BSDP elements of the MMA, for the broadcast bit-slice vectors:

performing a bit-wise AND, a population count of the resultant bits to produce an intermediate value;

left-shifting the intermediate value by the broadcasted index value n; and accumulating the result to form a dot product between one row of the converted weight matrix and one column of the converted input data matrix, to thereby generate the output data matrix, wherein said generating, based on the bit resolution, the number of bit slice vectors for each row of the converted weight matrix includes:

arrange elements of the row in bit vector form as a bit vector including a sequence of bits; and for each bit position in the sequence of bits:

form a bit slice vector as values of the bits in the bit position for elements of the row; and wherein said generating, based on the bit resolution, the number of bit slice vectors for each column of the converted input data matrix includes:

arrange elements of the column in bit vector form as a bit vector including a sequence of bits; and for each bit position in the sequence of bits:

form a bit slice vector as values of the bits in the bit position for elements of the column.

14. The method according to claim 13, wherein:

the number of columns of the converted weight matrix is the same as the number of rows of the converted input data matrix;

for each row of the converted weight matrix:

each bit slice vector includes one bit from each element within the row;

each bit slice vector is associated with a different bit position; and the number of bit slice vectors is the same as the bit resolution of the converted weight matrix, and the bit resolution of the converted weight matrix is variable.

15. The method according to claim 14, wherein:

for each column of the converted input data matrix:

each bit slice vector includes one bit from each element within the column;

each bit slice vector is associated with a different bit position; and the number of bit slice vectors is the same as the bit resolution of the converted input data matrix.

16. The method according to claim 15, wherein each BSDP element includes:

a bit-wise AND circuit configured to input a first operand from the first register, input a second operand from the second register, and output a resultant value;

a popcount circuit configured to receive the resultant value and output the intermediate value;

an ADDER circuit configured to add the intermediate value to an accumulated value; and an accumulation register configured to store the accumulated value, and output a final accumulated value to the third register.

17. The method according to claim 16, wherein:

the first operand is a bit slice vector from the bit slice input data tensor having an index k equal to the associated bit position of the bit slice vector;

the second operand is a bit slice vector from the bit slice weight tensor having an index j equal to the associated bit position of the bit slice vector; and the method further comprises:

at each popcount circuit:

receiving the index value from the second register, the index value being equal to j+k;

counting a number of bits set to one in the resultant value to generate a population count value; and left-shifting the population count value based on the index value to generate the intermediate value.

* * * * *